(12) United States Patent
Kang

(10) Patent No.: US 12,532,422 B1
(45) Date of Patent: Jan. 20, 2026

(54) PNEUMATIC SUPPORT STRUCTURE FOR FLEXIBLE DISPLAY DEVICES

(71) Applicant: James Kang, Las Vegas, NV (US)

(72) Inventor: James Kang, Las Vegas, NV (US)

(73) Assignee: James Kang

( * ) Notice: Subject to any disclaimer, the term of this patent is extended or adjusted under 35 U.S.C. 154(b) by 0 days.

(21) Appl. No.: 19/081,098

(22) Filed: Mar. 17, 2025

(51) Int. Cl.
  *H05K 5/02* (2006.01)

(52) U.S. Cl.
  CPC .................. *H05K 5/0217* (2013.01)

(58) Field of Classification Search
  CPC .............. H05K 5/0217; G06F 1/1652
  See application file for complete search history.

(56) References Cited

U.S. PATENT DOCUMENTS

| | | | |
|---|---|---|---|
| 2006/0038745 A1* | 2/2006 | Naksen .............. | G06F 1/1624 257/40 |
| 2011/0193829 A1* | 8/2011 | Tsai .................. | G09F 9/30 345/204 |
| 2014/0362511 A1* | 12/2014 | Deutsch ............ | H05B 33/12 361/679.21 |
| 2016/0374228 A1 | 12/2016 | Park et al. | |
| 2017/0127537 A1* | 5/2017 | Choi ................. | F16M 11/00 |
| 2018/0228036 A1* | 8/2018 | Mou ................. | H05K 5/0217 |
| 2019/0138058 A1* | 5/2019 | Kwon ............... | G09G 3/22 |
| 2019/0286195 A1 | 9/2019 | Lin | |
| 2020/0212325 A1 | 7/2020 | Seo | |
| 2022/0199923 A1 | 6/2022 | Yamane et al. | |
| 2023/0244277 A1* | 8/2023 | Murata ............. | G06F 1/1656 361/679.01 |
| 2024/0015906 A1* | 1/2024 | Lee .................. | C03C 25/30 |
| 2024/0077913 A1 | 3/2024 | Kim | |

FOREIGN PATENT DOCUMENTS

| | | |
|---|---|---|
| CN | 110839095 A | 2/2020 |
| CN | 114255661 A | 3/2022 |
| CN | 115148109 A | 10/2022 |
| KR | 20150083482 A | 7/2015 |

OTHER PUBLICATIONS

Machine translation of CN 114255661 (Year: 2025).*

* cited by examiner

*Primary Examiner* — Sagar Shrestha
(74) *Attorney, Agent, or Firm* — Raj S. Dave; Dave Law Group LLC

(57) ABSTRACT

According to an embodiment, it is an apparatus, comprising a display comprising a display layer and a base structure, wherein the base structure is configured to support the display layer; the base structure comprising one or more layers, wherein the one or more layers comprise a first amorphous layer and a second pneumatic layer; and wherein the display is configured to be rolled and unrolled as a scroll; and wherein the apparatus is an electronic display device.

19 Claims, 49 Drawing Sheets

|  | Diameter of Core | Rolled Once |  | Rolled Twice |  |
|---|---|---|---|---|---|
| OD of the Core Structure (mm) | 40.0 |  |  |  |  |
| Support Layer (mm) | 2.0 | 6.28 |  | 12.56 |  |
| Display Layer (mm) | 0.0 | 0.00 |  | 0.00 |  |
| Difference in Length (mm) | -2.0 | -6.28 | $2\pi$ of Support Layer Width | -12.56 | $4\pi$ of Support Layer Width |
| Support Layer (mm) | 1.0 | 3.14 |  | 6.28 |  |
| Display Layer (mm) | 0.0 | 0.00 |  | 0.00 |  |
| Difference in Length (mm) | -1.0 | -3.14 | $2\pi$ of Support Layer Width | -6.28 | $4\pi$ of Support Layer Width |

FIG. 2

|  | RADIUS (R) (MM) | SEMI-CIRCLE PERIMETER (πR) (MM) |
|---|---|---|
| SOLID SPRING/SHEET | | |
| INNER RADIUS | 10 | 31.4 |
| OUTER RADIUS | 11 | 34.54 |
| SPRING HEIGHT | 1 | 3.14 |
| STRAIN ON OUTER RADIUS | 10% | 10% |
| | | |
| LAYERED SPRING/SHEET INNER MOST LAYER | | |
| INNER RADIUS | 10 | 31.4 |
| OUTER RADIUS | 10.2 | 32.028 |
| SPRING HEIGHT | 0.2 | 0.628 |
| STRAIN ON OUTER RADIUS | 2% | 2% |
| | | |
| OUTER MOST LAYER | | |
| INNER RADIUS | 10.8 | 33.929 |
| OUTER RADIUS | 11 | 34.557 |
| SPRING HEIGHT | 0.2 | 0.628 |
| STRAIN ON OUTER RADIUS | 2% | 2% |

| INGREDIENT NAME | PERCENTAGE |
|---|---|
| IRON | 84-100 |
| SILICON | 0-10 |
| BORON | 0-5 |
| MANGANESE | 0-2 |

| INGREDIENT NAME | PERCENTAGE | CAS NUMBER |
|---|---|---|
| IRON | 0-100 | 7439-89-6 |
| COBOLT | 0-85 | 7440-48-4 |
| NICKEL | 0-50 | 7440-02-0 |
| SILICON | 0-10 | 7440-21-3 |
| MOLYBDENUM | 0-8 | 7439-98-7 |
| BORON | 0-5 | 7440-42-8 |
| MANGANESE | 0-2 | 7439-96-5 |

FIG. 22

| THICKNESS (μm) | 23 |
|---|---|
| STANDARD AVAILABLE WIDTHS | |
| MINIMUM (mm) | 5 |
| MAXIMUM (mm) | 213 |
| DENSITY (g/cm³) | 7.18 |

FIG. 23

ULTRA-THIN

XENSATION® FLEX OFFERS THICKNESS BELOW 100 MICROMETERS.

ULTRA-TOUGH

WITH ITS ABILITY TO BE CHEMICALLY STRENGTHENED, XENSATION® FLEX CAN BEND MORE THAN 300,000 TIMES.

ULTRA-FLEXIBLE

XENSATION® FLEX CAN ACHIEVE A BENDING RADIUS OF LESS THAN 1MM AFTER PROCESSING.

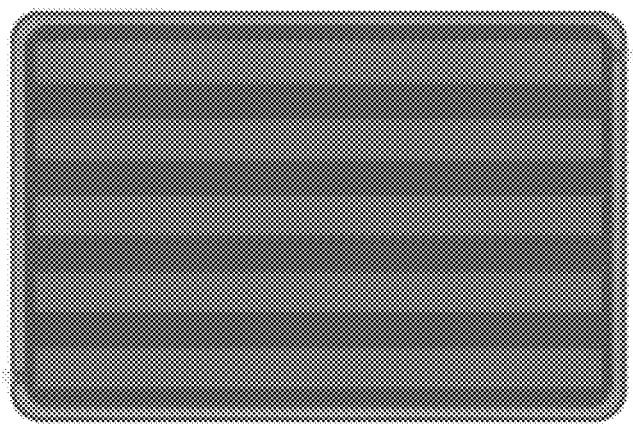
FIG. 25H
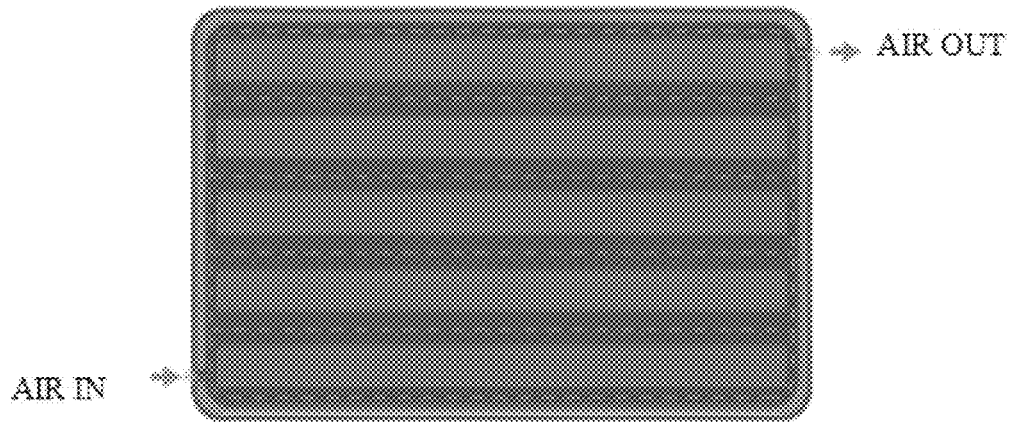
FIG. 25I
FIG. 25J
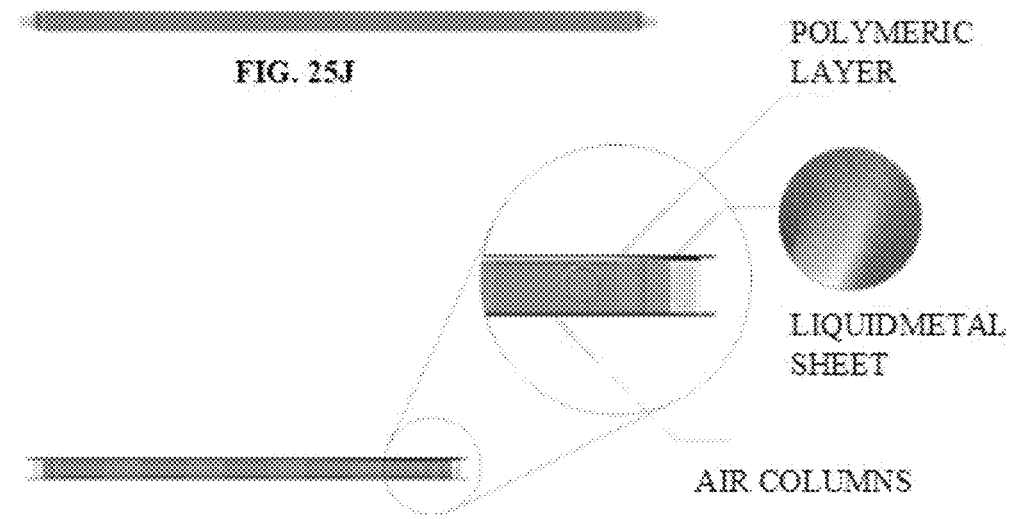
FIG. 25K

FIG. 35A
FIG. 35B
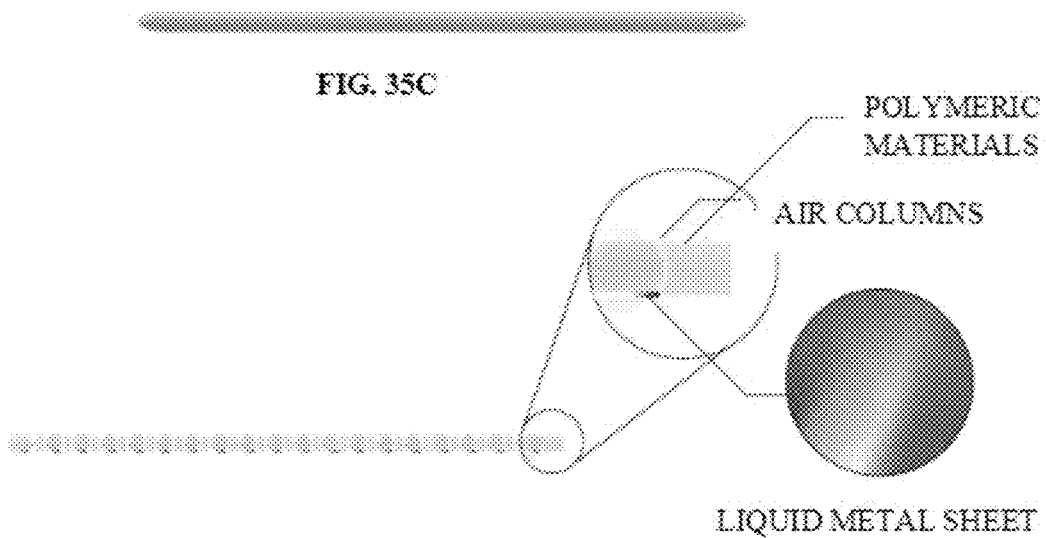
FIG. 35C
FIG. 35D

AIR IN

LIQUID METAL SHEET

AIR COLUMN

POLYMERIC MATERIALS

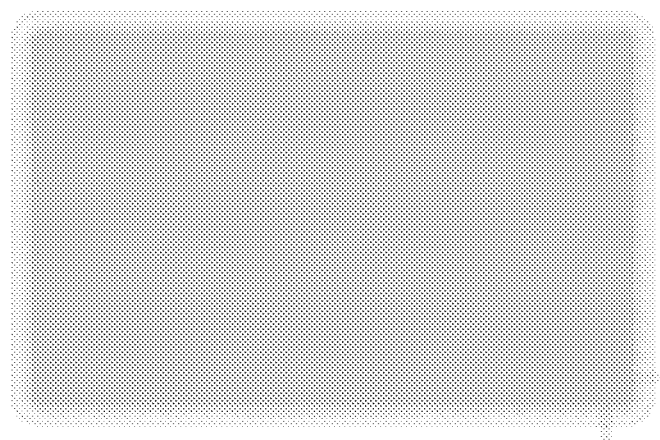
FIG. 38A
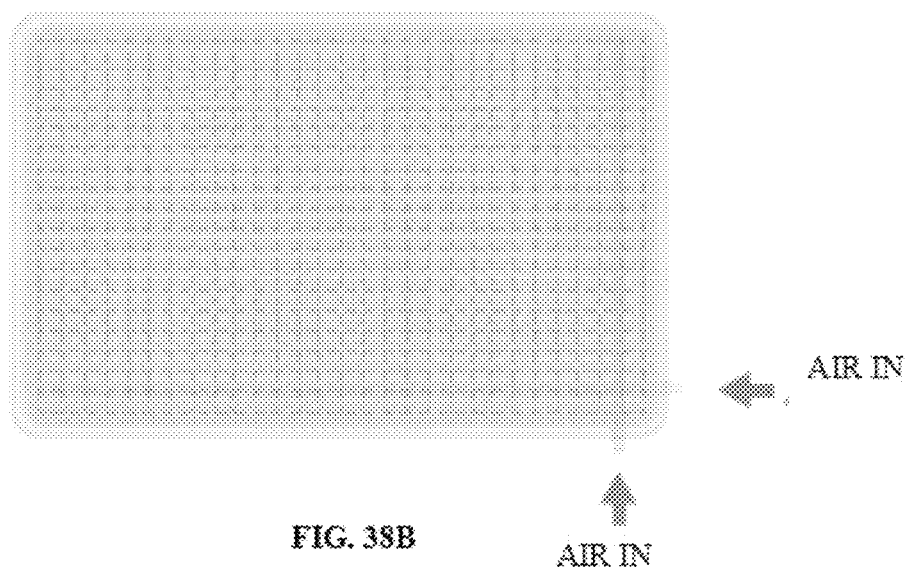
FIG. 38B
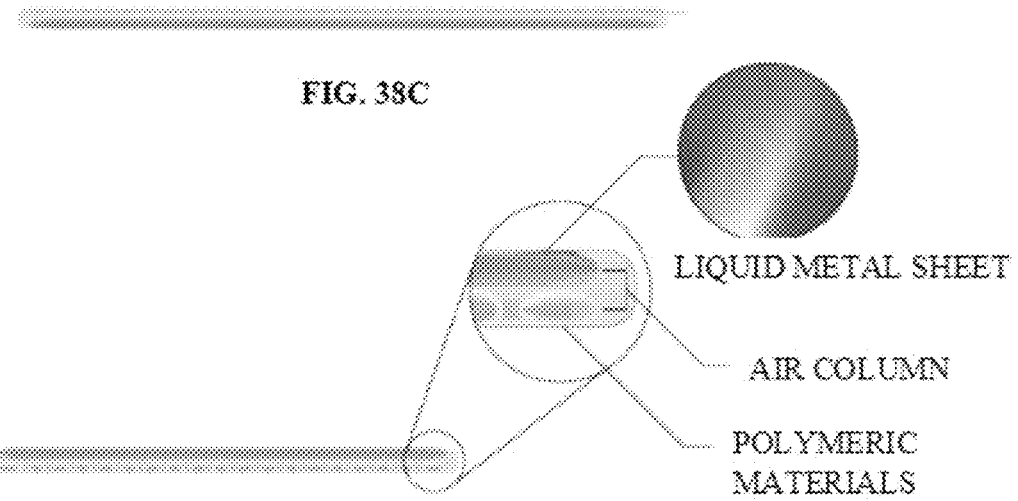
FIG. 38C
FIG. 38D

FIG. 40A
FIG. 40B
FIG. 40C
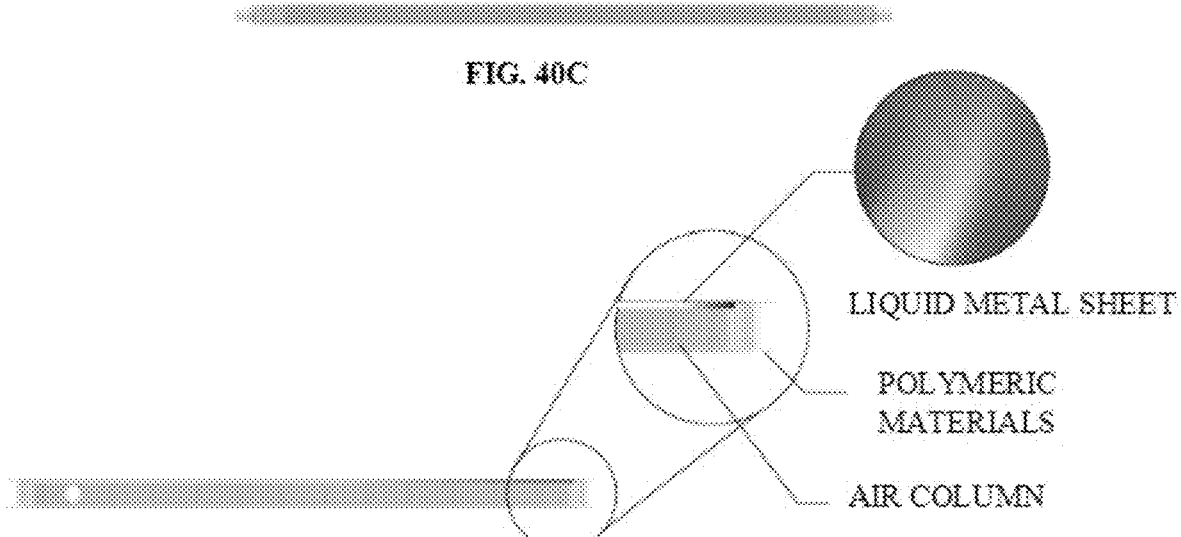
FIG. 40D

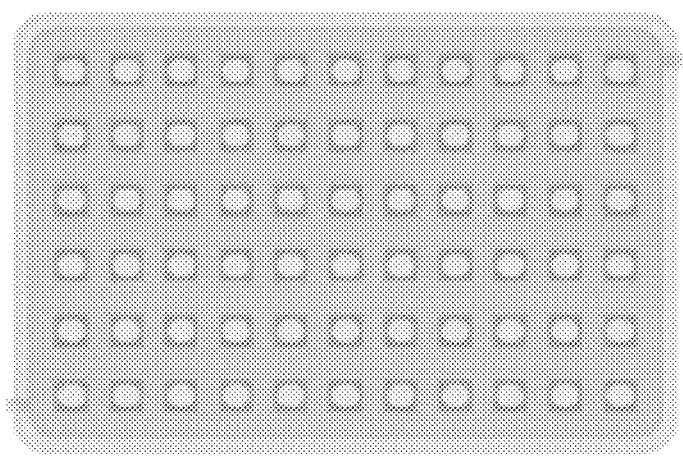
FIG. 42A
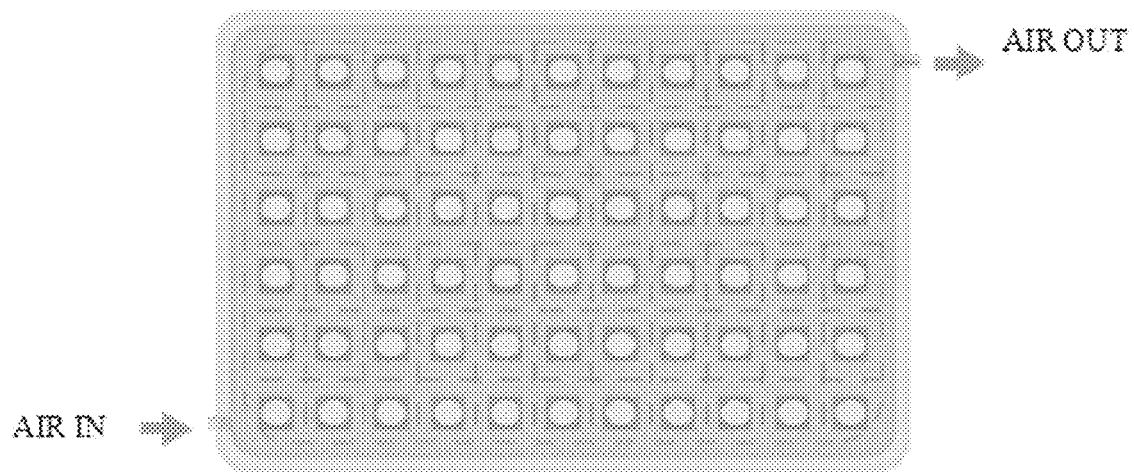
FIG. 42B
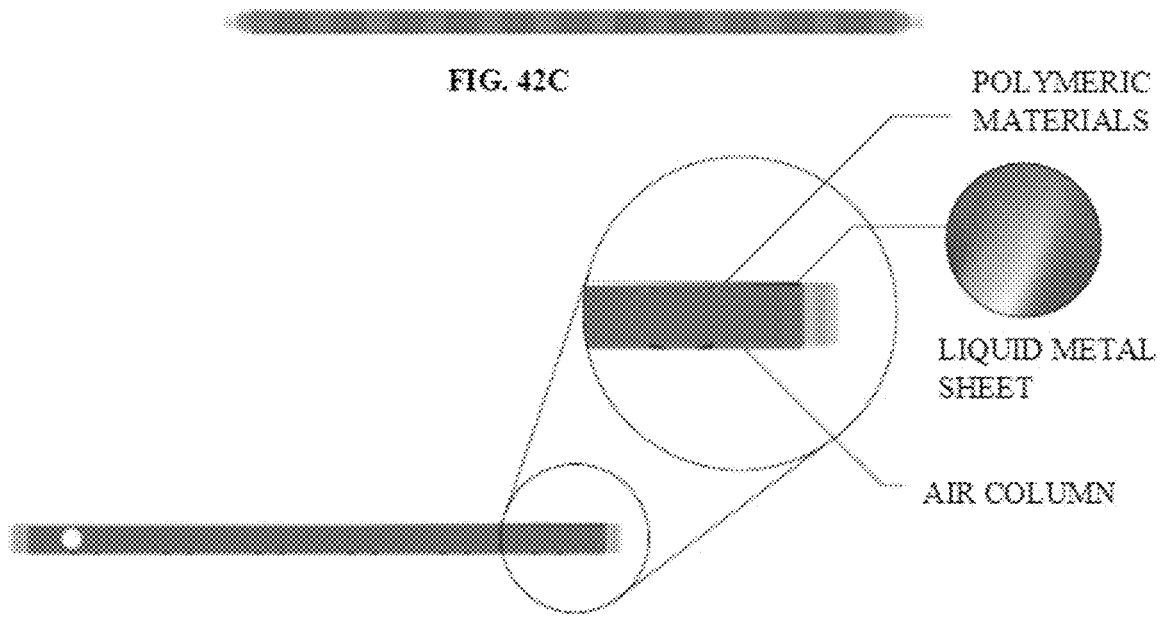
FIG. 42C
FIG. 42D

AIR OUT

AIR IN

POLYMERIC MATERIALS

LIQUID METAL SHEET

AIR COLUMN

POLYMERIC
AIR LINE

AIR OUT

AIR IN

PNEUMATIC SUPPORT STRUCTURE FOR FLEXIBLE DISPLAY DEVICES

TECHNICAL FIELD

The present disclosure relates to a display device, and more particularly, to a foldable display device/flexible display device having a pneumatic support structure.

BACKGROUND

In this section prior art is cited:

"For the convenience of carrying and using, a bendable, foldable, and rollable flexible display device and related technologies are strongly developed. However, the largest challenge faced by the flexible display device is how to be properly bent, folded and stored when not being used, and how to be set as an even and level plane when being used. In the present technology of prior art, for unfolding and folding the flexible display device, a support structure such as a guiding rail or several stacked rods, or a chain support member is usually utilized. However, any of the above-mentioned mechanical means are required to provide certain strength for supporting the periphery of the flexible display device by which the flexible display device is capable of being even and level in the unfolded status. Under this circumstance, those support structures become inextricable and heavy, and occupy large space, which are disadvantages in developing a potable and miniature flexible display device." [U.S. Patent Publication US20180228036A1, titled, "Flexible display device"]

"Therefore, there is actually an urgent need to develop a flexible display device, which can be quickly unfolded, maintained even and level and not easily deformed in the unfolded status, in miniature size for being portable, and can be wound for easy storage." [U.S. Patent Publication US20180228036A1, titled, "Flexible display device"]

"The foldable display device may be folded to be compact and portable and may be unfolded to obtain a wide screen when being used. As the foldable display device is repeatedly folded and unfolded, the bending portion of the display device may develop a deformation and ultimately may be damaged." [U.S. Patent Publication US20200212325A1, titled, "Foldable display device having a supporter"]

"Accordingly, known foldable displays may have disadvantages including display defects caused by a failure of a section that received a localized impact, bright spot or black spot display defects of the display by the display layer caused by a localized impact, and the like." [U.S. Patent Publication US20220199923A1, titled, "Foldable display"]

"Some display devices incorporate bendable display panels that may be repeatedly bent, folded, flexed, or rolled, to a noticeable degree without sustaining damage. Bendable display panels have allowed for the creation of electronic devices with new and interesting form factors." [U.S. Patent Publication US20240077913A1, titled, "Display device including a support module having joints"]

Therefore, there is a need for a display with a base that can provide sufficient structural support while allowing the flexible display to roll up.

SUMMARY

The following is a summary to provide a basic understanding of one or more embodiments described herein. This summary is not intended to identify key or critical elements or delineate any scope of the different embodiments and/or any scope of the claims. The sole purpose of the summary is to present some concepts in a simplified form as a prelude to the more detailed description presented herein.

An apparatus, comprising: a display comprising a display layer and a base structure, wherein the base structure is configured to support the display layer; the base structure comprises a pneumatic structure, wherein the pneumatic structure comprises one or more pneumatic layers; wherein the base structure is inflatable and deflatable; and wherein the display comprises an exoskeleton structure configured to support the display, wherein the exoskeleton structure comprises amorphous material, and wherein the exoskeleton structure comprises a retractable arm with a hinge joint; and wherein the apparatus is an electronic display device.

According to an embodiment of the apparatus, the display is a foldable display.

According to an embodiment of the apparatus, the base structure is inflatable when the display is in open configuration and deflatable when the display is in folded configuration.

According to an embodiment of the apparatus, the base structure further comprises an amorphous layer comprising amorphous material configured as a reinforcement layer.

According to an embodiment of the apparatus, the amorphous layer comprises a woven mesh mat structure from a plurality of amorphous ribbons or amorphous strips.

According to an embodiment of the apparatus, the pneumatic layers comprise a first layer of a first shape and a second layer of a second shape; the first layer is of a first size and the second layer is of a second size; and wherein the first layer is at a first pressure and the second layer is at a second pressure.

According to an embodiment of the apparatus, the pneumatic structure comprises a plurality of inflatable tubes connected by a non-inflated flexible structure.

According to an embodiment of the apparatus, the plurality of the inflatable tubes is present in a first direction of a length of the display of the apparatus.

According to an embodiment of the apparatus, the plurality of the inflatable tubes is present in a second direction perpendicular to a length of the display of the apparatus.

According to an embodiment of the apparatus, the plurality of the inflatable tubes is configured at a variable pressure depending on a position in relation to a main rigid base of the display.

According to an embodiment of the apparatus, at least one of the pneumatic layers is configured to have a thickness in a first range of about 0.5 millimeter (mm) to 2.0 mm and is maintained at a pressure when inflated in a second range of about 5 pounds per square inch (psi) to 10 psi.

According to an embodiment of the apparatus, at least one of the pneumatic layers is configured to have a thickness in a third range of about 1.0 millimeter (mm) to 20.0 mm and is maintained at a pressure when inflated in a fourth range of about 2 pounds per square inch (psi) to 5 psi.

According to an embodiment of the apparatus, the pneumatic layers are configured to have a pressure in a fifth range of about 2 pounds per square inch (psi) to 10 psi.

According to an embodiment of the apparatus, the apparatus further comprises a pneumatic system configured to inflate the pneumatic layers.

According to an embodiment of the apparatus, the apparatus further comprises a battery to power the pneumatic system.

According to an embodiment of the apparatus, the apparatus further comprises a pressure controller configured to control a pressure of the pneumatic structure.

According to an embodiment of the apparatus, the display is touch sensitive, comprising a touch function; and wherein the pneumatic layers are configured to support forces produced by the touch function to counter a deformation.

According to an embodiment of the apparatus, the apparatus further comprises a body.

According to an embodiment of the apparatus, wherein the exoskeleton structure comprises amorphous material, and wherein the exoskeleton structure is present in an inner space of the body.

According to an embodiment of the apparatus, the apparatus further comprises a rigid structure.

According to an embodiment of the apparatus, the base structure of the display is configured for reducing a gap between a rotational arc of the display and the base structure.

According to an embodiment of the apparatus, a group of the pneumatic layers are of different geometries.

According to an embodiment of the apparatus, the apparatus is configured for a selective pressurization of one or more of the pneumatic layers.

According to an embodiment of the apparatus, the pneumatic structure further comprises an articulating layer, wherein the articulating layer when inflated and deflated at a section of the display, the display is configured to bend across the section.

According to an embodiment of the apparatus, the articulating layer comprises one or more of inflatable balloon structures and tubes in the one or more pneumatic layers.

According to an embodiment of the apparatus, the apparatus, based on the inflation of the pneumatic layers, is configured to take a shape of one or more of a mobile phone display, a tablet display, a laptop display, and a stand-alone screen display.

According to an embodiment, it is a method comprising, rolling a display of an apparatus to an open configuration, wherein the display comprises a display layer and a base structure, wherein the base structure comprises a pneumatic structure, wherein the pneumatic structure comprises one or more pneumatic layers and is configured to support the display layer; pressurizing, the one or more pneumatic layers, wherein the one or more pneumatic layers comprises a first pneumatic layer to a first pressure and a second pneumatic layer to a second pressure for pressurized layers; supporting the display with the pressurized layers during a touch function of the display; further supporting the display using an exoskeleton structure, wherein the exoskeleton structure comprises a retractable arm with a hinge joint; and wherein the first pneumatic layer is configured to have a first size and a first shape; and the second pneumatic layer is configured to have a second size and a second shape; and wherein the display is configured to articulate a size based on the pressurization of the one or more of the pneumatic layers; and wherein the apparatus is an electronic display device.

According to an embodiment of the method, the display is a foldable display.

According to an embodiment of the method, the display is configured to take a shape of one or more of a mobile phone display, a tablet display, a laptop display, and a stand-alone screen display.

According to an embodiment, the base structure is inflatable for open configuration and deflatable for folded configuration.

According to an embodiment of the method, the pneumatic layers are pressurized using a pneumatic system configured to inflate the pneumatic layers.

According to an embodiment of the method, the pneumatic system is powered by a battery.

According to an embodiment of the method, the first pressure and the second pressure of the pneumatic structure are controlled using a pressure controller.

According to an embodiment of the method, the first pressure is in a first range of about 5 pounds per square inch (psi) to 10 psi; and wherein the second pressure is in a second range of about 2 psi to 5 psi.

According to an embodiment of the method, the pneumatic structure further comprises an articulating layer, wherein the articulating layer when inflated and deflated at a section of the display where the display is configured to bend across the section.

According to an embodiment of the method, the articulating layer comprises one or more inflatable balloon structures and inflatable tubes in the one or more pneumatic layers.

According to an embodiment of the method, the base structure further comprises an amorphous layer comprising amorphous material configured as a reinforcement layer.

According to an embodiment of the method, the amorphous layer comprises a woven mesh mat structure from a plurality of amorphous ribbons or amorphous strips.

According to an embodiment, it is an apparatus, comprising: a display comprising a display layer and a base structure, wherein the base structure is configured to support the display layer; the base structure comprising one or more layers, wherein the one or more layers comprise a first amorphous layer and a second pneumatic layer; and wherein the display is configured to be rolled and unrolled as a scroll; and wherein the apparatus is an electronic display device.

According to an embodiment of the apparatus, the first amorphous layer comprises one or more amorphous layers.

According to an embodiment of the apparatus, the first amorphous layer comprises a woven mesh mat structure made of amorphous strips.

According to an embodiment of the apparatus, the first amorphous layer comprises Air Mate material comprising one of flexible plastic and elastomer material.

According to an embodiment of the apparatus, the second pneumatic layer comprises one or more pneumatic layers.

According to an embodiment of the apparatus, the one or more pneumatic layers are configured for a selective pressurization.

According to an embodiment of the apparatus, the apparatus further comprises an exoskeleton structure that is configured to support the display, wherein the exoskeleton structure comprises amorphous material, and wherein the exoskeleton structure comprises a retractable arm with a hinge joint. In embodiments, the exoskeleton is made up of amorphous materials. In embodiments, the exoskeleton is made up of bulk-amorphous materials.

According to an embodiment of the apparatus, a size of the display is in a range of 9 inches to 10.2 inches.

According to an embodiment, it is a method comprising, rolling a display of an apparatus to an open configuration, wherein the display comprises a base structure comprising one or more layers, wherein the one or more layers comprise a first amorphous layer and a second pneumatic layer; pressurizing the second pneumatic layer; supporting the display with the first amorphous layer and the second pneumatic layer during a touch function of the display; and wherein the display is configured to be rolled and unrolled as a scroll; and wherein the apparatus is an electronic display device.

According to an embodiment of the method, the display is a foldable display.

According to an embodiment of the method, the foldable display is a scroll type.

According to an embodiment of the method, the display is further supported using an exoskeleton structure, wherein the exoskeleton structure comprises amorphous material, and wherein the exoskeleton structure comprises a retractable arm with a hinge joint.

According to an embodiment of the method, the first amorphous layer comprises one or more amorphous layers.

According to an embodiment of the method, the first amorphous layer comprises a woven mesh mat structure made of amorphous strips.

According to an embodiment of the method, the first amorphous layer is laminated to the display.

According to an embodiment of the method, the first amorphous layer is attached to the display.

According to an embodiment of the method, the second pneumatic layer comprises one or more pneumatic layers.

According to an embodiment of the method, the one or more pneumatic layers are configured for a selective pressurization.

According to an embodiment, it is an apparatus, comprising: a display comprising a hinge joint comprising a base structure, wherein the display is configured to be folded and unfolded at the hinge joint, and the base structure comprising one or more layers, wherein the one or more layers comprise a first amorphous layer and a second pneumatic layer; and wherein the apparatus is an electronic display device.

According to an embodiment of the apparatus, the first amorphous layer comprises one or more amorphous layers.

According to an embodiment of the apparatus, the first amorphous layer comprises a woven mesh mat structure made of amorphous strips.

According to an embodiment of the apparatus, the first amorphous layer comprises Air Mate material comprising one of flexible plastic and elastomer material.

According to an embodiment of the apparatus, the second pneumatic layer comprises one or more pneumatic layers.

According to an embodiment of the apparatus, the one or more pneumatic layers are configured for a selective pressurization and to maintain selective pressurization.

BRIEF DESCRIPTION OF THE FIGURES

Aspects of the present disclosure will now be described in more detail, with reference to the appended drawings showing exemplary embodiments of the present disclosure, in which:

FIG. 2 shows an example rotation of the display screen relative to the support layer according to an embodiment.

FIG. 22 shows a second example for the chemistry of an Iron (Fe) based amorphous ribbon according to an embodiment.

FIG. 23 shows dimensions of Iron (Fe) based amorphous ribbons that are commercially available in the market according to an embodiment.

FIG. 25H-FIG. 25M shows a foldable screen according to a second embodiment.

FIG. 35A-FIG. 35F shows a foldable screen according to a fifth embodiment.

FIG. 38A-FIG. 38F shows a foldable screen according to an eighth embodiment.

FIG. 40A-FIG. 40F shows a foldable screen according to a tenth embodiment.

FIG. 42A-FIG. 42F shows a foldable screen according to a twelfth embodiment.

DETAILED DESCRIPTION

Definitions and General Techniques

Figure 1:
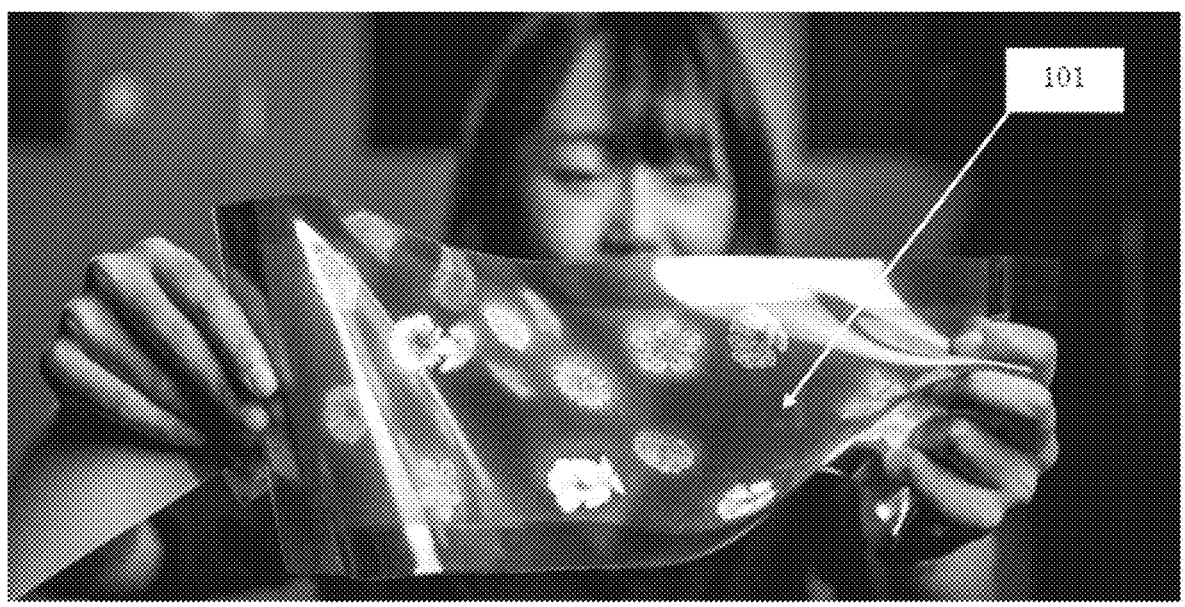
FIG. 1 shows a flexible display without a structural base according to an embodiment.

For simplicity and clarity of illustration, the figures illustrate the general manner of construction. The description and figures may omit the descriptions and details of well-known features and techniques to avoid unnecessarily obscuring the present disclosure. The figures may exaggerate the dimensions of some of the elements relative to other elements to help improve understanding of embodiments of the present disclosure. The same reference numeral in different figures denotes the same element.

Although the detailed description herein contains many specifics for the purpose of illustration, a person of ordinary skill in the art will appreciate that many variations and alterations to the details are considered to be included herein.

Accordingly, the embodiments herein are without any loss of generality to, and without imposing limitations upon, any claims set forth. The terminology used herein is for the purpose of describing particular embodiments only and is not limiting. Unless defined otherwise, all technical and scientific terms used herein have the same meaning as commonly understood by one with ordinary skill in the art to which this disclosure belongs.

Other specific forms may embody the present disclosure without departing from its spirit or characteristics. The embodiments described are in all respects illustrative and not restrictive. Therefore, the appended claims, rather than the description herein, indicate the scope of the disclosure. All variations which come within the meaning and range of equivalency of the claims are within their scope.

While this specification contains many specifics, these do not construe as limitations on the scope of the disclosure or of the claims, but as descriptions of features specific to particular implementations. A single implementation may implement certain features described in this specification in the context of separate implementations. Conversely, multiple implementations separately or in any suitable sub-combination may implement various features described herein in the context of a single implementation. Moreover, although features described herein are acting in certain combinations and even initially claimed as such, one or more features from a claimed combination may in some cases be excised from the combination, and the claimed combination may be directed to a sub-combination or variation of a sub-combination.

Similarly, while operations depicted herein in the drawings in a particular order to achieve desired results, this should not be understood as requiring that such operations be performed in the particular order shown or in sequential order or that all illustrated operations be performed to achieve desirable results. In certain circumstances, multitasking and parallel processing may be advantageous. Moreover, the separation of various system components in the implementations should not be understood as requiring such separation in all implementations, and it should be understood that the described program components and systems may be integrated together into a single software product or packaged into multiple software products.

Even though particular combinations of features are recited in the claims and/or disclosed in the specification, these combinations are not intended to limit the disclosure of possible implementations. Other implementations are within the scope of the claims. For example, the actions recited in the claims may be performed in a different order and still achieve desirable results. In fact, many of these features may be combined in ways not specifically recited in the claims and/or disclosed in the specification. Although each dependent claim may directly depend on only one claim, the disclosure of possible implementations includes each dependent claim in combination with every other claim in the claim set.

The present disclosure may be embodied in other specific forms without departing from its spirit or characteristics. The embodiments described are to be considered in all respects only as illustrative and not restrictive. The scope of the disclosure is, therefore, indicated by the appended claims rather than by the foregoing descriptions. All changes which come within the meaning and range of equivalency of the claims are to be embraced within their scope.

Unless otherwise defined herein, scientific, and technical terms used in connection with the present disclosure shall have meanings that are commonly understood by those of ordinary skill in the art. Further, unless otherwise required by context, singular terms shall include pluralities, and plural terms shall include the singular.

The following terms and phrases, unless otherwise indicated, shall be understood to have the following meanings.

As used herein, the articles "a" and "an" used herein refer to one or to more than one (i.e., to at least one) of the grammatical object of the article. By way of example, "an element" means one element or more than one element. Moreover, usage of articles "a" and "an" in the subject specification and annexed drawings construe to mean "one or more" unless specified otherwise or clear from context to mean a singular form.

As used herein, the terms "example" and/or "exemplary" mean serving as an example, instance, or illustration. For the avoidance of doubt, such examples do not limit the herein described subject matter. In addition, any aspect or design described herein as an "example" and/or "exemplary" is not necessarily preferred or advantageous over other aspects or designs, nor does it preclude equivalent exemplary structures and techniques known to those of ordinary skill in the art.

As used herein, the terms "first," "second," "third," and the like in the description and in the claims, if any, distinguish between similar elements and do not necessarily describe a particular sequence or chronological order. The terms are interchangeable under appropriate circumstances such that the embodiments herein are, for example, capable of operation in sequences other than those illustrated or otherwise described herein. Furthermore, the terms "include", "have", and any variations thereof, cover a non-exclusive inclusion such that a process, method, system, article, device, or apparatus that comprises a list of elements is not necessarily limiting to those elements, but may include other elements not expressly listed or inherent to such process, method, system, article, device, or apparatus.

As used herein, the terms "left", "right", "front", "back", "top", "bottom", "over", "under", and the like, in the description and in the claims, if any, are for descriptive purposes and not necessarily for describing permanent relative positions. The terms so used are interchangeable under appropriate circumstances such that the embodiments of the apparatus, methods, and/or articles of manufacture described herein are, for example, capable of operation in other orientations than those illustrated or otherwise described herein.

As defined herein, two or more elements are "integral" if they are comprised of the same piece of material. As defined herein, two or more elements are "non-integral" if each is comprised of a different piece of material.

No element act, or instruction used herein is critical or essential unless explicitly described as such. Furthermore, the term "set" includes items (e.g., related items, unrelated items, a combination of related items and unrelated items, etc.) and may be interchangeable with "one or more". Where only one item is intended, the term "one" or similar language is used. Also, the terms "has," "have," "having," or the like are open-ended terms. Further, the phrase "based on" means "based, at least in part, on" unless explicitly stated otherwise.

As used herein, the terms "system," "device," "unit," and/or "module" refer to a different component, component portion, or component of the various levels of the order.

However, other expressions that achieve the same purpose may replace the terms.

As used herein, the term "or" means an inclusive "or" rather than an exclusive "or." That is, unless specified otherwise, or clear from context, "X employs A or B" means any of the natural inclusive permutations. That is, if X employs A; X employs B; or X employs both A and B, then "X employs A or B" is satisfied under any of the foregoing instances.

As used herein, the term "one or more of A, B, and C" shall be understood to mean any one of A, B, or C, or any combination thereof, including multiple occurrences of each element. This includes, but is not limited to, the following configurations: only A, only B, only C, A and B, A and C, B and C, A, B, and C, as well as multiple instances of A, multiple instances of B, multiple instances of C, or any combination of multiple instances of A, B, and C.

As used herein, the term "at least one of A, B, and C" shall be understood to mean any one of A, B, or C, or any combination thereof, including multiple occurrences of each element. This includes, but is not limited to, the following configurations: only A, only B, only C, A and B, A and C, B and C, A, B, and C, as well as multiple instances of A, multiple instances of B, multiple instances of C, or any combination of multiple instances of A, B, and C.

As used herein, the term "approximately" can mean within a specified or unspecified range of the specified or unspecified stated value. In some embodiments, "approximately" can mean within plus or minus ten percent of the stated value. In other embodiments, "approximately" can mean within plus or minus five percent of the stated value. In further embodiments, "approximately" can mean within plus or minus three percent of the stated value. In yet other embodiments, "approximately" can mean within plus or minus one percent of the stated value.

It will be understood that when an element, layer, region, or component is referred to as being "on," "connected to," or "coupled to" another element, layer, region, or component, it can be directly on, connected to, or coupled to the other element, other layer, other region, other component, or one or more intervening elements, layers, regions, or components may be present. However, "directly connected/directly coupled" refers to one component directly connecting or coupling another component without an intermediate component. Meanwhile, other expressions describing relationships between components such as "between," "immediately between" or "adjacent to" and "directly adjacent to" may be construed similarly. In addition, it will also be understood that when an element or layer is referred to as being "between" two elements or layers, it can be the only element or layer between the two elements or layers, or it is not the only element, and one or more intervening elements or layers may also be present between the two elements or layers.

The term "fold" as used herein refers to the action of bending or creasing the flexible display screen along a specific axis or hinge point to change its form factor. For example, foldable displays are designed to be flexible and capable of being folded or unfolded repeatedly without damaging the screen or affecting its functionality. This flexibility allows the display to transition between different configurations, such as a traditional flat-screen mode and a folded mode where the screen is partially or completely bent.

The term "Roll" as used herein refers to the action of winding or rolling up the flexible display screen around a cylindrical or rollable core or axis. For example, rollable displays are designed to be flexible and capable of being rolled and unrolled repeatedly without damaging the screen or impacting its functionality. This flexibility allows the display to transition between different form factors, such as a traditional flat-screen mode and a rolled up mode where the display is compactly stored or partially rolled, offering users convenience and portability.

The term "Hysteresis" refers to the phenomenon where the response of a material to an external force or stimulus is delayed or lags behind the cause of the stimulus. In other words, the material's behavior depends not only on the current stimulus but also on its past history. For example, in the context of stress and strain in a material, hysteresis is observed when the stress-strain curve for loading (increasing stress) is different from the curve for unloading (decreasing stress). This difference indicates that the material doesn't return to its original state when the load is removed; it retains some deformation or memory of the past loading.

The term "Hysteresis loss" in the context of flex cycles refers to the energy dissipation or loss that occurs when a material or component is subjected to repeated flexing or bending. This loss occurs because not all of the energy applied to deform the material during each cycle is recovered when the material returns to its original shape. Instead, some of the energy is converted into heat or other forms of internal energy within the material.

The term "Zero memory" refers to materials or systems that return to their original state or position after being subjected to external forces or deformations. In this context, "zero memory" suggests that there is no hysteresis or lag in the material's response, and it returns precisely or almost close to its initial condition. Shape memory alloys, like Nitinol, are an exception where the term "zero memory" is used. In these materials, when heated above a certain temperature (the austenite finish temperature), they return precisely to their original shape after being deformed, exhibiting minimal hysteresis.

The term "display structure" or "support structure" or "base structure" as used herein refers to the structure that provides rigidity in flexible displays and is also called the "substrate" or "backplane." The choice of material for the substrate or backplane is crucial, as it needs to be rigid to maintain the structural integrity of the display while still allowing for flexibility to some degree.

The term "polymeric air line" refers to an air conduit or tubing system composed of polymeric materials, such as polyethylene (PE), thermoplastic polyurethane (TPU), polyurethane (PU), polyamide (PA), or polytetrafluoroethylene (PTFE). These air lines are designed to transport compressed air or gases. Polymeric air lines offer flexibility, lightweight construction, and corrosion resistance, among others.

The term "polymeric" or "polymeric material" includes thermoplastics, thermosets, and elastomers. Example thermoplastics include Polyethylene (PE), Polypropylene (PP), Polyvinyl Chloride (PVC), Polystyrene (PS), Polycarbonate (PC). Example thermosets include Epoxy resins, Phenolic resins, Polyurethane (PU), Melamine-formaldehyde, Unsaturated polyester; and example elastomers include natural rubber, silicone rubber, Styrene-butadiene rubber (SBR), Neoprene, Nitrile rubber (NBR).

The term "amorphous material" is a solid substance that lacks a long-range, ordered crystalline structure at the atomic or molecular level. Unlike crystalline materials, where atoms are arranged in a repeating pattern, amorphous materials exhibit a random or disordered atomic arrangement.

The term "amorphous structure" refers to lack of a definite crystalline form or ordered molecular arrangement, often exhibiting isotropic properties, and is commonly found in polymers, glasses, and advanced coatings where flexibility, transparency, or impact resistance is required.

An "amorphous alloy" is an alloy having an amorphous content of more than 50% by volume, preferably more than 90% by volume of amorphous content, more preferably more than 95% by volume of amorphous content, and most preferably more than 99% to almost 100% by volume of amorphous content. Note that, as described above, an alloy high in amorphicity is equivalently low in degree of crystallinity.

An "amorphous metal" is an amorphous metal material with a disordered atomic-scale structure. In contrast to most metals, which are crystalline and therefore have a highly ordered arrangement of atoms, amorphous alloys are non-crystalline. Materials in which such a disordered structure is produced directly from the liquid state during cooling are sometimes referred to as "glasses." Accordingly, amorphous metals are commonly referred to as "metallic glasses" or "glassy metals."

There are several ways besides extremely rapid cooling to produce amorphous metals, including physical vapor deposition, solid-state reaction, ion irradiation, melt spinning, and mechanical alloying. Amorphous alloys can be a single class of materials, regardless of how they are prepared. Amorphous alloys have many superior properties than their crystalline counterparts. However, if the cooling rate is not sufficiently high, crystals may form inside the alloy during cooling, so that the benefits of the amorphous state can be lost. For example, one challenge with the fabrication of bulk-amorphous alloy parts is partial crystallization of the parts due to either slow cooling or impurities in the raw alloy material.

"Bulk-solidifying amorphous alloys", or bulk metallic glasses ("BMG"), are a recently developed class of metallic materials. These alloys may be solidified and cooled at relatively slow rates, and they retain the amorphous, non-crystalline (i.e., glassy) state at room temperature. The terms "bulk metallic glass" ("BMG"), bulk-amorphous alloy ("BAA"), and bulk-solidifying amorphous alloy are used interchangeably herein. Bulk-amorphous materials and all of the content as disclosed in U.S. Patent Publication Number U.S. Ser. No. 11/407,058B2 is incorporated herein in its entirety.

The term "metal" or "metallic" refers to an electropositive chemical element.

Amorphous is defined as lacking in long-range order. It is also characterized by random atomic orientation. It excludes partially crystalline and metastable crystalline metal alloys.

The term "pneumatic system" refers to a system that may compressed air to inflate and deflate an enclosed chamber by controlling the flow and pressure of air. It may comprise components including an air pump or compressor, air hoses, check valves, pressure control mechanisms, and an exhaust or release valve for controlled deflation. The system may draw in atmospheric air, compressing it to increase pressure, and directing it into the closed chamber to achieve the desired firmness or pressure level. Check valves may prevent backflow, ensuring efficient inflation. To deflate, a controlled exhaust mechanism may release air safely. Components of a pneumatic system may include, air pump or compressor, hoses and connectors, check valves, control valves, and optionally air reservoir and pressure gauge.

The term "inflatable structure" or "inflatable component" refers to structures that can expand by introducing a fluid, typically air or gas, into an internal cavity, thereby increasing its volume and assuming a predetermined shape.

The term "deflatable structure" or "deflatable component" refers to structures that can reduce in volume by expelling the contained fluid, typically air or gas, thereby collapsing or returning to a compact form.

The term "exoskeleton" refers to an external structural framework designed to provide mechanical support, assist movement, or enhance strength.

The term "retractable component" refers to a structural component that can extend or withdraw in a controlled manner, often using mechanical, pneumatic, or hydraulic actuation.

The term "hinge joint" refers to a mechanical joint that permits rotational movement about a single axis, allowing angular displacement within a designed range that may be found in articulated structures or other structures.

Problem Defined

It has been a desire of many to combine the functionality of larger display sizes with portability of cell phones. Although a scroll type of device is most efficient in terms of display size to portability, such devices are not available on the market.

Most efforts have been limited to two or three flat surfaces articulating on mechanical hinges.

An ideal device would have the following properties:
(a) Display would roll up and roll out like a scroll.
(b) Open display size of 8 inches to 25 inches is ideal for personal devices.
(c) Fits inside a pocket when folded and can be easily held in hand.
(d) Combines functionality of Laptop, Tablet, and Phone with portability of phones.

FIG. 1 shows a flexible display without a structural base according to an embodiment. Most people would have seen photos of such flexible displays as shown in 101 without a structural base. These flexible displays require a base that can provide sufficient structural support while allowing the flexible display to roll up.

Technical Challenges of Scroll Type of Folding Display

Flexible display layer/display layer requires a supporting base layer/support layer/support structure that provides sufficient firmness so the display can be handled easily, and touch sensitivity function can be utilized.

The support layer must fold with minimal effort when the display layer is folded.

The challenge of providing sufficient structural support while requiring minimal space has proven to be challenging.

The display layer and the support layer change their respective lengths from folded position to a flat position. As the display layer is positioned outside of the support layer, the display layer travels a slightly longer distance for each rotation around the center. The difference in total length of the two lines becomes the $2\pi$ of the support layer's width multiplied by the number of times the display wraps around the center.

FIG. 2 shows an example rotation of the display screen relative to the support layer according to an embodiment. FIG. 2 shows variations for support layer thickness for 1 millimeters (mm) and 2 mm as well as once rolled and twice rolled. As an example, for a display that is 260 mm long and the support layer has thickness of 2.0 mm, the support layer and the display layer for twice rolled display will experience about 12.56 mm of difference between flat and rolled positions. If the support layer is bonded to the display layer, the 12.56 mm of distortion prevents the support layer from providing an even and firm support structure.

In addition, an ideal support structure must provide an appropriate level of tension on the display layer, similar to how camping tents are kept in a stretched position by supporting poles.

Due to these limitations, scroll types of displays were bypassed in favor of two or more flat surfaces rotating around mechanical hinges. This concept also has some limitations.

Key Limitations of Mechanical Hinged Folding Phones

Plastic substrates, on which Organic Light Emitting Diodes (OLEDs) are printed, stretch and develop a memory over time. Mechanical hinge structures do not make allowance for reduced flexibility and lengthening of the display layer over time.

Figure 3:
FIG. 3 shows an inward foldable display according to an embodiment.

FIG. 3 shows an inward foldable display according to an embodiment. Displays that fold inwardly have a thin but visible fold line, which deteriorates over time. The affected zone of fold-in displays will experience more "burn-in" and less emitted light.

Figure 4:
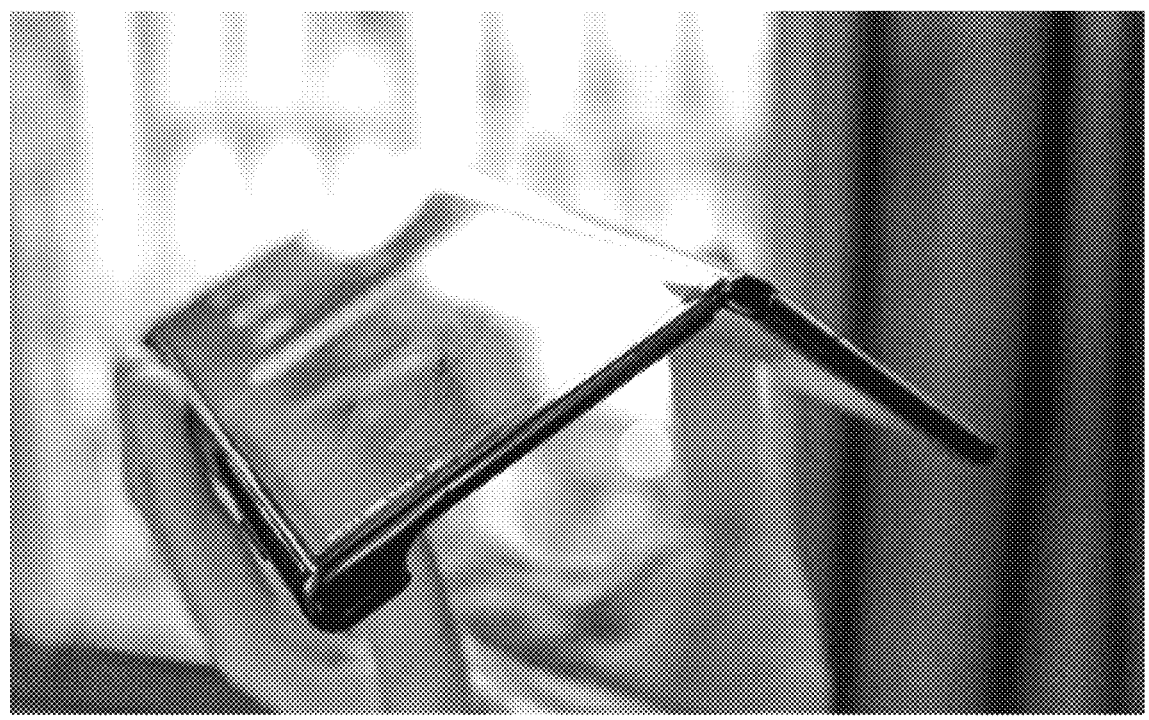
FIG. 4 shows an outward foldable display according to an embodiment.

FIG. 4 shows an outward foldable display according to an embodiment. Displays that fold outward have uneven, wrinkly surfaces, which also deteriorates over time. When the phone is in folded configuration, the display layer is in its fully stretched position.

The supporting hinge does not provide a perfectly even base when the display is fully open.

Whether the flexible display layer folds in or out, the substrate is usually synthetic polymer material. Plastics age over time and with repeated flexing. Unless the support structure of the display can maintain a consistent level of tension on the display over the lifetime of use, the area which flexes becomes uneven and less able to maintain brightness.

The key issue is the mismatch of two lines that are formed by the display layer and the mechanical hinge layer travelling different distances as they articulate from straight lines to circles (rotational planes) causing fold lines and uneven surfaces. The mechanical hinge, which determines the articulation of two fixed planes, remains relatively constant. The display layer, whether it is located either in or outside of the rotating hinge, must articulate around a slightly different pivot point than the mechanical hinge.

Figure 5:
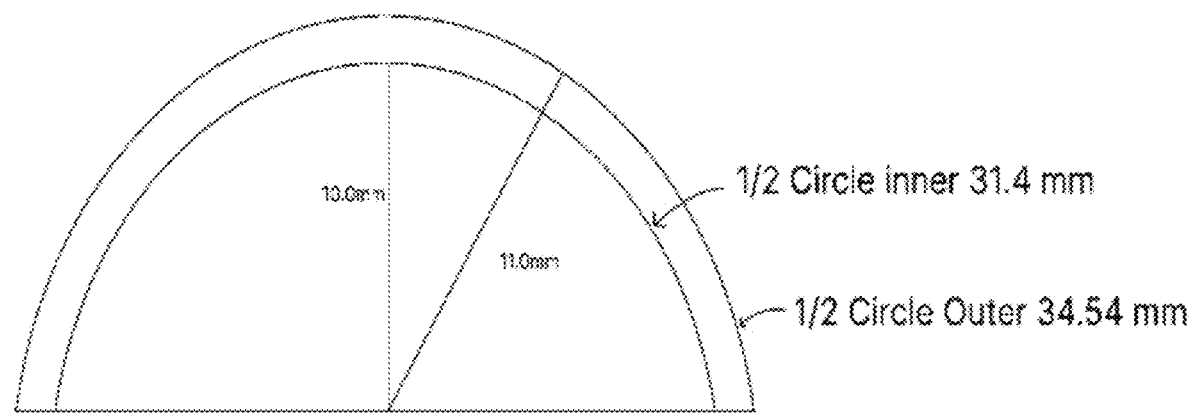
FIG. 5 shows a bent surface in a semi-circle form or configuration according to an embodiment.

FIG. 5 shows a bent surface in a semi-circle according to an embodiment. FIG. 5 illustrates two parallel straight lines when bent to a ½ circle, the outside line has to stretch to form a half circle. Two lines of equal length that start out as parallel lines are bent around the same center pivot point to end up with different lengths when they are stretched to form 12 circles. For example, consider two straight lines spaced apart 1 mm (or consider a thin plate of 1 mm thickness) bent to a semi-circle forming a 10 mm core radius ($R_i$). The outer circle thinness will be 11 mm ($R_o$). Therefore, the length of the inner line or surface would be 31.40 mm ($\pi R_i$) and the outer line or surface would be 34.54 mm ($\pi R_o$). The relative difference in lengths would be 3.14 mm. Therefore, the outer line which is 10% further away from a center pivot point with respect to the inner line becomes 10% longer than the inner line.

Figure 6:
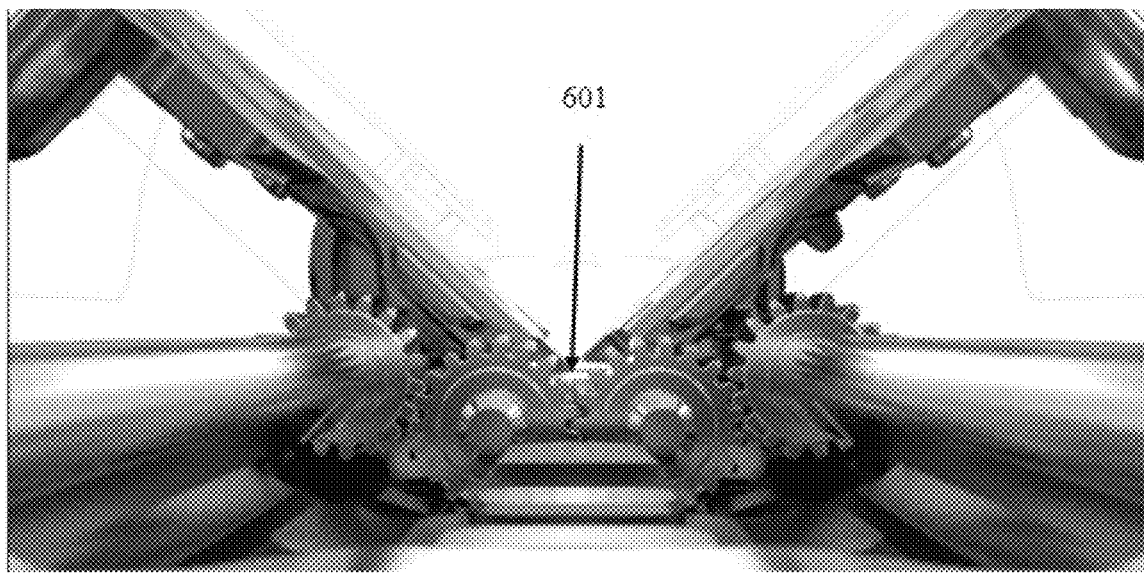
FIG. 6 shows a rotational hinge joint mechanism according to an embodiment.
Figure 7:
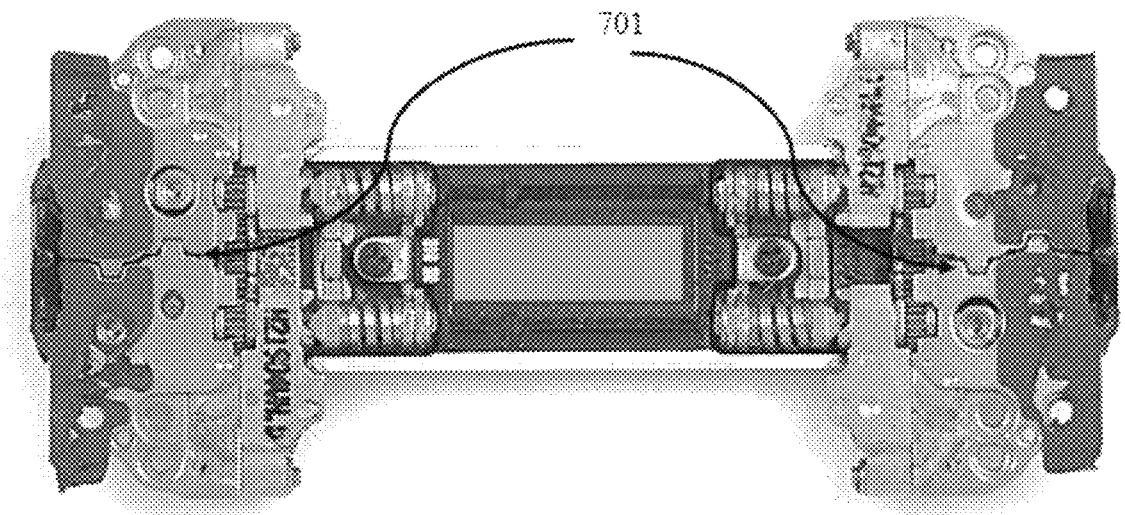
FIG. 7 shows a rotational hinge joint mechanism according to an embodiment.

FIG. 6 shows a rotational hinge joint mechanism according to an embodiment. FIG. 7 shows a rotational hinge joint mechanism 701 according to an embodiment. In hinge design 601 on the market, the rotational arc of the display and the hinge are often millimeters apart. For a rotating hinge that is 5.0 mm rotating radius, the difference in distance traveled in addition, the polymer material will stretch, bend, and develop a memory over time. This will affect and shorten the ability of the display layer to maintain a flat-screen. When the display layer is in its folded position, it develops a memory over time and does not return 100% fully back to a flat position. This can be shown by gift wrap papers that do not roll back to a flat position.

Figure 8A:
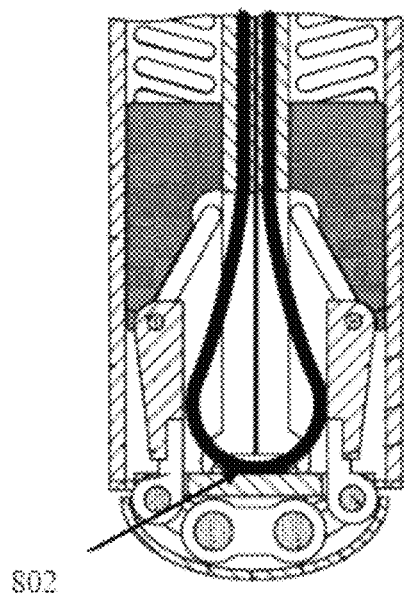
FIG. 8A and FIG. 8B show a rotational hinge joint mechanism according to an embodiment.
Figure 8B:
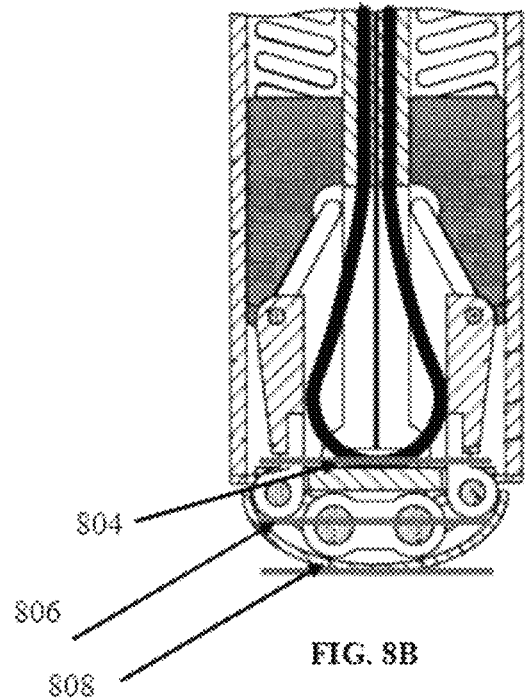

FIG. 8A and FIG. 8B show a rotational hinge joint mechanism according to an embodiment. As shown in FIG. 8A, display layer 802 is in folded configuration and the arch that the display layer is making is shown at the hinge joint. As shown in FIG. 8B, the display layer that is positioned inside 804 and folding hinge 806 will have tension when the device is fully opened and the display layer that is positioned outside 808 of folding hinge 806 will be in tension when the device is in its closed position.

Figure 9:
FIG. 9 and FIG. 10 show folding phones according to an embodiment.
Figure 10:
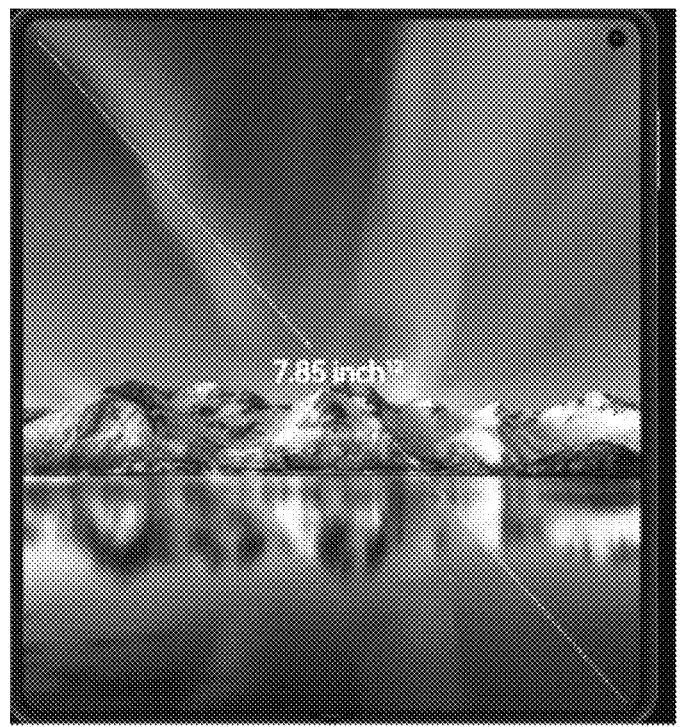

Size Limitations: FIG. 9 and FIG. 10 show folding phones according to an embodiment. Most folding phones and devices are limited to a screen size of 8 inches to 9 inches. The maximum display size for Trifold phones may be around 9 inches. Some laptops have offered folding displays. However, folding laptops do not have the portability of folding phones.

Solution

MULTILAYER PNEUMATIC STRUCTURE: A pneumatic support structure addresses the main limitations of a mechanical hinge. A pneumatic structure forms the base structure of flexible displays eliminating any gap between a rotational arc of the display layer and the support layer. In an embodiment, a pneumatic structure may eliminate hinges.

Figure 11:
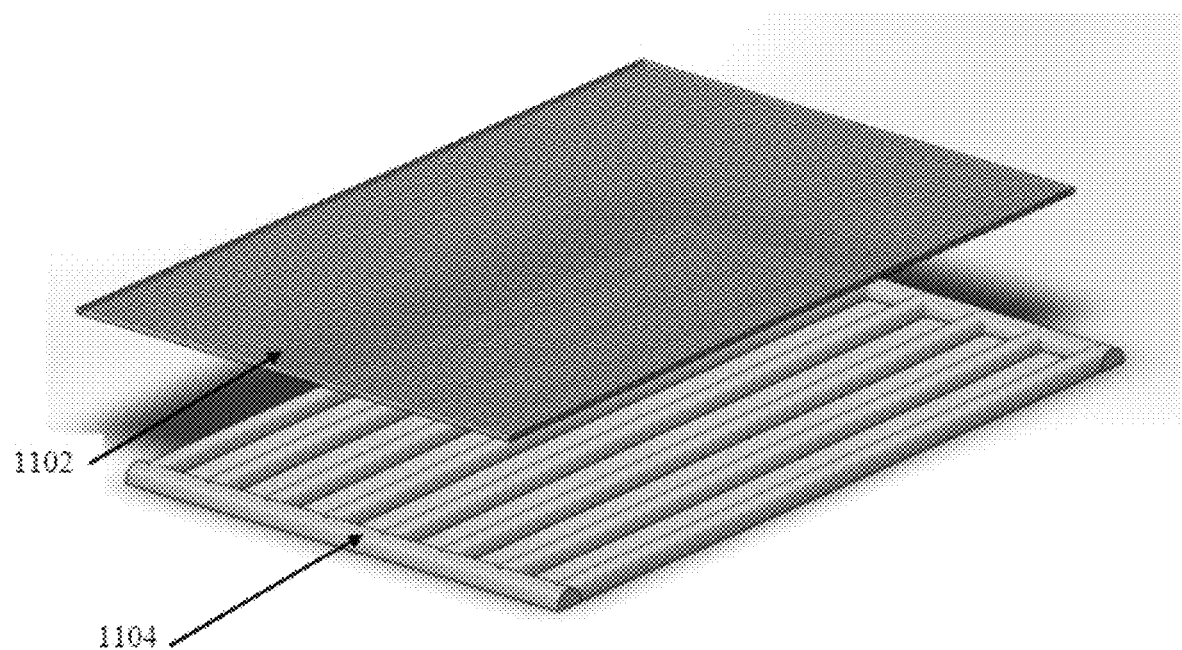
FIG. 11 shows layers of a pneumatic structure according to an embodiment.

FIG. 11 shows layers of a pneumatic structure according to an embodiment. By utilizing pneumatic structures, it is possible to maintain consistent pressure(s) to match the elastic properties of the flexible display over its lifetime. Air can provide structure when the display is in open configuration and takes up near zero volume when the display is rolled up/closed configuration. By layering and combining pneumatic layers, such as shown in 1102 and 1104, of various shapes and pressures, multiple objectives can be achieved in a single device.

A structure that deploys multiple layers and various geometries of pneumatic structures has many advantages. Select layers can be inflated and deflated depending on the desired function and geometry of the device.

Thin high-pressure layer: Thin pneumatic layers in a range of 0.5 mm to 2.0 mm thick layer with vertical inflatable structures allow the flexible display layer to have a firm base and touch sensitivity. Generally higher pneumatic pressure can be leveraged to keep the thickness of the layer to a minimum while providing a firm base.

Lower layer 1104 provides overall structural rigidity, similar to holding a piece of paper or tablet. Meanwhile, the upper layer/s 1102, is designed for higher pressure and a harder surface, enable touch sensitivity. Pressurizing the entire structure uniformly at high levels would result in excessive hardness, which is not ideal. Instead, multiple layers at varying pressures can be implemented to balance structural support and functionality. This design approach ensures support in two directions while maintaining the flexibility to fold the structure when it is deflated. Consideration may be given for materials such as thin nylon or polyester, as opposed to thicker latex. The materials chosen for pneumatic layers need to be extremely thin so that, once deflated, they are almost imperceptible. The exact material may be any, but it is required to meet these criteria for minimal presence when not in use.

The design and functionality of inflatable structures, highlighting the challenges and strategies for achieving optimal performance. Assuming a mattress like pneumatic layer, where the entire space between two layers has to be inflated, then inflating such an entire structure takes significant time. For mitigating the time taken to inflate such structures, segmented or localized layers such as those of tubes, grids, balloons of different shapes such as circular, hexagonal, etc., can improve inflation time and response. Achieving sufficient surface hardness for touch sensitive screens requires high-pressure, but instead of inflating the entire structure at high-pressure, a thin supportive layer or stiff structure can be employed. The design draws inspiration from biological systems, where components like skin, muscles, and skeletons work together to provide strength and functionality. Similarly, a combination of tough external layers and internal support mechanisms can enhance stiffness and durability in such flexible support structures.

Figure 12:
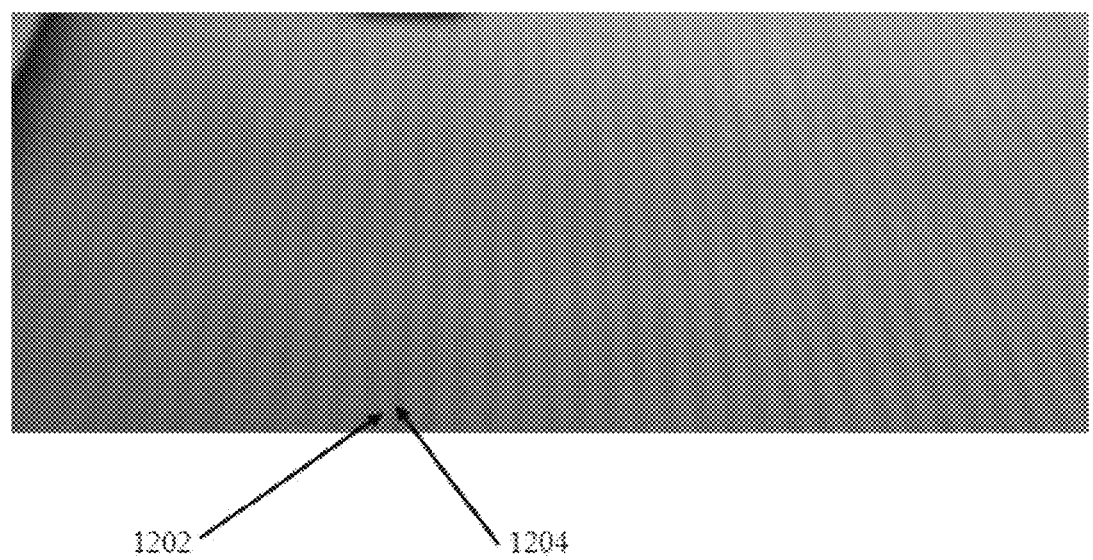
FIG. 12 shows a pneumatic layer according to an embodiment.

FIG. 12 shows a pneumatic layer according to an embodiment. Multiple vertical tubes, such as shown in 1202, which work together as a high-pressure vertical pneumatic structure, are connected to a non-inflatable flexible structure, such as shown in 1204, that aids in rolling up the display.

General frame and base layer: A base layer can be formed from approximately 1.0 mm to 20.0 mm thick and approximately 2 pounds per square inch (psi) to 10 psi. Lower pressure pneumatic tubes positioned lengthwise of the flexible display can utilize less substantial wall thickness but provide sufficient structure across the length of the display. In an embodiment, the lower limit for thickness may be 0.5 mm to 10.0 mm and the upper limit for the thickness may be 1.0 mm to 20.00 mm. In an embodiment, the lower limit for pressure may be 0.5 psi to 30 psi and the upper limit for the pressure may be 1 psi to 50 psi.

The horizontal tubes can utilize variable pressures depending on the desired position of the display in relation to the main rigid base, which will contain the Printed Circuit Board (PCB), pneumatic system and battery.

The horizontal orientation of the pneumatic tubes not only keeps the display straight but can be designed to maintain a desired level of tension on the display layer.

Articulating Layer—It is possible to articulate and position different sections of the display by utilizing balloons that can be inflated and deflated to make the flexible display bend across the specific section. Localized articulation allows the device to function as a tablet, a laptop with a specified display section folded up.

The support structure comprising pneumatic layer/s is designed to provide structural integrity when inflated while offering minimal resistance when deflated. Further, varying air pressure in different layers or different sections within the layer serves distinct functions. In one aspect of the design, multiple layers and separate "balloons," are incorporated each with specific purposes. Certain balloons, when inflated, can articulate features such as folding or unfolding a display, a feature not currently addressed in existing designs or available in prior art/state of the art. When deflated, the structure transforms into a flat, tablet-like form. By activating specific small balloons, the screen can be made to fold or unfold dynamically. One layer provides thin, high-pressure support for specific features such as touch function display, while the base layer, designed for lower pressure but maybe of greater thickness, offers overall structural rigidity for handling. Additionally, alternative materials or configurations, such as interconnected strips akin to garage doors that roll up and down, may enhance functionality. However, the primary innovation lies in achieving these capabilities through varying air pressures and distinct balloon designs, eliminating the need for rigid components.

Inflating and deflating: To inflate, the air pump/compressor is connected to the air inlet of the pneumatic structure, then the pump or compressor draws in atmospheric air and compresses it, and the compressed air is forced into the pneumatic structure increasing the internal pressure. A check valve may be present to prevent backflow, ensuring that the pneumatic structure remains inflated after the pump stops. Pressure levels may be monitored using a gauge to prevent overinflation or underinflation. Once desired pressure is reached, the pump may be disconnected, and the valve may be sealed.

In embodiments, the deflation may be a passive deflation, i.e., the air release valve is manually opened, allowing internal pressure to push air out naturally.

In embodiments, the deflation may be an active deflation (or vacuum-assisted deflation), where a reversible pump or vacuum pump connected to the valve draws air out from the pneumatic structure to create negative pressure, speeding up deflation. Once air is fully expelled, the foldable display can be folded or rolled. In embodiments, deflation occurs due to vacuum generation, where the pump actively draws air out, creating negative pressure inside the closed chamber/pneumatic structure to speed up the collapse. To deflate the pneumatic structure, air may be sucked out via a vacuum to take all the air out that is there in the structure and then the structure offers no resistance for folding after deflation.

In embodiments, air is used to provide the structure of the foldable screen, either a full support structure or a hinge support structure. A vacuum, or negative pressure is used to eliminate resistance or memory of the support structure or the hinge support structure.

In an embodiment, a bidirectional pump may be used. A bidirectional pump is a pump used for moving fluid or air in both directions, allowing for both inflation (pressurization) and deflation (vacuum or controlled exhaust) within a system. These pumps operate using a reversible motor or valve system that changes the direction of flow based on the requirement. The control logic for a bidirectional pump managing both inflation and deflation may be implemented using an electromechanical relay circuit, microcontroller-based logic, or programmable logic controllers (PLC). The control logic should allow the pump to switch between two modes, inflation mode where the pump forces fluid into the system and deflation mode where the pump reverses direction to remove the fluid.

ARTICULATING STRUCTURE: An articulating structure may refer to an assembly or system that enables controlled movement of its interconnected parts or segments relative to one another. Such structures are often designed with flexible connections, such as joints and hinges that allow a range of motion, such as rotation, bending, or extension, while maintaining structural integrity. Inflatable and deflatable areas can be effectively used for articulation in structures, leveraging the principles of pneumatics. These areas are typically composed of flexible materials such as elastomers, textiles, or composites that expand or contract when air or fluid is introduced or removed. By strategically designing and controlling the inflation and deflation of specific zones, the structures can achieve precise movements, including bending, rotation, or extension.

In an embodiment, the device may be having three screens, where one of the larger screens can articulate by folding up or down, allowing users to work in a laptop-like configuration. The design extends further to scenarios involving four screens, emphasizing versatility in functionality and arrangement. This approach aligns with the idea of a "Variable Display," where the device operates in multiple modes rather than being confined to a single form factor. Unlike most existing designs, which typically involve a single foldable screen that transitions between a compact mode and a larger unfolded mode (often with a visible seam), this device enables dynamic utilization of multiple screens. The screens can function collectively as a unified display or individually for specific tasks, offering users flexibility to adapt the device to their needs. This selective usage of multiple screens represents a significant departure from conventional designs.

Exoskeleton Combination: For structures beyond 20 inches to 120 inches, an exoskeleton structure, similar to what is used for awnings, can further aid in structural integrity.

According to an embodiment, it is an apparatus, comprising: a display comprising a display layer and a base structure, wherein the base structure is configured to support the display layer; the base structure comprises a pneumatic structure, wherein the pneumatic structure comprises one or more pneumatic layers; wherein the base structure is inflatable and deflatable; and wherein the display comprises an exoskeleton structure configured to support the display, wherein the exoskeleton structure comprises amorphous material, and wherein the exoskeleton structure comprises a retractable arm with a hinge joint; and wherein the apparatus is an electronic display device.

According to an embodiment of the apparatus, the display is a foldable display.

According to an embodiment of the apparatus, wherein the base structure is inflatable when the display is in open configuration and deflatable when the display is in folded configuration. According to an embodiment of the apparatus, the base structure further comprises an amorphous layer comprising amorphous material configured as a reinforcement layer. According to an embodiment, the amorphous material is an amorphous metal or an amorphous alloy.

According to an embodiment of the apparatus, the amorphous layer comprises a woven mesh mat structure from a plurality of amorphous ribbons or amorphous strips.

According to an embodiment of the apparatus, the pneumatic layers comprise a first layer of a first shape and a second layer of a second shape; wherein the first layer is of a first size and the second layer is of a second size; and wherein the first layer is at a first pressure and the second layer is at a second pressure. According to an embodiment of the apparatus, the pneumatic structure comprises a plurality of inflatable tubes connected by a non-inflated flexible structure. According to an embodiment of the apparatus, the plurality of the inflatable tubes is present in a first direction of a length of the display of the apparatus. According to an embodiment of the apparatus, the plurality of the inflatable tubes is present in a second direction perpendicular to a length of the display of the apparatus. According to an embodiment of the apparatus, the plurality of the inflatable tubes is configured at a variable pressure depending on a position in relation to a main rigid base of the display.

According to an embodiment of the apparatus, at least one of the pneumatic layers is configured to have a thickness in a first range of about 0.5 millimeter (mm) to 2.0 mm and is maintained at a pressure when inflated in a second range of about 5 pounds per square inch (psi) to 10 psi. According to an embodiment of the apparatus, at least one of the pneumatic layers is configured to have a thickness in a third range of about 1.0 millimeter (mm) to 20.0 mm and is maintained at a pressure when inflated in a fourth range of about 2 pounds per square inch (psi) to 5 psi. According to an embodiment of the apparatus, the pneumatic layers are configured to have a pressure in a fifth range of about 2 pounds per square inch (psi) to 10 psi.

According to an embodiment of the apparatus, the apparatus further comprises a pneumatic system configured to inflate the pneumatic layers. According to an embodiment of the apparatus, the apparatus further comprises a battery to power the pneumatic system. According to an embodiment of the apparatus, the apparatus further comprises a pressure controller configured to control a pressure of the pneumatic structure.

According to an embodiment of the apparatus, the display is touch sensitive comprising a touch function; and wherein the pneumatic layers are configured to support forces produced by the touch function to counter a deformation. According to an embodiment of the apparatus, the apparatus further comprises a body.

According to an embodiment of the apparatus, wherein the exoskeleton structure comprises amorphous material, and the exoskeleton structure is present in an inner space of the body.

According to an embodiment of the apparatus, the apparatus further comprises a rigid structure.

According to an embodiment of the apparatus, the base structure of the display is configured for reducing a gap between a rotational arc of the display and the base structure.

According to an embodiment of the apparatus, a group of the pneumatic layers are of different geometries. According to an embodiment of the apparatus, the apparatus is configured for a selective pressurization of one or more of the pneumatic layers. According to an embodiment of the apparatus, the pneumatic structure further comprises an articulating layer, wherein the articulating layer can be inflated and deflated at a section of the display, the display is configured to bend across the section.

According to an embodiment of the apparatus, the articulating layer comprises one or more of inflatable balloon structures and tubes in the one or more pneumatic layers. According to an embodiment of the apparatus, the apparatus, based on the inflation of the pneumatic layers, is configured to take a shape of one or more of a mobile phone display, a tablet display, a laptop display, and a stand-alone screen display.

According to an embodiment, it is a method comprising, rolling a display of an apparatus to an open configuration, wherein the display comprises a display layer and a base structure, wherein the base structure comprises a pneumatic structure, wherein the pneumatic structure comprises one or more pneumatic layers and is configured to support the display layer; pressurizing the one or more pneumatic layers, wherein the one or more pneumatic layers comprises a first pneumatic layer to a first pressure and a second pneumatic layer to a second pressure for pressurized layers; supporting the display with the pressurized layers during a touch function of the display; supporting the display using an exoskeleton structure, wherein the exoskeleton structure comprises a retractable arm with a hinge joint, and wherein the first pneumatic layer is configured to have a first size and a first shape and the second pneumatic layer is configured to have a second size and a second shape; and wherein the display is configured to articulate a size based on the pressurization of the one or more pneumatic layers; and wherein the apparatus is an electronic display device.

According to an embodiment of the method, the display is a foldable display. According to an embodiment of the method, the display is configured to take a shape of one or more of a mobile phone display, a tablet display, a laptop display, and a stand-alone screen display.

According to an embodiment of the method, the pneumatic layers are pressurized using a pneumatic system configured to inflate the pneumatic layers. According to an embodiment of the method, the pneumatic system is powered by a battery. According to an embodiment of the method, the first pressure and the second pressure of the pneumatic structure are controlled using a pressure controller. According to an embodiment of the method, the first pressure is in a first range of about 5 pounds per square inch (psi) to 10 psi, and the second pressure is in a second range of about 2 psi to 5 psi.

According to an embodiment of the method, the pneumatic structure further comprises an articulating layer, wherein the articulating layer when inflated and deflated at a section of the display, the display is configured to bend across the section. According to an embodiment of the method, the articulating layer comprises one or more inflatable balloon structures and tubes in the one or more pneumatic layers.

According to an embodiment of the method, the base structure further comprises an amorphous layer comprising amorphous material configured as a reinforcement layer. According to an embodiment of the method, the amorphous layer comprises a woven mesh mat structure made from a plurality of amorphous ribbons or amorphous strips.

Figure 13A:
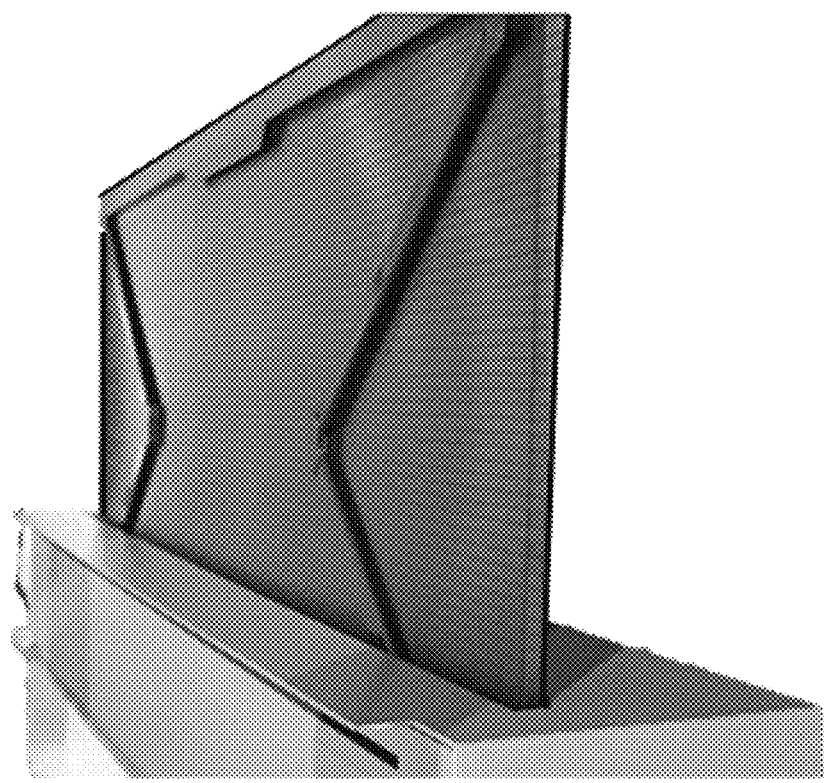
FIG. 13A, FIG. 13B, and FIG. 14 show an exoskeleton structure according to an embodiment.
Figure 13B:
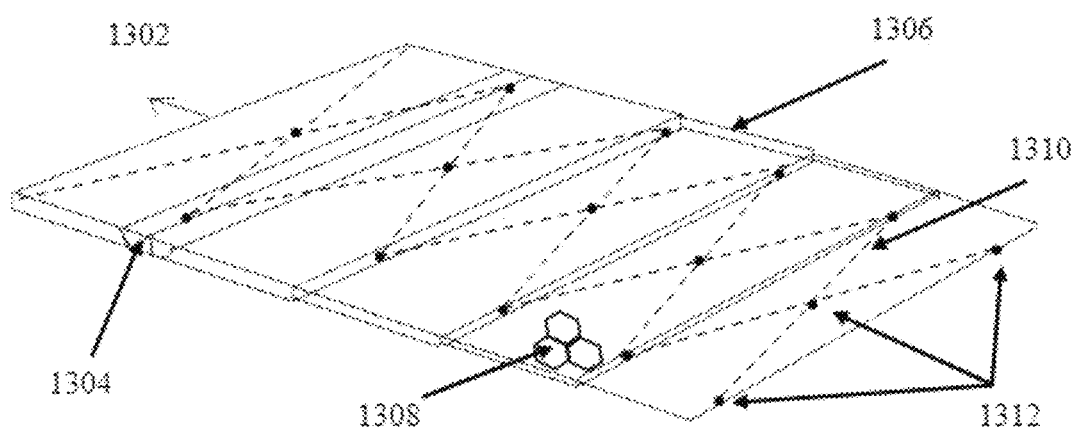
Figure 14:
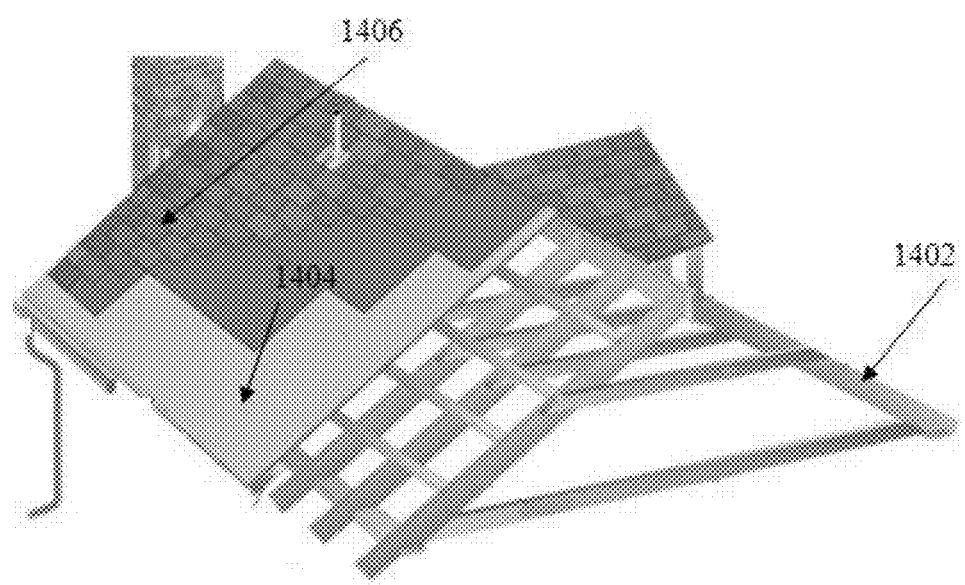

FIG. 13A, FIG. 13B, and FIG. 14 show examples of structures with an added exoskeleton according to an embodiment.

For example, FIG. 13A shows an LG® produced 88 inch roll out television using a similar structure. However, it does not have a screen touch function. As described herein, a high-pressure thin layer provided for supporting the roll up screen can enhance screen touch function.

An example of a foldable display with multi-level telescopic pullout exoskeleton support structure is shown in FIG. 13B, which is shown with four levels of telescopic pullout on one side. The other side, shown by an arrow at 1302 in FIG. 13B, may also have a pullout screen. The display may be foldable at hinge joint 1304. In embodiments, each of the telescopic pullout exoskeleton support structures may be supported by pullout railing/end rod structure 1306. In other embodiments, each level of the pullout of the telescopic pullout exoskeleton support structure may be supported using hinged arm structure as shown in FIG. 13A which may be behind each of the pullout levels as shown by arms 1310 and hinged joints 1312 or all of the pullout area. The telescopic pullout exoskeleton support structure may be the exoskeleton to support the display and may be solid or hollow with a pattern (example pattern shown in small area 1308 on the pullout structure, or the whole pull out may be hexagonal collapsible structure). The exoskeleton may comprise one or more layers of amorphous material. The hinged exoskeleton structure may comprise rigid external frames connected by rotating or pivoting joints (hinges) to allow movement while providing structural support. Such a structure may be hollow or solid, depending on the required balance between strength, weight, and material choices. In embodiments, the exoskeleton structure may comprise amorphous material layers and may incorporate mechanisms utilizing one or more of the following: telescopic extension, collapsible designs, scissor mechanisms arranged in an X pattern, foldable hinges, origami-inspired folding structures, interlocking lattice frameworks, sliding rail guides, and rack-and-pinion-based extensions.

In another example, FIG. 14 shows an embodiment, where a layered amorphous sheet structure could add to the rigidity of flexible screens. The pneumatic layer performs the function of rafters 1402 and the amorphous sheet functions as decking 1404 for the supporting display layer akin to layer 1406. Both pneumatic layer and amorphous sheet layer are needed and complementary to each other.

Similar to poles used to support tents, two poles or rods that are put diagonal to each other near the corners of the tent, taut with tension, would aid greatly in structural stiffness. Further, a mechanical structure that stretches awnings, using awning folding arms to maintain tautness could also serve the similar function as two poles.

In another embodiment, adding an exoskeleton further adds to the overall structural integrity where the apparatus becomes as stable as a tablet.

The support structure for the display comprises the following elements: An inflatable structure, comparable to a very thin air mattress about 2.0 mm to 20.0 mm thick depending on requirement, combined with a battery, printed circuit board, and display to lie flat and even. In addition, a pneumatic mechanism may be used to articulate the display in various positions. The Inflatable structure may be further supported by an amorphous structure and/or an exoskeleton structure.

Amorphous Structure:

A supporting structure behind an OLED display must meet three key properties:
  i. Highest strength to volume.
  ii. Close to ZERO Memory or Hysteresis Loss through flex cycles.
  iii. Available in Sheet or Foil thicknesses:
    Between 0.02 mm to 0.05 mm for two flat surfaces folding (similar to Samsung® phones).
    Between 0.1 mm to 0.5 mm for roll up display.

A flexible support structure must have sufficient strength to articulate the OLED and other supporting brackets and surfaces to a flat position and be able to provide sufficient structural integrity to accommodate touchscreen function.

Amorphous Alloys have a 10× strength to volume advantage vs. silica glass and 2× strength to volume advantage vs. Nitinol Alloys. As shown herein, volume (density) and strain limit have a linear effect on the radius of the bend that can be achieved. Thus, strength-to-weight ratio greatly favors foils made of Amorphous alloys.

Amorphous alloys have perfect memory and no hysteresis loss. This allows the entire articulating surface to return to its original position.

A single thick amorphous sheet might function well to maintain the flat surface and structural rigidity. However, as amorphous metallic sheets have elastic limits of approximately 2.0%, the strain load on the outer surface is directly proportional to the radius of the curve in relation to the "t" (thickness of the spring). In an embodiment, a combined thickness of the layered structure may add up to 0.1 mm to 5.0 mm. As an example, it may be possible that an individual amorphous sheet having 0.5 mm thickness or amorphous alloy foils having 0.1 mm thickness when added in plurality of layers to form support structure may be challenging to roll. Therefore, the thickness of the individual layer may be chosen such that the individual layer thicknesses are between 0.01 to 0.1 mm forming a combined flexible support structure thickness in the range of 0.01 mm to 5.0 mm. In an embodiment, there may be other materials between the layers of the plurality of layers that may be affecting the overall thickness/combined thickness or dimensions of the support structure. In an embodiment, the thickness of an individual layer may be chosen such that the individual layer thickness is between 0.01 to 0.2 mm forming a combined flexible support structure thickness in the range of 0.02 mm to 5.0 mm. In an embodiment, the flexible support structure has at least two layers.

In an embodiment, it is a flexible display with a layered spring structure using amorphous alloys capable of connecting to multiple devices.

Figure 15:
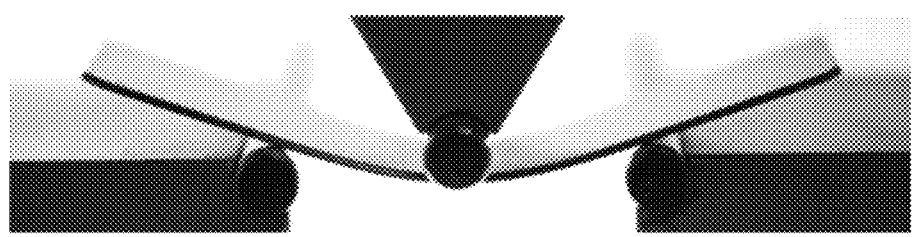
FIG. 15 shows a single spring's strain on the inner and outer surface according to an embodiment.

The strain on the outer surface of the flat spring is linear to the thickness of the sheet. Flat springs are those which are made from flat strips of metal. FIG. 15 shows a single spring's strain on the inner and outer surface according to an embodiment. As shown by FIG. 15, a single spring's strain is the difference between the length of the inner circle and the outer circle.

Length of ½ Circle (Perimeter of semi-circle) =Radius*π.

The thickness of the spring becomes the key determining factor. As the elastic limit of most amorphous alloys may be around 2%, the formula given below herein applies:

Height of the Spring ($t$)≤radius*0.02 where 't' represents the thickness of the spring as the inner surface is in compressions and outer surface is in tension, acts as the fulcrum and is in linear and direct proportion to the amount of stress applied to the outer surface as the spring bends around a radius. Therefore, it can be derived that a thickness of the spring (flat sheet/ribbon) when less than 2% of the desired bend radius, will maintain the strain in the outer layer within the 2% elastic strain limit. Given the above relation, a thickness can be derived if the desired strain limit is other than 2% or a bend radius for a given thickness to limit the elastic strain limit within a certain desired percent.

A spring is a slender, flat, and flexible strip of material that can bend or flex under load.

Figure 16:
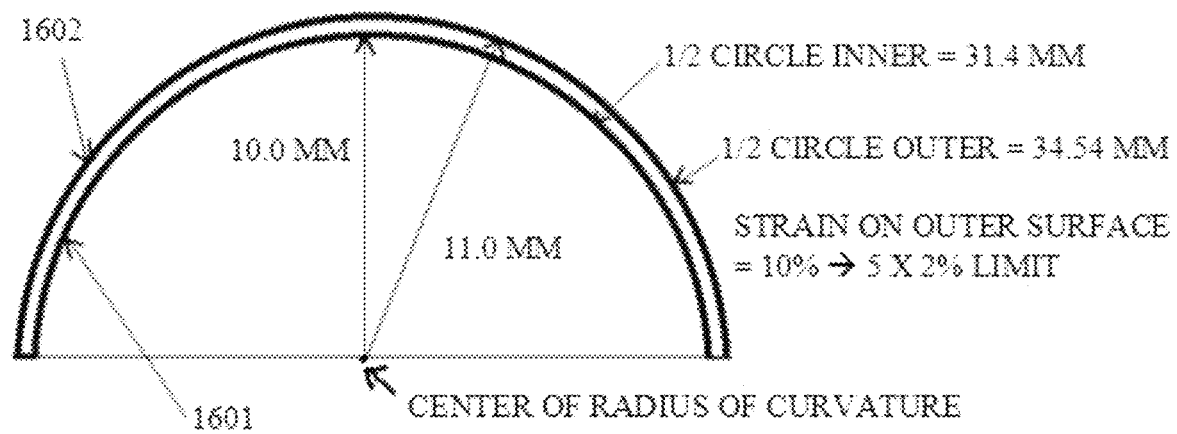
FIG. 16 shows a single solid spring and a strain on the inner and outer surface according to an embodiment.

FIG. 16 shows a single solid spring and a strain on the inner and outer surface according to an embodiment. Consider a solid spring of thickness 1.00 mm bent to 10 mm radius. The inner most layer 1601 will have a 10 mm bend radius while the outer most layer 1602 will have a 11 mm bend radius. Outer most layer 1602 will undergo maximum strain. Therefore, the inner surface 1601 perimeter would be 10π, which is equal to 31.41 mm and the outer most layer 1602 perimeter would be 11π, which is equal to 34.55 mm.

The strain in the outer surface =

$$\frac{\text{change in the length}}{\text{original length}} \times 100 = \frac{(34.55 - 31.41)}{31.41} \times 100 \sim 10\%;$$

which is 5× 2% strain limit. 2% strain limit is generally the elastic strain limit of most materials. The elastic limit is the maximum stress a material can endure without sustaining permanent deformation. It is the point on a stress-strain curve beyond which the material cannot return to its original shape when the stress is removed. For example, if a material has an elastic limit of 0.2% strain or elastic strain limit of 0.2%, it means that it can undergo deformation up to 0.2% of its original length or dimension and still return to its original shape and size when the applied stress is removed. In other words, if a material has an elastic limit of 0.2% strain, and it has an original length of 100 millimeters, it can undergo a deformation of 0.2 millimeters before plastic deformation starts.

As an example, stainless steel has an elastic strain limit of about 0.2-0.4% strain; thin metal foils of copper and aluminum may have an elastic strain limit in the range of 1-3% strain. Plastic OLED substrates may have an elastic strain limit up to 3% strain; Polyethylene Terephthalate (PET) may have an elastic strain limit of about 1-2% strain; Organic Light Emitting Diodes (OLEDs) displays integrated into flexible substrates may have an elastic strain limit around 1%.

Figure 17:
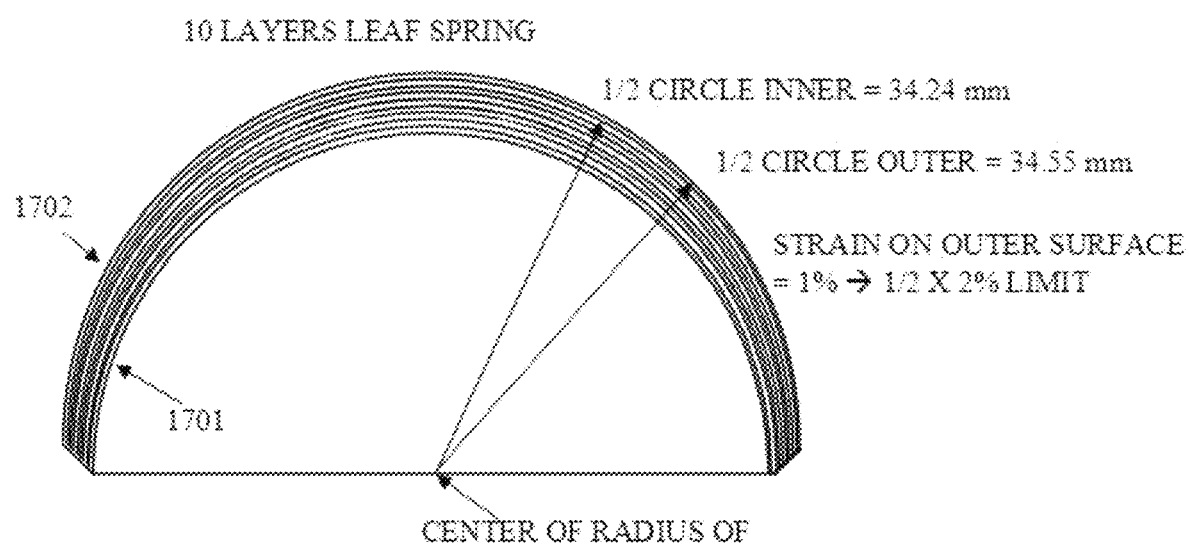
FIG. 17 shows a layered spring and a strain on the inner and outer surface according to an embodiment.

FIG. 17 shows a layered spring and a strain on the inner surface and outer surface according to an embodiment. Consider a layered spring, having 10 layers each 0.1 mm thick, and a total thickness of 1.00 mm, bent to 10 mm radius. The inner most surface of the inner most layer 1701 will be having a 10 mm bend radius while the outer most surface of the outer most layer 1702 will have an 11 mm bend radius. For the outer most layer 1702, the inner surface perimeter would be 10.9π, which is equal to 34.24 mm and the outer surface perimeter would be 11π, which is equal to 34.55 mm.

The strain in the outer surface of the outer most layer 1702 =

$$\frac{\text{change in the length}}{\text{original length}} \times 100 = \frac{(34.55 - 34.24)}{34.24} \times 100 \sim 1\%;$$

which is $$\frac{1}{2} \times 2\%$$

strain limit. 2% strain limit which is generally the elastic strain limit of most materials.

Therefore, a layered structure when compared with a single solid structure has an advantage in terms of limiting the strain on the surfaces which undergo tight bend radius.

Therefore, the materials, stainless steel having elastic strain limit as 0.2-0.4% strain, thin metal foils of copper and aluminum having elastic strain limit in the range of 1-3% strain, plastic OLED substrates having elastic strain limit up to 3% strain, Polyethylene Terephthalate (PET) having elastic strain limit about 1-2% strain, Organic Light Emitting Diodes (OLEDs) displays integrated into flexible substrates having elastic strain limit around 1% may function sufficiently when incorporated into a layered structure. Further, as can be seen from the calculations presented herein, material choice may depend on the bend radius and the thickness of the layer that is being chosen (based on number of layers chosen to provide the overall thickness) for the support structure which is layered.

Figures 18, 19:
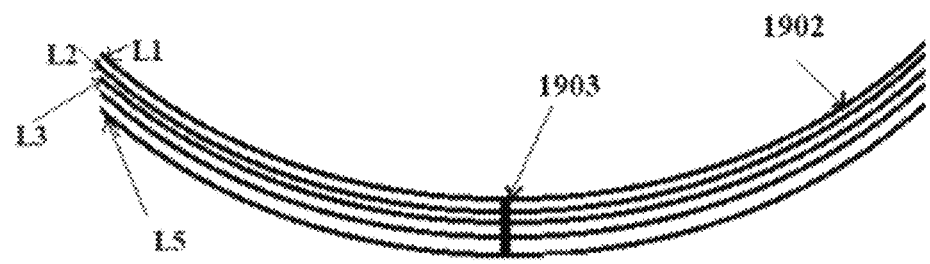
FIG. 18 shows a table comparing the strain in a solid spring and a layered spring according to an embodiment.
FIG. 19 shows a first example for a layered pattern for a supporting structure according to an embodiment.

FIG. 18 shows a table comparing the strain in a solid spring and a layered spring according to an embodiment. Calculation of strain on a flat spring which is a solid flat spring having 1 mm thickness bent to 10 mm radius versus a layered spring where the layered spring has 5 layers, each layer having a thickness of 0.2 mm, is shown in FIG. 18. As explained herein and as shown in the calculations of the table presented in FIG. 18, the strain in the outer most layer is minimized in the layered spring versus the solid spring having no layers.

Solution defined: By stacking multiple layers of amorphous sheets that are free to slide against each other. The 'r' value can be reduced while structural integrity and durability are maintained.

Thickness of the amorphous spring vs. radius of the flexible display: Thickness of Spring is less than 2% of the desired radius. The thickness of spring when less than 2% of the desired bend radius will maintain the strain in the outer layer within a 2% elastic strain limit. For example, if the desired radius is 5.0 mm, then the thickness of the amorphous plate needs to be less than 0.1 mm thick. An amorphous spring of this thickness does not have sufficient strength to provide desired structural stability as well as the strength to spring back to a consistent flat position. If the thickness of the spring is increased to overcome these weaknesses, the spring is likely to experience breakage before the desired timeline or lifespan.

One method to accomplish both thickness of spring at 0.1 mm and structural stability and flexibility is to utilize thin sheets, and layer them within a total thickness less than or equal to 0.1 mm, while allowing those layers, surfaces, to slide against each other. The layers provide strength and rigidity of the combined height of the entire layers, but the resulting strain on the outer surface is reduced in direct ratio to the number of layers used. The fulcrum, that determines the strain on the outer surface, begins at the inner surface of each layer. Thin sheets may be of amorphous material. FIG. 19 shows a first example for a layered pattern for the supporting structure of the display apparatus according to an embodiment. Multiple layers are joined at the flex line 1903 where the display would be bent, and the rest of the surface of the layers are allowed to move (i.e., glide) freely when the display is folded or rolled. The top layer 1902 is towards the display side of the device and is the inner layer.

Figures 20, 21:
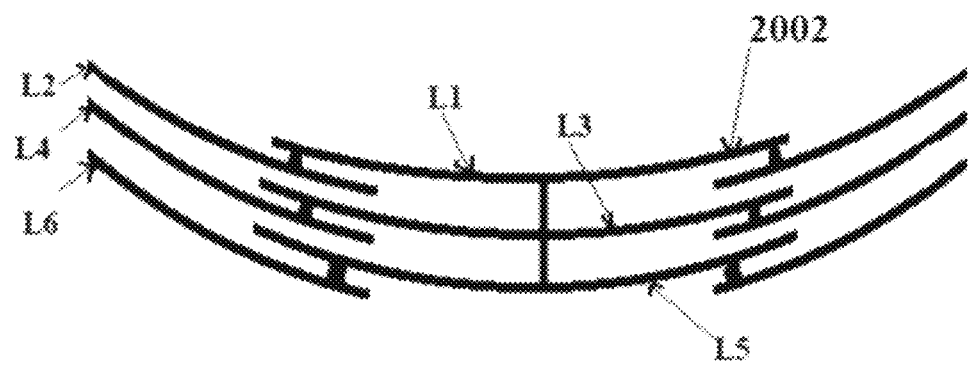
FIG. 20 shows a second example for a layered pattern for a supporting structure according to an embodiment.
FIG. 21 shows a first example for the chemistry of an Iron (Fe)-based amorphous ribbon according to an embodiment.

FIG. 20 shows a second example for a layered pattern for the supporting structure/display apparatus according to an embodiment. Another method to accomplish a layered display apparatus support structure is to join the plurality of layers at predetermined points. These points may be as shown in FIG. 20 which would limit the stress and thus the strain on the outmost surface when bent. Other configurations of joining the plurality of layers are contemplated with the requirement that the plurality of layers form enough support structure for the display and yet each layer would be free to glide on the other surfaces while being joined at predefined places. The top layer 2002 is towards the display side of the device and is the inner layer.

Joining at predetermined positions is advantageous because it provides a simple and robust connection that can accommodate movement and reduce stress. Predetermined means the locations or points, at which the layers are joined or connected, have been intentionally chosen or specified in advance. These locations are not random but are carefully selected and designed to enable controlled and planned movement between the layers. These connection points are determined based on the desired functionality and intended movements of the structure. By connecting the layers at the predetermined points, the layers can glide or move freely over each other in a controlled and predictable manner. As shown in FIG. 19, the connection may be along the flex line 1903, at the center of the strips, rigidly connecting all the layers, for example, layers L1, L2 . . . L5, and letting the rest of the unconnected areas to glide freely relative to the adjacent layers. L1 may be the layer closest to the display. In an embodiment, the layers can be arranged as shown in FIG. 20. The layers can be formed from a plurality of strips in each layer, for example, layer L2 is formed from two individual strips. Layer L1 is connected to L2 and L3, L2 is connected to L1, and L3 is connected to L4 and L5 (L4 is connected to L3) and so forth. The arrangement of layers as shown in FIGS. 19 and 20 are examples, and many such forms may be designed with the requirement that the layers have to glide over each other, cover the given area, provide enough support, and the elastic strain limit in the layers is within 1.5% to 2%. In an embodiment, there may be places where support points may be provided between the layers, but these support points do not connect two layers rigidly. The support points may be connected to one layer and rest on the other layer providing support yet letting the layers glide over each other. According to an embodiment, the connection may be a point or spot connection or a continuous connection along a line where two surfaces or layers being connected. Each layer L1, L2 . . . etc., has an individual thickness and the flexible display support structure or apparatus has an overall or combined thickness. In an embodiment, the combined thickness may or may not be equal to the sum of individual layers as there may be other materials between the layers that affect the combined dimensions. Other materials could be electronic components, lubrication material, etc.

A layered spring should be composed of individual layers, each capable of bending independently and sliding or rolling along the adjacent layers' surface around either a bending axis or a rolling axis. If we have a layered spring where all the layers have interconnected surfaces that behave like a single, solid spring or a solid flat sheet when bent, it should not be classified as a true layered spring.

According to an embodiment it is a flexible display apparatus comprising a plurality of layers, wherein each layer is connected to at least one other layer at a predetermined position, forming a connection, wherein the flexible display apparatus is part of a display of an electronic device, and wherein each layer of the plurality of layers comprises a rotational degree of freedom and glides relative to adjacent layers of the plurality of layers about an axis of fold or roll, when the display is folded or rolled.

According to an embodiment of the flexible display apparatus, each layer of the plurality of layers comprises a material having an elastic strain limit of at least 1.5%. According to an embodiment of the flexible display apparatus, a flexible silica glass surface forms a first surface layer towards a display side and is supported by a second surface layer with an amorphous sheet. According to an embodiment of the flexible display apparatus, a flexible silica glass surface forms a first surface layer towards a display side and is supported by a second surface layer with a material having an elastic limit of at least 1%. According to an embodiment of the flexible display apparatus, each layer of the plurality of layers comprises a material having an elastic limit of at least 1%.

According to an embodiment of the flexible display apparatus, the amorphous sheet comprises either silica or alloys. According to an embodiment of the flexible display apparatus, an Organic Light Emitting Diode (OLED) is printed on the flexible silica glass surface.

According to an embodiment of the flexible display apparatus, the flexible silica glass surface is firmly bonded to one or more layers of amorphous alloy along a flex zone. According to an embodiment of the flexible display apparatus, the flexible silica glass surface is firmly bonded to one or more layers of silica along a flex zone.

According to an embodiment of the flexible display apparatus, at least a layer of the plurality of layers comprises an amorphous material. According to an embodiment of the flexible display apparatus, the amorphous material comprises iron-based amorphous ribbons. According to an embodiment of the flexible display apparatus, the amorphous material comprises silica based glass sheets. According to an embodiment of the flexible display apparatus, the plurality of layers of the flexible display apparatus forms a spring structure.

According to an embodiment of the flexible display apparatus, a magnetic field is used to hold the plurality of layers in a stable position, until a sufficient force is applied to free the layers.

According to an embodiment of the flexible display apparatus, the connection is a rigid connection. According to an embodiment of the flexible display apparatus, the connection comprises a mechanical joint comprising one of a spot welding, a fastening joint, and a rivet. According to an embodiment of the flexible display apparatus, the connection comprises a mechanical joint comprising a telescopic sliding joint.

According to an embodiment of the flexible display apparatus, the predetermined position is configured such that varying the predetermined position varies for a degree of free gliding. The predetermined position is the location where the two layers are joined. The predetermined position can be based on the rigidity and freedom of glide as required. According to an embodiment of the flexible display apparatus, the display comprises at least one organic light emitting diode; wherein at least one of the plurality of the plurality of layers comprises at least one amorphous alloy; and wherein the display remains at least substantially flat after folding and unfolding multiple times.

According to an embodiment of the flexible display apparatus, the flexible display apparatus is part of one or more of a mobile phone, a smart phone, a personal digital assistant device, a computer, a television, a wall-mountable display. According to an embodiment of the flexible display apparatus, each layer of the plurality of layers has a different thickness. According to an embodiment of the flexible display apparatus, each layer of the plurality of layers has the same thickness. According to an embodiment of the flexible display apparatus, a first layer of the plurality of layers closest to a display side has a first thickness different from a second layer of the plurality of layers farther from the display side having a second thickness, wherein the first thickness is smaller than the second thickness, and wherein an elastic limit of a first material of the first layer and a second material of the second layer is at least 1.5% strain.

According to an embodiment of the flexible display apparatus, a lubrication mechanism is positioned between adjacent layers, said lubrication mechanism is configured to reduce friction and promote a free movement of said layers relative to each other. According to an embodiment of the flexible display apparatus, the lubrication mechanism comprises a dry lubricant. According to an embodiment of the flexible display apparatus, the lubrication mechanism comprises a liquid lubricant contained within sealed channels between adjacent layers.

In an embodiment, the flexible display contains a layered spring. In an embodiment, the flexible display is a structure using amorphous alloys capable of connecting to multiple devices. In an embodiment, amorphous sheets can be fixed in various points to reinforce the areas as needed while allowing the layers to move freely to form the layered structure to be utilized in displays.

In an embodiment, the layered structure forms the hinge portion of the support structure. The hinge portion of a flexible display refers to a specific region or component within a device that allows for the flexing, bending, or folding of the display screen.

Variable thickness and geometry of the amorphous layers: The inner layer that bends around the smallest radius may be thinner. The subsequent supporting layers may increase in thickness as long as the 2% strain rule is followed. This may help to increase structural stability while maintaining desired durability. It is contemplated that other materials may also be used as long as the relationship between bend radius and thickness of the spring, sheet, yield to the elastic strain limit as per the materials property. The other way of working with the chosen material is to derive the thickness given the material property and the bend radius.

Flexible Silica Glass marketed by Corning® (Gorilla® Glass) can be layered to provide the same benefits as Amorphous Alloy sheets. However, Silica Glass cannot match the ultimate strength of amorphous alloys. Since tightness of the roll radius is a critical factor, a Layered Spring Structure made of Silica Glass might be limited to roll up displays with relatively bigger diameters.

FIG. 21 shows a first example for chemistry for Iron (Fe) based amorphous ribbons according to an embodiment. In an embodiment, the Iron-based amorphous ribbons may be utilized for the layers of the display structure. The chemistry of the iron-based amorphous ribbons is provided in FIG. 21.

FIG. 22 shows a second example for chemistry for Iron (Fe) based amorphous ribbons according to an embodiment. In an embodiment, Iron-based amorphous ribbons, with chemistry/composition different from the one shown in FIG. 21, may be utilized for the layers of the display structure. The chemistry of the iron-based amorphous ribbons may be as shown in FIG. 22.

According to an embodiment of the flexible display apparatus, the iron-based amorphous ribbons comprise iron in a first range of 84-100%, silicon in a second range of 0-10%, boron in a third range of 0-5%, and manganese in a fourth range of 0-2%.

According to an embodiment of the flexible display apparatus, the iron-based amorphous ribbons comprise iron in a first range of 0-100%, cobalt in a second range of 0-85%, nickel in a third range of 0-50%, silicon in a fourth range of 0-10%, molybdenum in a fifth range of 0-8%, boron in a sixth range of 0-5%, and manganese in a seventh range of 0-2%.

FIG. 23 shows dimensions of Iron (Fe) based amorphous ribbons that are available in the market readily according to an embodiment. Amorphous ribbons that are available in the market may be used to form the display apparatus structure. The thickness may be about 23 micrometers. In an embodiment, the thickness may be in the range of 0.1 micrometers to 1 millimeter (mm). In an embodiment, the lower limit of the thickness may be in the range of 0.1 micrometers to 0.5 mm. In an embodiment, the upper limit of the thickness may be in the range of 0.3 micrometers to 0.5 mm.

In an embodiment, the width of the ribbon may be in the range of 5 mm to 213 mm. In an embodiment, the width of the ribbon may be in the range of 1 mm to 200 mm. In an embodiment the ribbon width may be in the range of 10 mm to 250 mm. In an embodiment, the width of the ribbon chosen may be based on the display size of the electronic device on which the layered structure of the display is utilized. For example, the width is chosen such that it may be of the size of the display of the electronic device, or half the size of display of the electronic device, or ⅓ the size of display of the electronic device, or in any desired width such that the display of the electronic device has structural integrity and high flexibility and is supported in full.

In an embodiment, the layers may be comprising silica based glass sheets.

Figure 24:
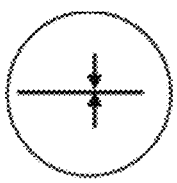
FIG. 24 shows properties of Silica glass by Schott© according to an embodiment.
Figure 24:
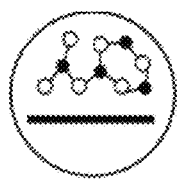
Figure 24:
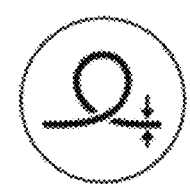

FIG. 24 shows properties of Silica glass by Schott® according to an embodiment. The Xensation® Flex offers thickness below 100 micrometers with a bend radius of less than 1 mm and the ability to bend more than 300,000 times. Thus, commercially available materials may be utilized to form the layers.

Several materials may be used for substrates or backplanes in flexible displays, including thin glass substrates like Corning's Willow Glass or Schott's Xensation®, which are specially designed to be both flexible and rigid. Plastic materials like Polyethylene Terephthalate (PET) and Polyimide (PI) are also commonly used for their flexibility and high-temperature resistance. Thin metal foils, such as aluminum or copper, offer excellent rigidity while being lightweight. In some cases, organic materials or hybrid substrates combining various materials may be employed with the material choice depending on factors like display size, shape, durability, and cost. The selection of the substrate material is an important consideration in flexible display design and manufacturing.

In an embodiment, the layers of the plurality of layers may be made of the same material or of different materials. In an embodiment the layers may be made of similar thicknesses and of different thicknesses for each layer. In an embodiment, each layer of the plurality of layers may be made of the same thickness and the same material. In an embodiment, each layer of the plurality of layers may be made of different thicknesses and of different materials. In another embodiment, the thickness and material may be the same for a group of layers from the plurality of layers.

In an embodiment, the top layer, on which OLED is printed for display, may be comprised of flexible silica glass and is firmly bonded to one or more layers of amorphous alloy or silica support along the flex zone.

Iron (Fe) based amorphous ribbons and silica based glass sheets may be used to form the layers. Fe based amorphous metallic ribbons that Metglas® produces are commercially available in the market and may be chosen for support structures. A flexible silica glass (Gorilla Glass®) sheet may also be used, beyond just the surface of a flexible display, as a flexible support structure.

Flexible Display as all-In-One Display and Input Device

Figure 25A:
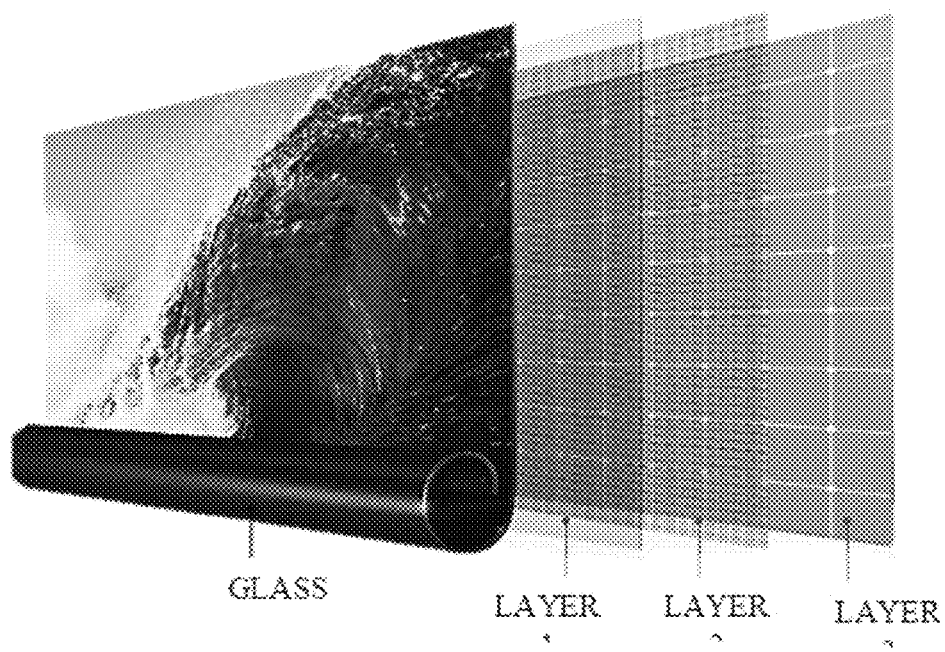
FIG. 25A shows a roll up/foldable screen according to an embodiment.

1) Foldable Displays (FDs) that can connect to existing smartphones and other smart devices mainly function as input and display devices. FIG. 25A shows a roll up/foldable screen according to an embodiment. It comprises a base structure comprising a plurality of layers. The base structure comprises pneumatic structure and amorphous material layer. For example, layer 1 and layer 2 could be pneumatic layers while layer 3 could be an amorphous alloy layer. For example, layer 1 and layer 3 could be pneumatic layers while layer 2 could be an amorphous alloy layer. For example, layer 2 and layer 3 could be pneumatic layers while layer 1 could be an amorphous alloy layer. In an embodiment, there could be more than 3 layers. In an embodiment, there may be one or more layers before layer 1 and after layer 3 of elastic materials such as elastomers.

The key advantage of such a simple display/input device that leverages the existing smartphones and computers is that a FD leverages the existing devices. Most smartphones would function instantly as a flexible display device at about ⅓ the cost of purchasing a new smart phone with FD. Both the folding and roll up displays can connect to multiple Central Processing Units (CPUs), Smart Phones, or Printers, Audio Video devices, and TV remotes to function as the universal input output device that connects us to our electronics world.

For example, a pen sized roll up display can unfold to a Mini Pad sized display and connect to home or office laptops, computers, cell phones, vehicles, and auto security.

Medical staff can leverage the high-definition display to show Magnetic Resonance Imaging (MRI) and other medical information to patients. A flexible display connected to a smart phone can conduct Zoom meetings as well as personal communications.

If the main display in an automobile is used for the Global Positioning System (GPS) map function, your ability to control many other functions in the car simultaneously may be limited. Thus, you can assign the FD as the display for the GPS while leaving the main auto display for other functions.

2) FDs that function as smartphones or laptops need little explanation. However, even a fully independent smartphone with FD can function in an integrated manner to either control and/or simply to display information.

3) Two or more flexible displays can be connected to form a single continuous screen.

The display can function unattached, independent of the CPU via Bluetooth® and can be charged using wireless charging. A roll up/foldable screen can be used as an extension in various scenarios and for applications according to an embodiment.

The flexible display (i) can connect Cell Phones, (ii) can be used for Multiple Screens as One Unit and (iii) can be used as Secondary Displays.

Figure 25B:
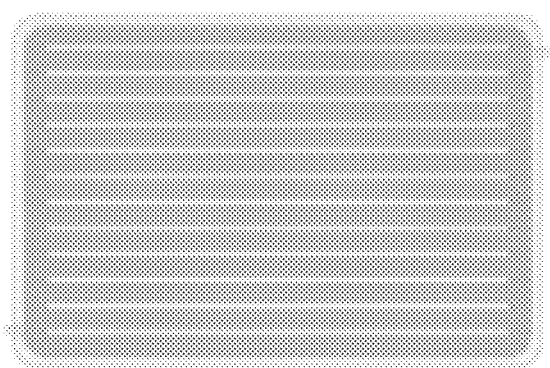
FIG. 25B-FIG. 25G shows a foldable screen according to a first embodiment.
Figure 25C:
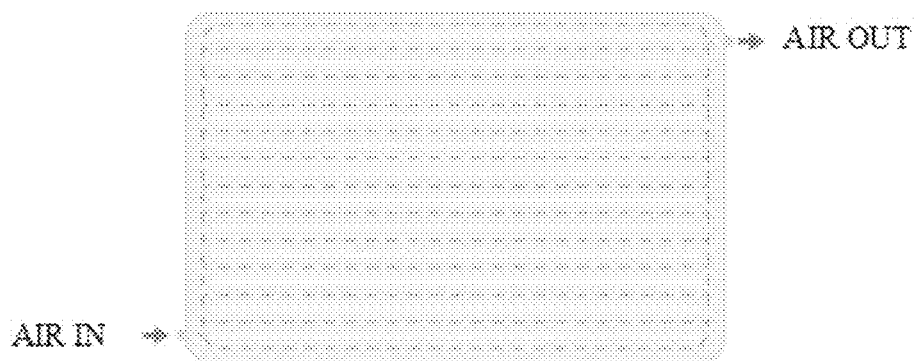
Figure 25D:
Figure 25E:
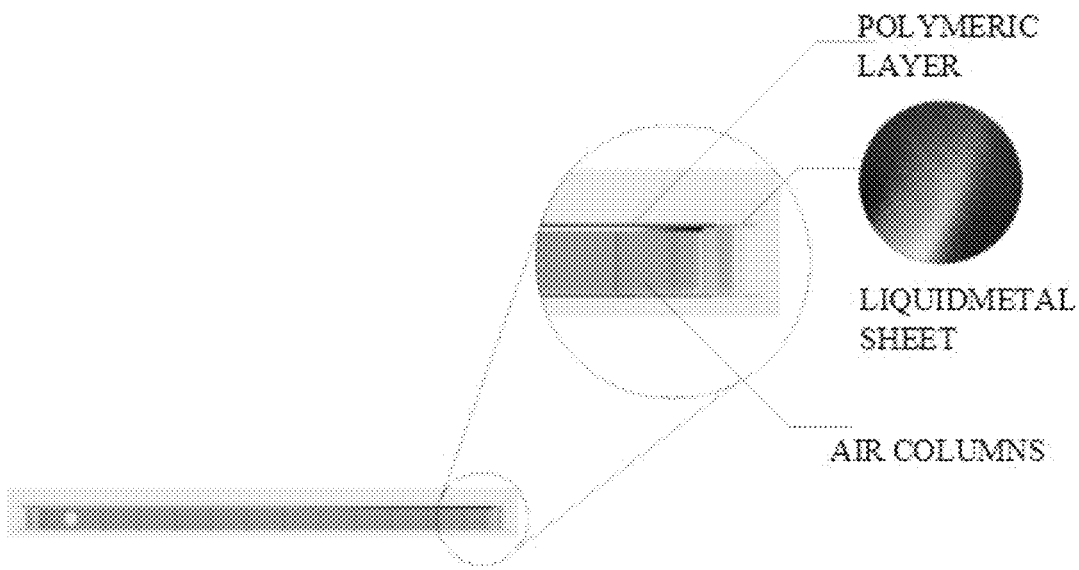
Figure 25F:
Figure 25G:
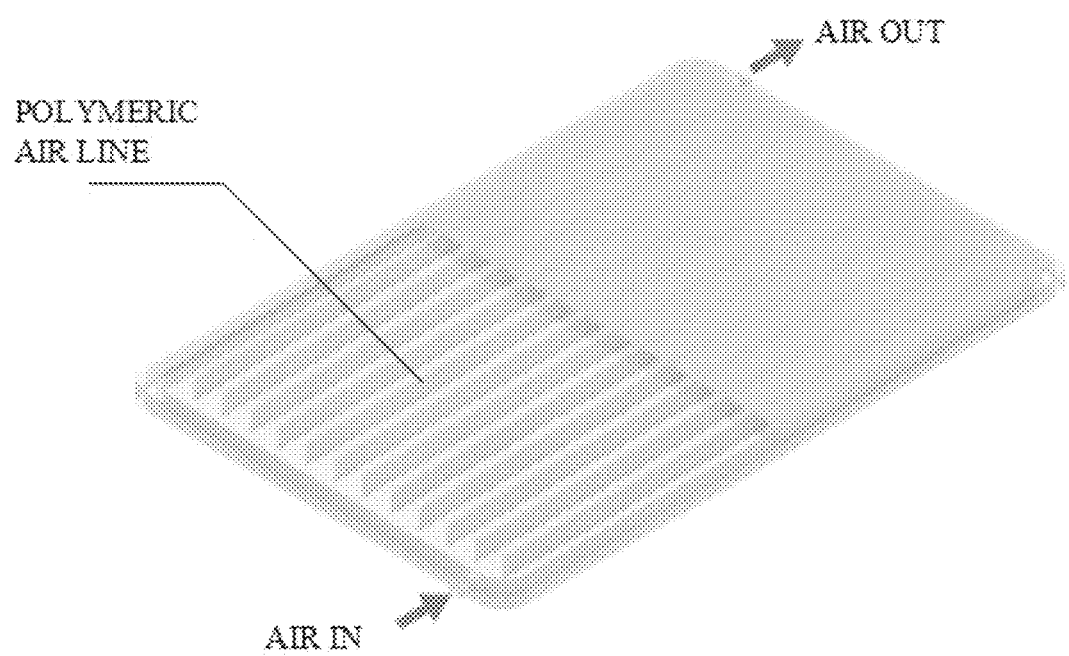

FIG. 25B-FIG. 25G shows a foldable screen according to a first embodiment showing horizontal polymeric air lines. FIG. 25B shows a top view of the foldable screen; FIG. 25C shows a top view of air column arrangement in the foldable screen; FIG. 25D shows a front view of the foldable screen; FIG. 25E shows the side sectional view highlighting the layers of amorphous material and the air columns where one or more of the top and bottom layers comprise polymeric layer and amorphous material layer with air columns between the top layer and the bottom layer; FIG. 25F shows the perspective view of the foldable screen; and FIG. 25G shows the hatch section perspective view of the foldable screen.

Figure 25L:
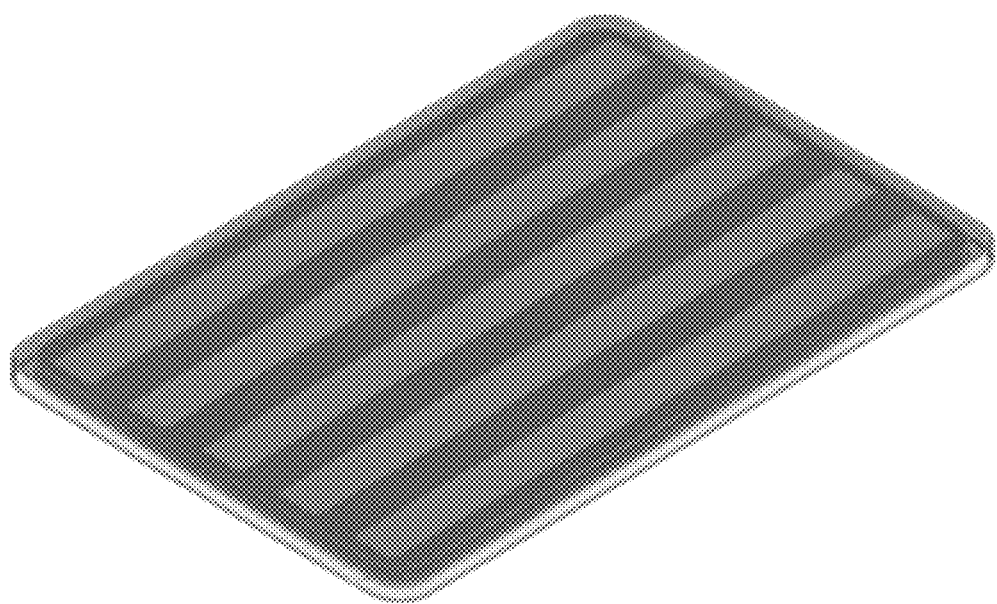
Figure 25M:
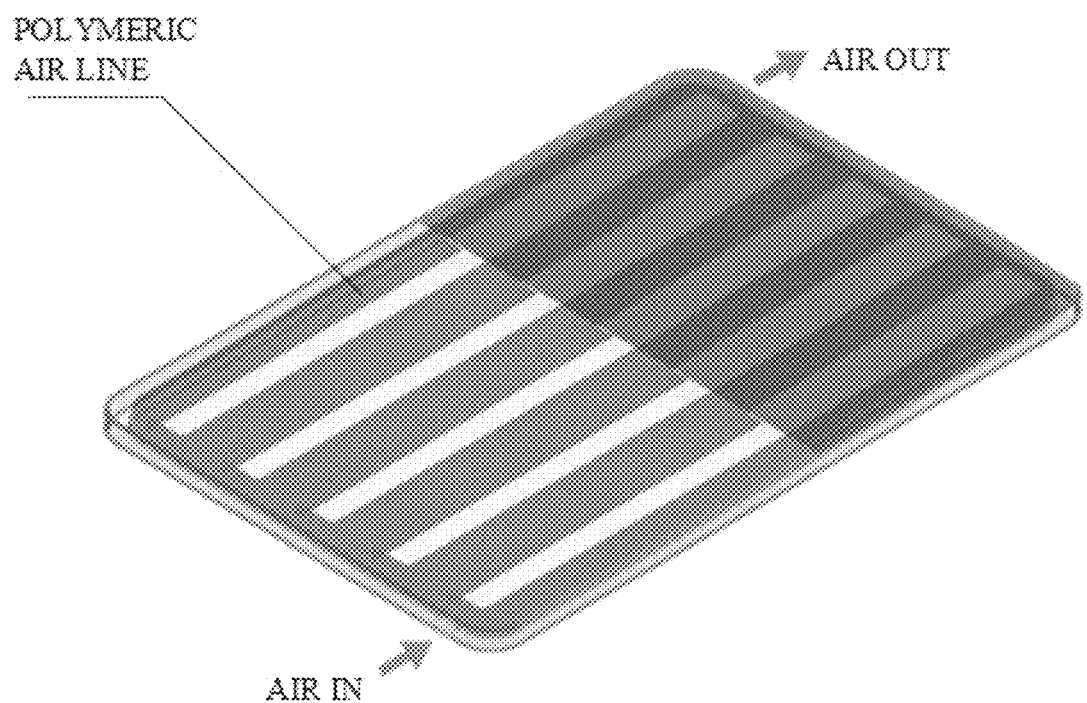

FIG. 25H-FIG. 25M shows a foldable screen according to a second embodiment showing horizontal polymeric air lines. FIG. 25H shows a top view of the foldable screen; FIG. 25I shows a top view of air column arrangement in the foldable screen; FIG. 25J shows front view of the foldable screen; FIG. 25K shows the side sectional view highlighting the layers of amorphous material and the air columns where one or more of the top and bottom layers comprise polymeric layer and amorphous material layer with air columns between the top layer and the bottom layer; FIG. 25L shows the perspective view of the foldable screen; and FIG. 25M shows the hatch section perspective view of the foldable screen.

Figure 25N:
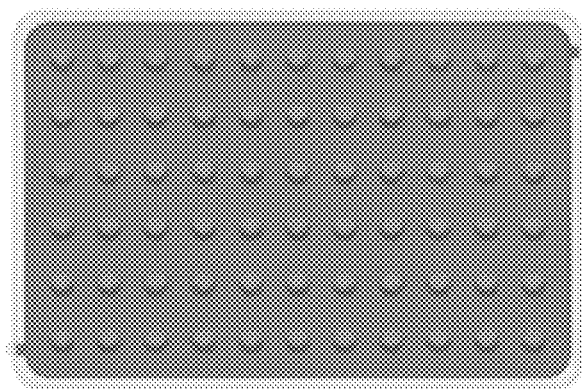
FIG. 25N-FIG. 25S shows a foldable screen according to a third embodiment.
Figure 25O:
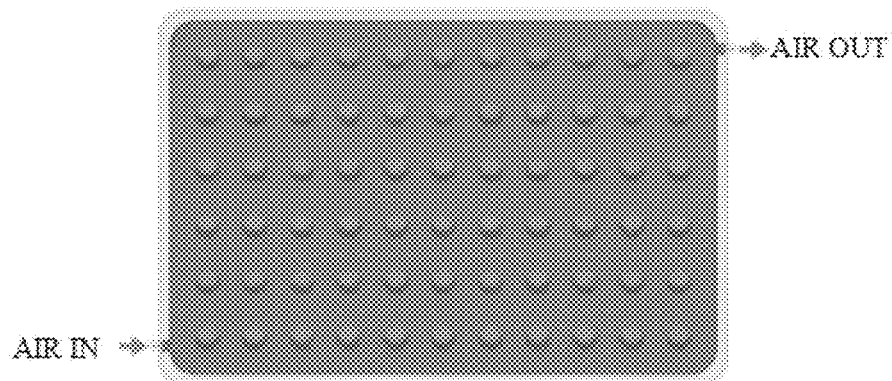
Figure 25P:
Figure 25Q:
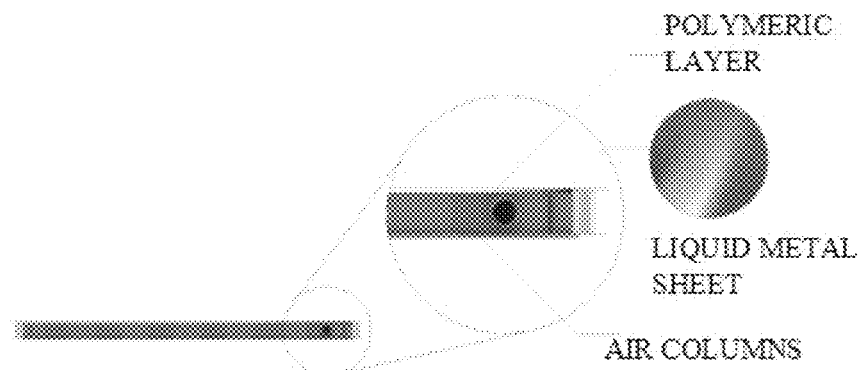
Figure 25R:
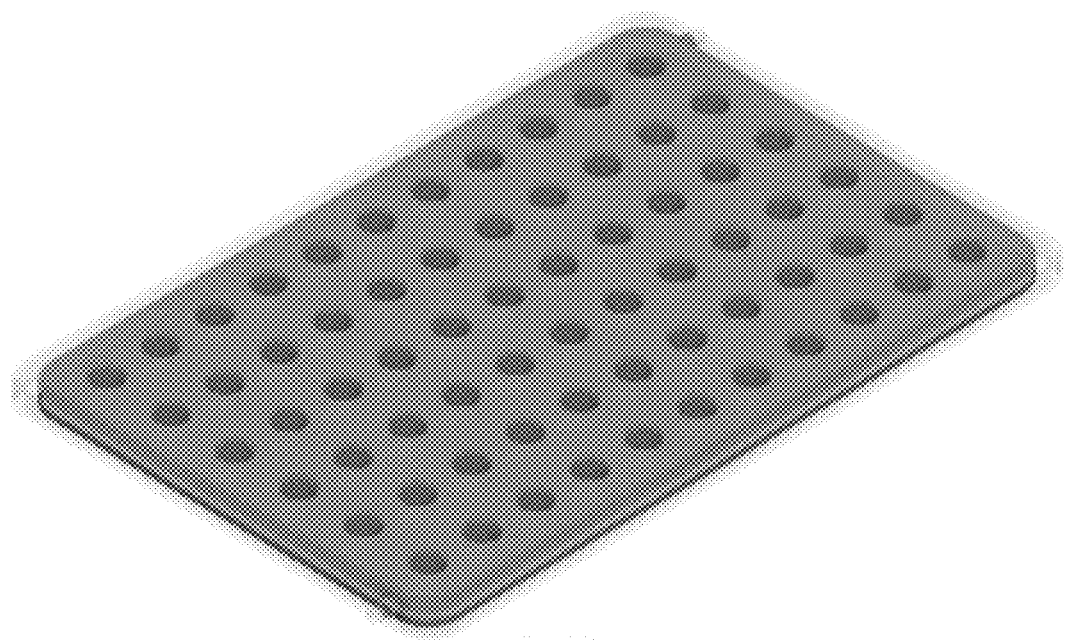
Figure 25S:
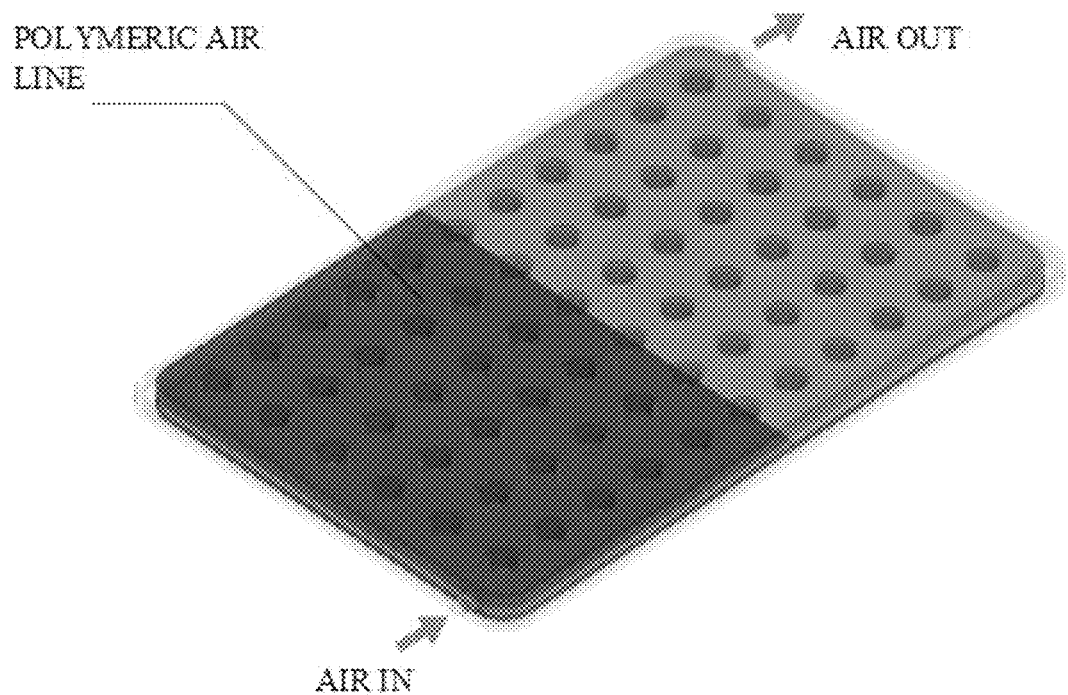

FIG. 25N-FIG. 25S shows a foldable screen according to a third embodiment showing horizontal and vertical polymeric air lines. FIG. 25N shows a top view of the foldable screen; FIG. 25O shows a top view of air column arrangement in the foldable screen; FIG. 25P shows front view of the foldable screen; FIG. 25Q shows the side sectional view highlighting the layers of amorphous material and the air columns where one or more of the top and bottom layers comprise polymeric layer and amorphous material layer with air columns between the top layer and the bottom layer; FIG. 25R shows the perspective view of the foldable screen; and FIG. 25S shows the hatch section perspective view of the foldable screen.

Figure 25T:
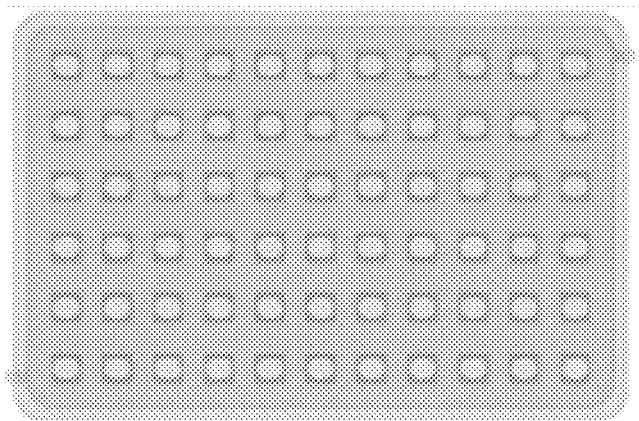
FIG. 25T-FIG. 25Y shows a foldable screen according to a fourth embodiment.
Figure 25U:
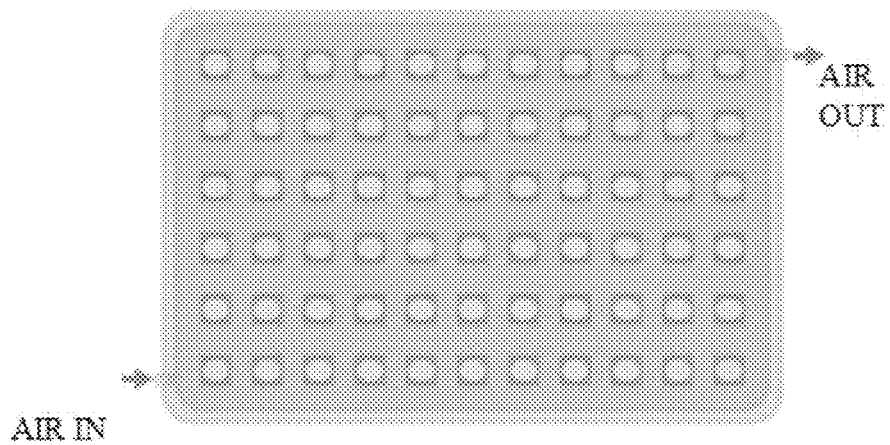
Figure 25V:
Figure 25W:
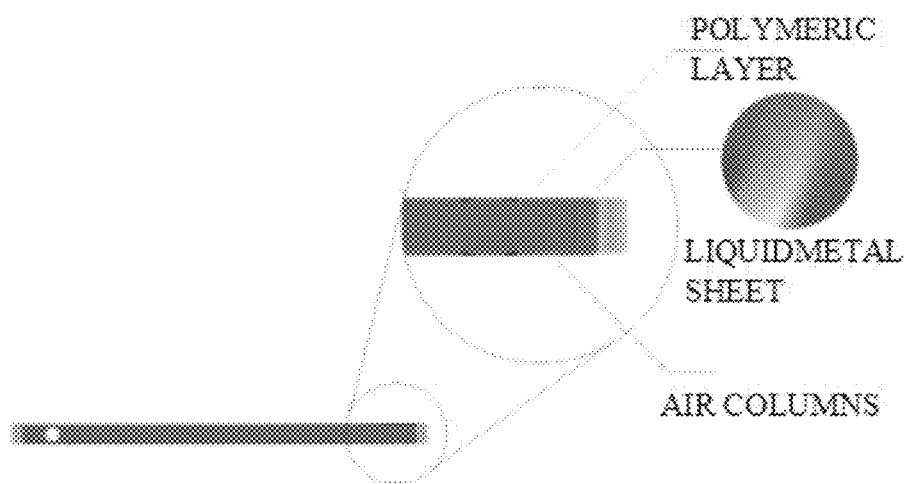
Figure 25X:
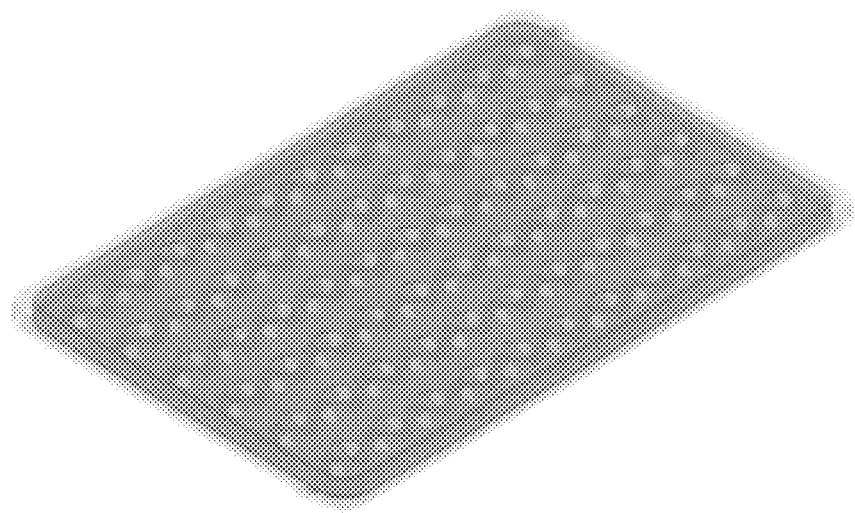
Figure 25Y:
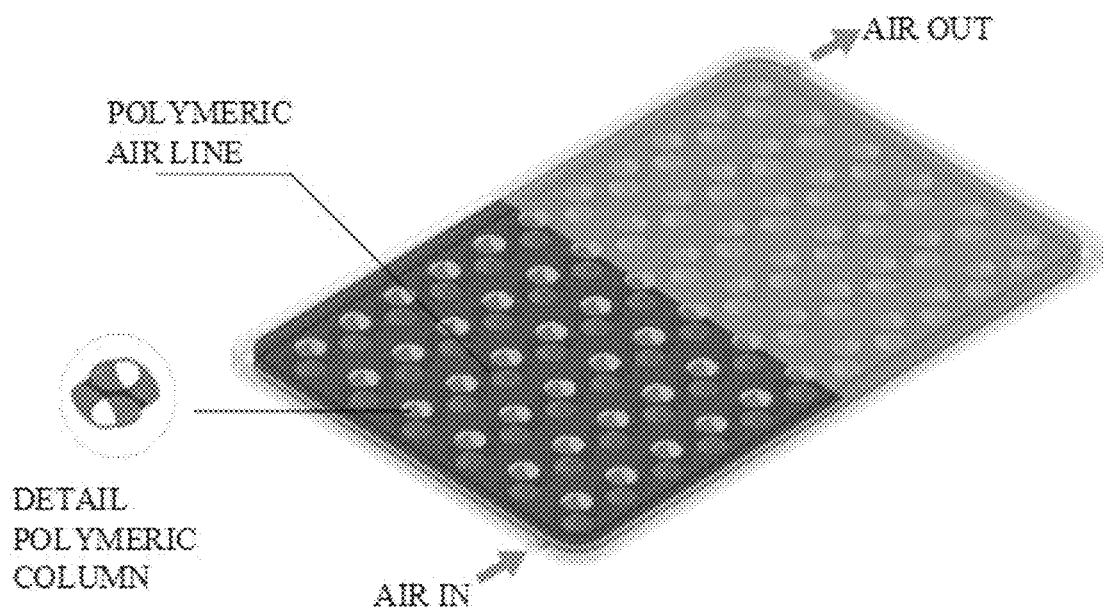

FIG. 25T-FIG. 25Y shows a foldable screen according to a fourth embodiment showing pockets of polymeric air lines. FIG. 25T shows a top view of the foldable screen; FIG. 25U shows a top view of air column arrangement in the foldable screen; FIG. 25V shows a front view of the foldable screen; FIG. 25W shows the side sectional view highlighting the layers of amorphous material and the air columns where one or more of the top and bottom layers comprise polymeric layer and amorphous material layer with air columns between the top layer and the bottom layer; FIG. 25X shows the perspective view of the foldable screen; and FIG. 25Y shows the hatch section perspective view of the foldable screen.

The selection of a specific polymeric air line depends on factors such as operating pressure, temperature range, chemical compatibility, and required flexibility.

Figure 26:
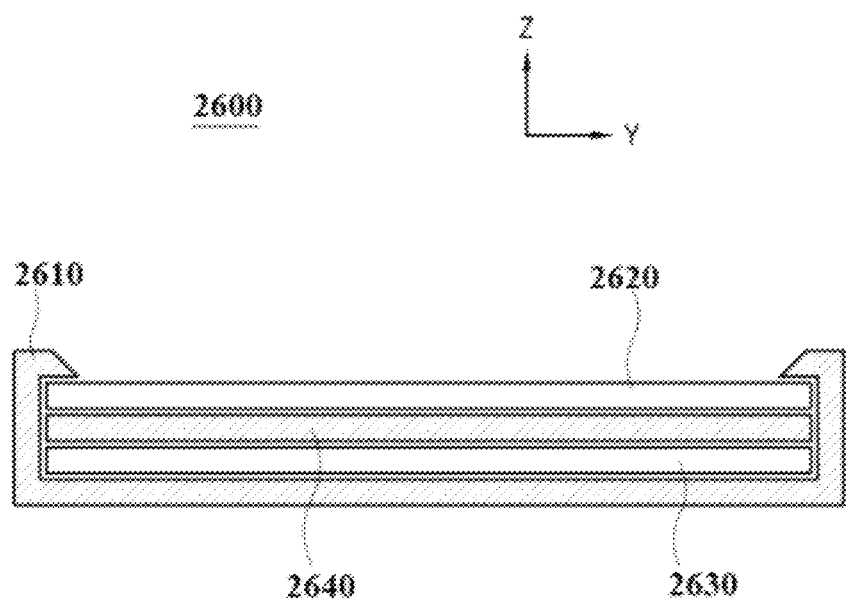
FIG. 26 shows a lateral cross-section view schematically illustrating the internal structure of the display apparatus according to an embodiment.

FIG. 26 shows a lateral cross-section view schematically illustrating the internal structure of the display apparatus according to an exemplary embodiment. As shown in FIG. 26, the display apparatus 2600, according to an embodiment, may include a housing 2610, a display panel 2620, an image processing board 2630, and a panel support member 2640 interposed between the display panel 2620 and the image processing board 2630. The housing 2610, the display panel 2620 and the image processing board 2630 are made bendable by having a flexible structure. The panel support member 2640 is placed behind or beneath the display panel 2620 and supports the display panel 2620. When a user touches the upper surface of the display panel 2620 in front of or on the display panel 2620, the panel support member 2640 prevents a touched area of the display panel 2620 from being recessed in the −Z direction. Further, the panel support member 2640 has a flexible structure so that the display apparatus 2600 can be bent in the Z direction, or the −Z direction. FIG. 11, FIG. 12, FIG. 19, and FIG. 20 as described herein provide the detailed panel support member 2640.

Figure 27:
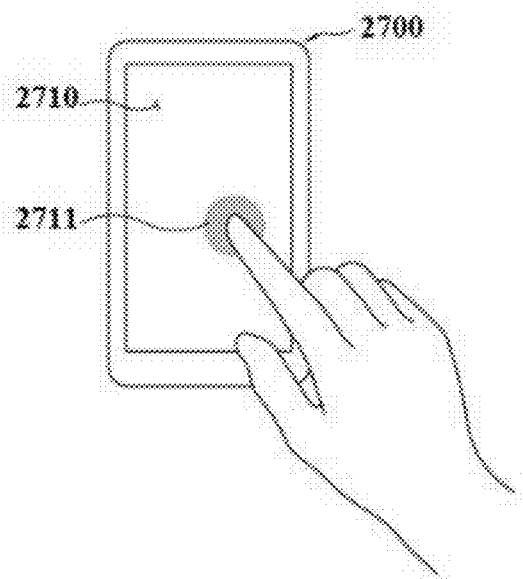
FIG. 27 illustrates a display panel touched in the display apparatus, having the flexible structure according to an embodiment.

FIG. 27 illustrates that a display panel touched in the display apparatus has a flexible structure, according to an embodiment. As shown in FIG. 27, the display apparatus 2700, according to an embodiment, is achieved by a mobile apparatus in which a touch screen is applied to a display panel 2710. When a user touches a surface of the display panel 2710, interaction with the display apparatus 2700 is performed. To make the display apparatus 2700 have the flexible structure according to the foregoing exemplary embodiments, elements, which constitute the display apparatus 2700, are also required to have the flexible structure. If a user touches the display panel 2710 for operations, the touched area 2711 is pressed and recessed inward, and an image in the corresponding area 2711 is contorted and distorted. To prevent this, a structure for supporting the back of the display panel 2710 is applied to the display apparatus 2700.

According to an embodiment, it is a display comprising a flexible display apparatus, wherein the flexible display apparatus comprises a plurality of layers wherein each layer is connected to at least one other layer at a predetermined position forming a connection, and wherein each layer of the plurality of layers comprises a rotational degree of freedom and glides relative to an adjacent layer of the plurality of layers about an axis of fold or roll when the display is folded or rolled.

According to an embodiment of the display, the display is operable to be a secondary display to an electronic device. According to an embodiment of the display, the display is operable to be an extension of an existing display to an electronic device. According to an embodiment of the display, the display is operable to be interconnected with a second display of similar nature to form a continuous display.

According to an embodiment of the display, the display is operable to be connected via a wireless connection or a wired connection.

According to an embodiment of the display, the display is operable for wireless charging. According to an embodiment of the display, the display is a touch sensitive display.

Amorphous Alloys: An alloy may refer to a solid solution of two or more metal elements (e.g., at least 2, 3, 4, 5, or more elements) or an intermetallic compound (including at least one metal element and at least one non-metal element). The term "element" herein may refer to an element that may be found in the Periodic Table. A metal may refer to any alkali metals, alkaline earth metals, transition metals, post-transition metals, lanthanides, actinides, and metalloids.

An amorphous alloy may refer to an alloy having an amorphous, non-crystalline atomic or microstructure. The amorphous structure may refer to a glassy structure with no observable long-range order; in some instances, an amorphous structure may exhibit some short range order. Thus, an amorphous alloy may sometimes be referred to as a "metallic glass." An amorphous alloy may refer to an alloy that is at least partially amorphous, including at least substantially amorphous, such as entirely amorphous, depending on the context. In one embodiment, an amorphous alloy may be an alloy of which at least about 50% is an amorphous phase—e.g., at least about 60%, about 70%, about 80%, about 90%, about 95%, about 99% or more. In one embodiment, an amorphous alloy may be an alloy of which at most about 50% is an amorphous phase—e.g., at most about 50%, about 40%, about 30%, about 20%, about 10%, about 5% or less than 5%. The percentage herein may refer to volume percent or weight percent, depending on the context. The term "phase" herein may refer to a physically distinctive form of a substance, such as microstructure. For example, a solid and a liquid are different phases. Similarly, an amorphous phase is different from a crystalline phase.

Amorphous alloys may contain a variety of metal elements and/or non-metal elements. In some embodiments, the amorphous alloys may comprise zirconium, titanium, iron, copper, nickel, gold, platinum, palladium, aluminum, or combinations thereof. In some embodiments, the amorphous alloys may be zirconium-based, titanium-based, iron-based, copper-based, nickel-based, gold-based, platinum-based, palladium-based, or aluminum-based. The term "M-based" when referred to an alloy may refer to an alloy comprising at least about 30% of the M element—e.g., about 40%, about 50%, about 60%, about 70%, about 80%, about 90%, about 95%, or more. The percentage herein may refer to volume percent or weight percent, depending on the context.

An amorphous alloy may be a bulk-solidifying amorphous alloy. A bulk-solidifying amorphous alloy, or bulk-amorphous alloy, or bulk metallic glass ("BMG"), may refer to an amorphous alloy that has at least one dimension in the millimeter range, which is substantially thicker than conventional amorphous alloys, which generally have a thickness of 0.02 mm. In one embodiment, this dimension may refer to the smallest dimension. Depending on the geometry, the dimension may refer to thickness, height, length, width, radius, and the like. In some embodiments, this smallest dimension may be at least about 0.5 mm—e.g., about 1 mm, about 2 mm, about 3 mm, about 4 mm, about 5 mm, about 6 mm, about 8 mm, about 10 mm, about 12 mm, or more. The magnitude of the largest dimension is not limited and may be in the millimeter range, centimeter range, or even meter range.

An amorphous alloy, including a bulk-amorphous alloy, described herein may have a critical cooling rate of about 500 K/sec or less, in contrast to that of 105 K/sec or more for conventional amorphous alloys. The term "critical cooling rate" herein may refer to the cooling rate below which an amorphous structure is not energetically favorable and thus is not likely to form during a fabrication process. In some embodiments, the critical cooling rate of the amorphous alloy described herein may be, for example, about 400 K/sec or less—e.g., about 300 K/sec or less, about 250 K/sec or less, about 200 K/sec or less. Some examples of bulk-solidifying amorphous alloys may be found in U.S. Pat. Nos. 5,288,344; 5,368,659; 5,618,359; and 5,735,975. In some embodiments wherein the desired diameter (or width, thickness, etc., depending on the geometry) is small, a higher cooler rate, such as one used in the conventional amorphous alloy fabrication process, may be used.

The amorphous alloy may have a variety of chemical compositions. In one embodiment, the amorphous alloy is a Zr-based alloy, such as a Zr—Ti based alloy, such as $(Zr, Ti)_a(Ni, Cu, Fe)_b(Be, Al, Si, B)_c$, where each of a, b, c, is independently a number representing atomic % and a is in the range of from 30 to 75, b is in the range of from 5 to 60, and c is in the range of from 0 to 50. Other incidental, inevitable minute amounts of impurities may also be present. In some embodiments, these alloys may accommodate substantial amounts of other transition metals, such as Nb, Cr, V, Co. A "substantial amount" in one embodiment may refer to about 5 atomic % or more—e.g., 10 atomic %, 20 atomic %, 30 atomic %, or more.

In one embodiment, an amorphous alloy herein may have the chemical formula $(Zr, Ti)_b(Ni, Cu)_b(Be)_c$, where each of a, b, c, is independently a number representing atomic % and a is in the range of from 40 to 75, b is in the range of from 5 to 50, and c is in the range of from 5 to 50. Other incidental, inevitable minute amounts of impurities may also be present. In another embodiment, the alloy may have a composition $(Zr, Ti)_b(Ni, Cu)_b(Be)_c$, where each of a, b, c, is independently a number representing atomic % and a is in the range of from 45 to 65, b is in the range of from 7.5 to 35, and c is in the range of from 10 to 37.5 in atomic percentages.

In another embodiment, the amorphous alloy described herein may have the chemical formula $(Zr)_a(Nb, Ti)_b(Ni, Cu)_c(Al)_d$, where each of a, b, c, d is independently a number representing atomic % and a is in the range of from 45 to 65, b is in the range of from 0 to 10, c is in the range of from 20 to 40, and d is in the range of from 7.5 to 15. Other incidental, inevitable minute amounts of impurities may also be present.

In some embodiments, the amorphous alloy may be a ferrous metal based alloy, such as a (Fe, Ni, Co) based compositions. Examples of such compositions are disclosed in U.S. Pat. No. 6,325,868 and in publications (A. Inoue et. al., Appl. Phys. Lett., Volume 71, p 464 (1997)), (Shen et. al., Mater. Trans., JIM, Volume 42, p 2136 (2001)), and Japanese patent application 2000126277 (Pub. #2001303218 A). For example, the alloy may be $Fe_{72}A_{15}Ga_2P_{11}C_6B_4$, or $Fe_{72}Al_7Zr_{10}Mo_5W_2B_{15}$.

Amorphous alloys, including bulk-solidifying amorphous alloys, may have high strength and high hardness. The strength may refer to tensile or compressive strength, depending on the context. For example, Zr and Ti-based amorphous alloys may have tensile yield strengths of about 250 ksi or higher, hardness values of about 450 Vickers or higher, or both. In some embodiments, the tensile yield strength may be about 300 ksi or higher—e.g., at least about 400 ksi, about 500 ksi, about 600 ksi, about 800 ksi, or higher. In some embodiments, the hardness value may be at least about 500 Vickers—e.g., at least about 550, about 600, about 700, about 800, about 900 Vickers, or higher.

In one embodiment, ferrous metal based amorphous alloys, including the ferrous metal based bulk-solidifying amorphous alloys, can have tensile yield strengths of about 500 ksi or higher and hardness values of about 1000 Vickers or higher. In some embodiments, the tensile yield strength may be about 550 ksi or higher—e.g., at least about 600 ksi, about 700 ksi, about 800 ksi, about 900 ksi, or higher. In some embodiments, the hardness value may be at least about 1000 Vickers—e.g., at least about 1100 Vickers, about 1200 Vickers, about 1400 Vickers, about 1500 Vickers, about 1600 Vickers, or higher.

As such, any of the afore-described amorphous alloys may have a desirable strength-to-weight ratio. Furthermore, amorphous alloys, particularly the Zr- or Ti-based alloys, may exhibit good corrosion resistance and environmental durability. The corrosion herein may refer to chemical corrosion, stress corrosion, or a combination thereof.

The amorphous alloys, including bulk-amorphous alloys, described herein may have a high elastic strain limit of at least about 0.5%, including at least about 1%, about 1.2%, about 1.5%, about 1.6%, about 1.8%, about 2%, or more—this value is much higher than any other metal alloy known to date. In an embodiment, at least a layer may comprise amorphous alloy.

In some embodiments, the amorphous alloys, including bulk-amorphous alloys, may additionally include some crystalline materials, such as crystalline alloys. The crystalline material may have the same or different chemistry from the amorphous alloy. For example, in the case wherein the crystalline alloy and the amorphous alloy have the same chemical composition, they may differ from each other only with respect to the microstructure.

In some embodiments, crystalline precipitates in amorphous alloys may have an undesirable effect on the properties of amorphous alloys, especially on the toughness and strength of these alloys, and as such it is generally preferred to minimize the volume fraction of these precipitates. However, there may be cases in which ductile crystalline phases precipitate in-situ during the processing of amorphous alloys, which may be beneficial to the properties of amorphous alloys, especially to the toughness and ductility of the alloys. One exemplary case is disclosed in C. C. Hays et. al, Physical Review Letters, Vol. 84, p 2901, 2000. In at least one embodiment herein, the crystalline precipitates may comprise a metal or an alloy, wherein the alloy may have a composition that is the same as the composition of the amorphous alloy or a composition that is different from the composition of the amorphous alloy. Such amorphous alloys comprising these beneficial crystalline precipitates may be employed in at least one embodiment described herein.

A particular advantage of bulk-solidifying amorphous alloys is their stability in the supercooled liquid region, defined as the viscous liquid regime above the glass transition temperature in one embodiment. The stability of this viscous liquid regime may be generally measured with $\Delta T$, which in one embodiment herein refers to the difference between the onset of crystallization temperature, Tx, and the onset of glass transition temperature, Tg, as determined from standard Differential Scanning calorimetry ("DSC") measurements at conventional heating rates (e.g. 20° C./min). In some embodiments, the bulk-solidifying amorphous alloys may have $\Delta T$ of at least about 30° C.—e.g., at least about 50° C., about 60° C., about 70° C., about 80° C., about 90° C., or more.

According to an embodiment of the flexible display apparatus, the amorphous material comprises an amorphous alloy that has an elastic limit of at least 1.5% strain selected from (Zr,Ti)a(Ni,Cu,Fe)b(Be,Al,Si,B)c wherein a=30-75; b=5-60 & c=0-50 atomic percentages; (Zr,Ti)a(Ni,Cu)b (Be)c wherein a=40-75; b=5-50; & c=5-50 in atomic percentages; (Zr,Ti)a(Ni,Cu)b(Be)c wherein a=40-65; b=7.5-35; & c=10-37.5 in atomic percentages; and (Zr)a(Nb,Ti)b (Ni,Cu)c(Al)d wherein a=45-65; b=0-10; c=20-40; & d=7.5-15.

Though bulk-solidifying amorphous chemistries are considered, in order to leverage multiple layers of thin amorphous sheets, Fe based ribbons and Silica based sheets may be considered to form the spring structure.

According to an embodiment of the flexible display apparatus, the amorphous alloy comprises a Zr-based, a Ti-based, a Zr—Ti-based, an Fe-based, or combinations thereof, amorphous alloy.

According to an embodiment of the flexible display apparatus, the amorphous alloy is at least substantially free of Be. According to an embodiment of the flexible display apparatus, the amorphous alloy further comprises a plurality of crystalline precipitates.

According to an embodiment of the flexible display apparatus, at least one of the plurality of layers comprises a plurality of structural components comprising wires, strips, fibers, ribbons, or combinations thereof, wherein the plurality of structural components is configured to provide structural stability and rigidity to maintain a flat shape of the display after multiple folding and unfolding or rolling and unrolling of the display. According to an embodiment of the flexible display apparatus, the plurality of the structural components comprises a series of horizontally aligned strips. According to an embodiment of the flexible display apparatus, the plurality of the structural components comprises a mesh of horizontally and longitudinally aligned fibers. According to an embodiment of the flexible display apparatus, at least one of the plurality of the structural components comprises (i) fibers having a diameter of between about 0.01 mm and about 0.5 mm, or (ii) ribbons having a thickness of about 0.023 mm and a width of between about 2 mm and about 213 mm.

Amorphous ribbons: Amorphous ribbons, also known as metallic glass ribbons or metallic glass foils, are unique materials with a non-crystalline, amorphous atomic structure. Amorphous ribbons are typically thin and flat, with widths ranging from a fraction of a millimeter (e.g., around 0.025 mm or 25 micrometers) to several millimeters. Their thickness can vary but is often in the range of tens to hundreds of micrometers. The length of amorphous ribbons can be quite long, often wound onto spools or rolls and can be cut to any desired length. Amorphous ribbons are typically made from alloys of various metallic elements. Common elements used in the composition of metallic glasses include transition metal elements like iron (Fe), nickel (Ni), and cobalt (Co) are often used as primary constituents. Metalloid elements like boron (B) and silicon (Si) are added to the alloy to disrupt the formation of a crystalline structure and promote the amorphous state, and small amounts of other elements, such as phosphorus (P), carbon (C), or chromium (Cr), may be included to fine-tune the properties of the alloy.

The specific composition of amorphous ribbons can vary depending on the desired properties and intended applications. Amorphous ribbons are produced through a rapid solidification process called melt spinning, where molten metal is rapidly quenched onto a rotating cooled wheel, preventing the formation of a crystalline structure. This rapid cooling results in the amorphous atomic arrangement characteristic of metallic glasses. The thin and flat shape of the ribbons makes them conducive to applications where a combination of unique properties, such as high strength, magnetic characteristics, or corrosion resistance, is needed.

Foldable Display Structure (FDS): One aspect of the embodiments described herein provides a foldable display structure ("FDS") comprising amorphous alloys, and methods of making near-net shape foldable display structures from amorphous alloys. Due at least in part to the amorphous alloys, the FDS described herein may have characteristics that are both enabling and much improved over pre-existing display structures. The surprising advantages of foldable display structures comprising amorphous alloys, particularly bulk-solidifying amorphous alloys, will be described in various embodiments below.

One embodiment provides FDS comprising amorphous alloys, the amorphous alloys providing form and shape durability combined with high flexibility, high resistance to chemical and environmental effects, and low-cost near-net shape fabrication for intricate design and shapes. Another embodiment provides a method of making foldable display structures from such amorphous alloys in near-net shape. The amorphous alloys may be bulk-solidifying amorphous alloys.

Provided in one embodiment is a structure, the structure containing a display, and at least one structural component disposed over a portion of the display. The display may contain at least one organic material, including an OLED. In one embodiment, the display need not contain an organic material. In general, any flexible display material may be used. The display, or a portion thereof, may be foldable. In some embodiments, the entire structure is foldable. In one embodiment, the structure may be, or may comprise, a foldable display and, optionally, structural components. In one embodiment the structure comprises a display and at least one structural component.

At least one structural component may contain at least one amorphous alloy. In one embodiment, at least one structural component comprises essentially of an amorphous alloy. In another embodiment, at least one structural component comprises an amorphous alloy. The amorphous alloy may be any of the aforementioned amorphous alloys, with any of the aforementioned properties. In one embodiment, the amorphous alloy may be a bulk-solidifying amorphous alloy.

The combination of high strength and high strength-to-weight ratio of the bulk-solidifying amorphous alloys in one embodiment may significantly reduce the overall weight and bulkiness of foldable display structures, thereby allowing for the reduction of the thickness of these display structures while maintaining structural integrity and high flexibility. Furthermore, as described above, amorphous alloys, including bulk-solidifying amorphous alloys, have high elastic strain limits. This property is important for the use and application of foldable display structures; specifically, a high elastic strain limit may allow the display structure to be thin and highly flexible. Additionally, a high elastic strain limit also may allow the foldable display structures described herein to sustain loading and/or flexing without permanent deformation or destruction and enable them to fold (and roll) into compact shapes for multiple use and opening and closure. The term "folding" herein may include "rolling" to refer to compacting a material. Due at least in part to the high elasticity, the foldable display described herein after multiple folding and unfolding of the structural component, may remain at least substantially flat, such as completely flat. In one embodiment, the foldable display may remain at least substantially at the same level of flatness after multiple folding and unfolding as before it was folded for the first time.

In addition, due at least in part to the amorphous alloy, the foldable display structures described herein may exhibit resistance to corrosion (e.g., chemical corrosion, stress corrosion, etc.) and high inertness. The high corrosion resistance and inertness of the amorphous alloy in the structural component may be useful for preventing foldable display structures from getting decayed via environmental effects. Finally, the afore-described properties, in combination with the high strength, high hardness, high elasticity and corrosion resistance properties, may provide a foldable display structure that is durable and resistant to wear and scratch during normal use.

The foldable display structures, including the display and the structural component(s), described herein may have any geometry, including size or shape. The structure may have a symmetrical shape or an asymmetrical shape. In a plane view, the foldable display structures may be a square, rectangle, circle, elliptical, a polygon, or an irregular shape. In contrast to a frame or a housing, the structural component in many embodiments described herein does not cover an entire surface of the display. The structural component(s) may also have a variety of geometries, depending at least in part on the geometry of the foldable display. For example, the structural component may comprise wires, strips, fibers, ribbons, or combinations thereof. These wires, strips, fibers, ribbons, etc., may be disposed over (or directly on) a portion of the display in parallel to each other (or almost parallel to each other) or they may intersect one another to form a mesh. In one embodiment, the portion of the display that is foldable corresponds to the portion of the display disposed over (or directly on) at least one structural component. The structural component may be joined to the display by any technique. In one embodiment, the structural component is joined to the display by a polymer, such as an epoxy glue or any other material that may bond the structural component to the display.

The display structure described herein may have multiple layers. In one embodiment, the structural component comprising an amorphous alloy may be disposed over a substrate layer, which in turn may be disposed over the display. The structural component may be sandwiched between the display and the substrate or may be over (or directly on) the substrate that is over (or directly on) the display.

Figure 28:
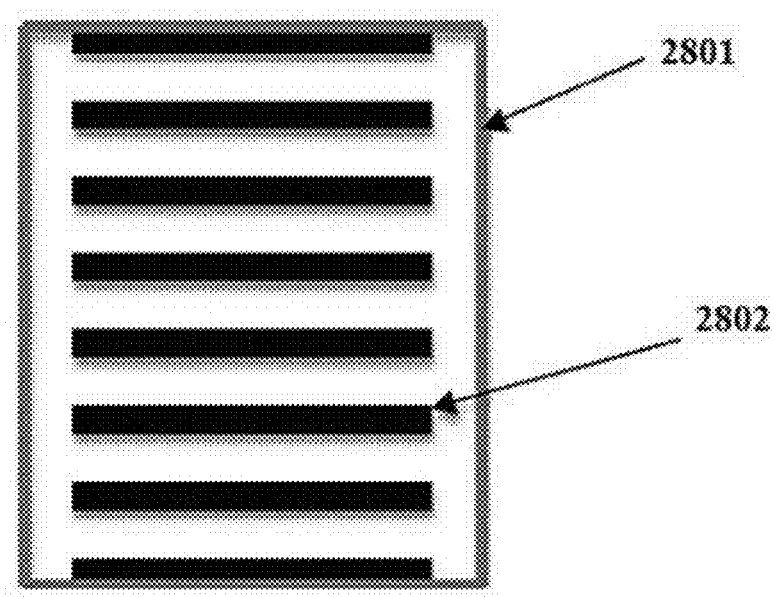
FIG. 28 shows a schematic of a first example foldable display structure according to an embodiment.

The structural components may have any suitable dimensions, depending on the application. FIG. 28 shows a schematic of an exemplary foldable display structure comprising a display 2801 and a structural component comprising a series of horizontally aligned strips/ribbons 2802 comprising an amorphous alloy (e.g., amorphous alloy strips or ribbons). FIG. 11, FIG. 12, along with FIG. 19, and FIG. 20 as described herein provide the structure comprising multiple layers for each of horizontally aligned strips/ribbons 2802. The strips may have a thickness of between about 1 µm and 2.0 mm—e.g., between about 0.001 mm and about 1.5 mm, between about 0.2 mm and about 1.0 mm, between about 0.4 mm and about 0.8 mm, between about 0.5 mm and about 0.6 mm. Other ranges are also possible. The strips may have a width of between about 0.5 and about 250.0 mm—e.g. between about 0.5 mm and about 15 mm, between about 2.0 mm and about 10 mm, between about 4.0 mm and about 8.0 mm, between about 5.0 mm and about 6.0 mm. Other ranges are also possible. The length of the strips may vary, depending at least in part on the geometry of the display disposed over (or directly on) the structural component. The strips may be extended to the edge of the display or extended further outward of the edge of the display. In this embodiment, the display may be folded (including being rolled) in a segmented manner, with the strips providing certain rigidity along the display. In a preferred embodiment the strips are bonded to an OLED display with various joining methods such as using epoxy glue.

Figure 29:
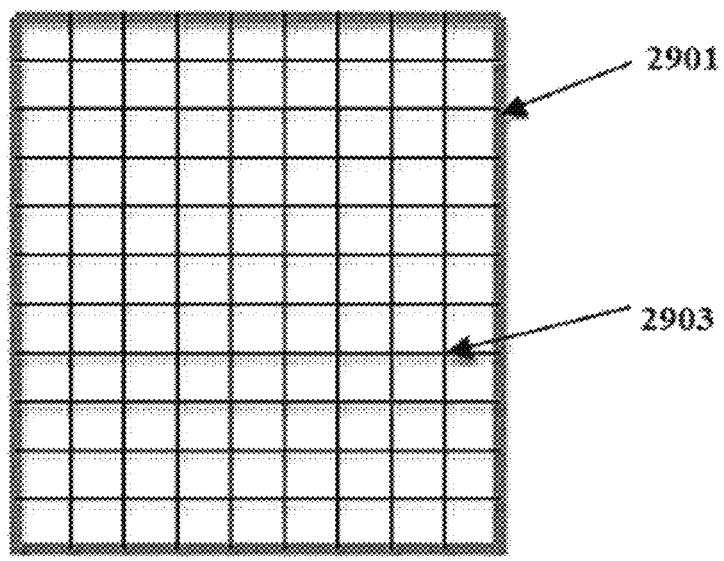
FIG. 29 shows a schematic of a second example foldable display structure according to an embodiment.

FIG. 29 shows a schematic of an exemplary foldable display structure comprising a display and a structural component comprising a mesh of horizontally and longitudinally aligned fibers/ribbons 2903 comprising an amorphous alloy (e.g., amorphous alloy strips or ribbons). FIG. 11 and FIG. 12 along with FIG. 19 and FIG. 20 as described herein provide the structure comprising multiple layers for each of horizontally and longitudinally aligned fibers/ribbons 2901 and 2903. The fibers may have a diameter of between about 0.01 mm and 2.0 mm—e.g., between about 0.02 mm and about 1.5 mm, between about 0.03 mm and about 1.0 mm, between about 0.05 mm and about 0.5 mm, between about 0.1 mm and about 0.4 mm, between about 0.2 mm and about 0.3 mm. Other ranges are also possible. The mesh network may be extended to the edge of the display or may be extended further outward of the edge of the display. In this embodiment, the display can be folded in a continuous manner, wherein the fiber mesh provides flexibility for rolling and rigidity and flatness upon opening of the display. In one embodiment the fiber mesh is bonded to the display with various joining methods such as using epoxy glue.

Figure 30:
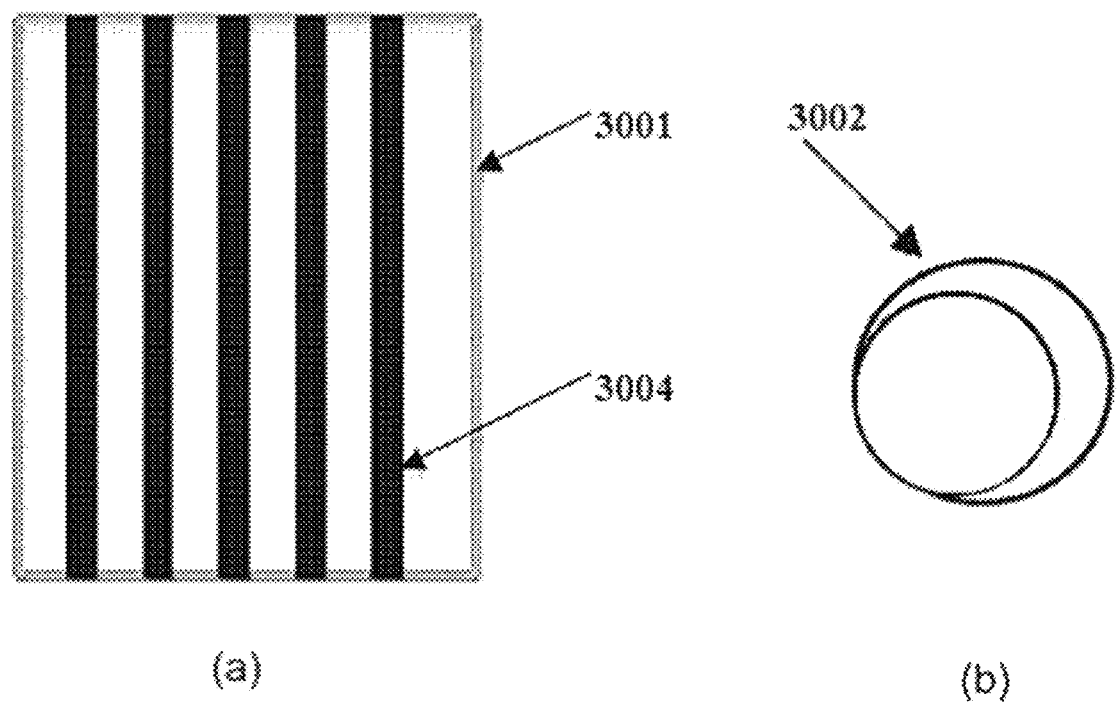
FIG. 30 shows a schematic of a third example foldable display structure according to an embodiment.

FIG. 30 (*a*) shows a schematic of an exemplary foldable display structure comprising a display 3001 and a structural component comprising a set of longitudinally aligned ribbons 3004 comprising an amorphous alloy (e.g., bulk-solidifying amorphous alloy or amorphous ribbons). FIG. 11 and FIG. 12 along with FIG. 19 and FIG. 20 as described herein provide the structure comprising multiple layers for each of longitudinally aligned ribbons 3004. The ribbons may have a thickness of between about 1 μm and 2.0 mm—e.g., between about 0.02 mm and about 1.5 mm, between about 0.03 mm and about 1.0 mm, between about 0.05 mm and about 0.5 mm, between about 0.1 mm and about 0.4 mm, between about 0.2 mm and about 0.3 mm. The ribbons may have a width of between about 0.5 and about 20.0 mm—e.g. between about 1.0 mm and about 15 mm, between about 2.0 mm and about 10 mm, between about 4.0 mm and about 8.0 mm, between about 5.0 mm and about 6.0 mm. The ribbons may be extended to the edge of the display or may be extended further outward of the edge of the display. In this embodiment, the display may be folded in a continuous manner, wherein the ribbons may provide flexibility for rolling and rigidity and flatness upon opening of the display. In one embodiment the ribbon mesh is bonded to the display with various joining methods such as using epoxy glue.

In some embodiments described herein, the terms "ribbons" and "fibers" refer to highly flexible components, each of which may be folded (as shown in 3002 in FIG. 30 (*b*)) into a diameter in the range of about 10 mm to about 100 mm (e.g., about 20 mm to about 80 mm, about 40 mm to about 60 mm), whereas the terms "strips" and "wires" refer to relatively rigid components, each of which can be folded into a diameter larger than 30 mm (e.g., larger than 40 mm, 50 mm, 60 mm, or larger).

Due at least in part to the desired properties as described above, the FDS described herein may be employed as a component of a variety of devices, including an electronic device. An electronic device herein may refer to a mobile phone, smart phone, PDA, computer (e.g., laptop, desktop, tablet computer, etc.), television, and various wall-mountable displays. A device may contain a plurality of the FDSs described herein. In one embodiment, multiple FDSs may be joined together to form one large display. For example, FDS of a small size (e.g., smaller than a pre-existing personal reader or tablet computer) may function as secondary displays off one device (e.g., smartphone). In one embodiment wherein the FDSs are a part of a smartphone, one FDS may be used to perform navigation function while another to read email, and at the same time the smart phone may be used for talking—this may be done with one data plan as well. In another embodiment, at home or in office, one "connected" device may be used to drive multiple FDSs, some as TVs, some as computers, and some as communication devices simultaneously, sequentially, or both. In at least one embodiment, the display structures described herein are more desirable due to their extreme light weight, flexibility and being less prone to breakage, in comparison to the pre-existing glass-based displays such as LCD (Liquid Crystal Displays).

Method of Making: Another aspect of the embodiments described herein provides a method of making a foldable display structure, such as one in near-net shape form, in which a display structure comprises a display comprising an organic material and at least one structural component comprising at least one amorphous alloy. The display and the structural component may be any of those described above.

One embodiment provides a method of making a foldable display structure, the method comprising: providing a feedstock of amorphous alloy being substantially amorphous and having an elastic strain limit of about 1.5% or greater and a ΔT of 30° C. or greater; heating the feedstock to around the glass transition temperature; shaping the heated feedstock into the desired near-net shape of foldable display structure; and cooling the formed part to temperatures far below the glass transition temperature. As described above, ΔT refers to the difference between the onset of crystallization temperature, Tx, and the onset of glass transition temperature, Tg, In one embodiment, a temperature around glass transition refers to a temperature that can be below glass transition, at or around glass transition, and above glass transition temperature, but always at a temperature below the crystallization temperature Tx. The cooling step may be carried out at rates similar to the heating rates at the heating step. Alternatively, the cooling step may be carried out at rates greater than the heating rates at the heating step. The cooling step may also be achieved while the forming and shaping are maintained.

One embodiment provides a method of making a foldable display structure, the method comprising: providing a homogeneous alloy ingot (not necessarily fully or partially amorphous); heating the feedstock to a casting temperature above the melting temperatures; introducing the molten alloy into the die cavity having the near-net shape of foldable display structures and quenching the molten alloy to temperatures below glass transition.

One embodiment provides a method of making a foldable display structure, the method comprises assembling a display with at least one structural component. The assembling may involve disposing and/or joining at least one structural component over a portion of the display. As described above, the joining may involve gluing together (e.g. with epoxy glue) the display and at least one structural component. One advantage of the methods described herein is that the assembling of the components of the foldable display structure may involve no (or minimal) use of fasteners.

In one embodiment wherein the display structures provided herein have a substrate and a display, the structural component may be disposed over (or directly on) the substrate during production of the substrate. The substrate may contain any material, including those used in pre-existing displays, such as plastics, glass, etc. Because an amorphous alloy (of the structural component) may withstand higher temperatures than most plastics and synthetic substrate material, synthetic material may be poured over the structural component to form an intimate bond. The bond may be chemical, physical, or both. An intimate bond may refer to a bond that has very little observable gap between the bonded components, and in some instances, as a result, the components may not separate easily. Alternatively, structural component(s) may be provided between two sticky substrate materials so that all of these may be bonded.

At least one structural component may be made by a method comprising: heating a feedstock comprising an alloy that is at least substantially amorphous to a first temperature that is greater than or equal to a glass transition temperature (Tg) of the alloy; forming the heated feedstock into a preform; and cooling the preform to a second temperature lower than the Tg to form at least one structural component.

The feedstock may comprise an alloy that is at least partially, such as at least substantially, such as completely, amorphous. The method may further include a method of making an alloy feedstock. The method of making an alloy feedstock may include heating at least one ingot comprising an alloy that is at least partially not amorphous to a third temperature that is higher than or equal to a melting temperature (Tm) of the alloy; and cooling the heated ingot at a rate that is sufficient to form the feedstock comprising an alloy that is at least substantially amorphous. The ingot may comprise a mixture of elements to be alloyed to form the feedstock. The ingot may be homogeneous (although it need not be) with respect to the chemical composition of the elements of the alloy mixture but may not be of an amorphous phase. The cooling rate during the making of the feedstock may be fast enough to bypass the crystallization formation region in the Time-Temperature-Transformation (TTT) diagram to avoid formation of a crystalline phase, thereby forming a feedstock that is at least partially amorphous.

In one embodiment, during the process of making a foldable display structure, the heated feedstock is formed into a preform before the preform is cooled to form the final structural component of the display structure. The forming may include, for example, shaping the preform into a desired shape. This process may involve any techniques known in the art. For example, this may involve die casting, involving introducing the feedstock into a cavity of a die to form a preform. In some embodiments, the forming may involve shaping the feedstock into the preform with pressure. The pressure may be mechanical pressure, for example by hand, tool, or air pressure. The preform may be near-net shape of the structural component. In other words, no (or minimal) additional processing would be needed to shape the preform into the desired shape of the structural component. In some embodiments, certain post-processing, such as certain surface treatments, may be employed. For example, surface treatment may be employed to remove oxides from the surface. Chemical etching (with or without masks), as well as light buffing and polishing operations, may also be employed to improve the surface finish.

The near-net shape of the structural component of the display structures during the processes described herein is one distinguishing feature compared to the pre-existing process. Specifically, the preferred material of the pre-existing process, which employs shape-memory Ti—Ni alloys and/or spring steels, may only be produced in very limited shapes and forms, such as wires and flat strips, because of the difficulty thereof to produce near-net shaped products. By contrast, the near-net shape forming ability of amorphous alloys, particularly bulk-solidifying amorphous alloy, of the processes described herein allow fabrication of intricate foldable display structures with high precision and reduced processing steps. Additionally, this may also allow minimal use of bending and welding, which can reduce the structural performance and increase manufacturing costs and aesthetic defects. In one embodiment, producing foldable display structures in near-net shape form may significantly reduce the manufacturing costs while still forming foldable display structures with intricate features, such as precision curves, and a high surface finish on aesthetically sensitive areas. Also, not to be bound by any particular theory, but (bulk-solidifying) amorphous alloys retain their fluidity from above the melting temperature down to the glass transition temperature due to the lack of a first order phase transition. This is distinguishable from conventional crystalline metals and alloys, or even certain amorphous alloys in some instances. Because amorphous alloys retain their fluidity, they do not accumulate significant stress from their casting temperatures down to below the glass transition temperature. Thus, dimensional distortions from thermal stress gradients can be minimized.

Exemplary Embodiments: In one embodiment, the foldable display structure comprises at least one part made of bulk-solidifying amorphous alloy or amorphous alloy ribbons.

In another embodiment, the foldable display structure comprises longitudinally aligned ribbons or fibers substantially made of bulk-solidifying amorphous alloy or amorphous ribbons and is attached to the back (substrate side) of the OLED display.

In another embodiment, the foldable display structure comprises horizontally aligned ribbons or fibers substantially made of bulk-solidifying amorphous alloy or amorphous ribbons and is attached to the back of the OLED display.

In still another embodiment, the foldable display structure comprises a mesh of ribbons or fibers substantially made of bulk-solidifying amorphous alloy or amorphous ribbons and is attached to the back of the OLED display.

In still another embodiment, the foldable display structure comprises a set of ribbons or fibers substantially made of bulk-solidifying amorphous alloy or amorphous ribbons and joined to the back of the OLED display.

In still another embodiment, the foldable display structure comprises diagonally crossing of rigid strips or wires substantially made of bulk-solidifying amorphous alloy or amorphous ribbons and is attached to the back of the OLED display.

In one embodiment, the foldable display structure is at least partially made of a Zr—Ti base bulk-solidifying amorphous alloy or amorphous ribbons.

In another embodiment, the bulk-solidifying amorphous alloy or amorphous ribbons in the foldable display structure is Be free.

In another embodiment, the foldable display structure is at least partially made of a Zr/Ti base bulk-solidifying amorphous alloy or amorphous ribbons with in-situ ductile crystalline precipitates.

In another embodiment, a molten piece of bulk-solidifying amorphous alloy or amorphous ribbons is cast into a near-net shape manufactured foldable display structure.

In another embodiment, a stock feed of bulk-solidifying amorphous alloy or amorphous ribbons is molded into a near-net shape manufactured foldable display structure.

In another embodiment, at least part of a near-net shape manufactured foldable display structure is formed by casting or molding the bulk-solidifying amorphous alloy.

In another embodiment, the near-net shape manufactured foldable display structure is a near-net shape molding component.

In another embodiment, the near-net shape manufactured Foldable display structure is a near-net shape cast component.

One embodiment provides a method of fabricating a near-net shape manufactured foldable display structure comprising the following steps: providing a feedstock of molten alloy at above Tm; introducing the molten alloy to a die cavity having the near-net shape of a foldable display Structure; quenching and taking the part out of the die cavity; and final finishing.

Another embodiment provides a method of fabricating a near-net shape manufactured foldable display structure comprising the following steps: providing a feedstock of alloy that is at least partially amorphous; heating the feedstock to above Tg but below Tx, shaping the heated feedstock into desired near-net shape foldable display structure; cooling; and final finishing.

Another embodiment provides a foldable display structure comprising bulk-solidifying amorphous alloys or amorphous ribbons.

Another embodiment provides a method of making a foldable display structure in a near-net shape form comprising bulk-solidifying amorphous alloys or amorphous ribbons.

Another embodiment provides a foldable display structure having a structure substantially made of bulk-solidifying amorphous alloys or amorphous ribbons, wherein the structural components are secured without the use of fasteners.

According to an embodiment, it is a method for manufacturing comprising: selecting number of layers to form a plurality of layers based on a predetermined thickness of a flexible display apparatus; selecting thicknesses of each of the layers of the plurality of layers; selecting material for each layer such that an elastic limit of the material is at least 1.5% strain; positioning the layers in a desired configuration; and securely connecting the layers such that each layer is connected to at least one other layer at a predetermined position forming a connection; and wherein the flexible display apparatus is part of a display of an electronic device; and wherein each layer of the plurality of layers comprises a rotational degree of freedom and glides relative to an adjacent layer of the plurality of layers about an axis of fold or roll when the display is folded or rolled.

According to an embodiment of the method for manufacturing, the connection is a rigid connection point. According to an embodiment of the method for manufacturing, the connection comprises a mechanical joint comprising one of a spot welding, a fastening joint, and a rivet. According to an embodiment of the method for manufacturing, the connection comprises a mechanical joint comprising a telescopic sliding joint.

U.S. Patent Publication Number U.S. Ser. No. 11/183, 651B2, titled "Electronic apparatus", which is herein incorporated in its entirety, attempts to provide an electronic device having improved reliability against stress caused by bending. The electronic apparatus EA includes a first member MB1, a second member MB2, a third member MB3, a first adhesive member AM1, and a second adhesive member AM2.

U.S. Patent Publication Number U.S. Pat. No. 9,029, 846B2 titled "Display apparatus having improved bending properties and method of manufacturing same" which is incorporated herein in its entirety, attempts for a display apparatus having improved bending properties, wherein the display apparatus disclosed includes: a display module including a flexible substrate, a display panel, and an encapsulation film; a lower module disposed below the display module; an upper module disposed on the display module; and an elasticity-adjusting layer, which includes an adhesive material, disposed on or below the display module to adjust a position of a neutral plane in bending of the display apparatus, wherein an elastic modulus of the elasticity-adjusting layer is less than that of at least one of the display module, the lower module, or the upper module, so as to position the neutral plane within or proximate to the display module.

In the above prior art, attempts have been made for reducing bending stress in foldable displays by having an adhesive layer between the layers. Having an adhesive layer between the layers binds the layers together and still moves them together as a single solid piece when a force is applied. Apart from the supporting structure which is explained in the current disclosure, the electronics and controls and enclosures for display screens remain similar in nature and operation as that of the prior art patents.

Figure 31:
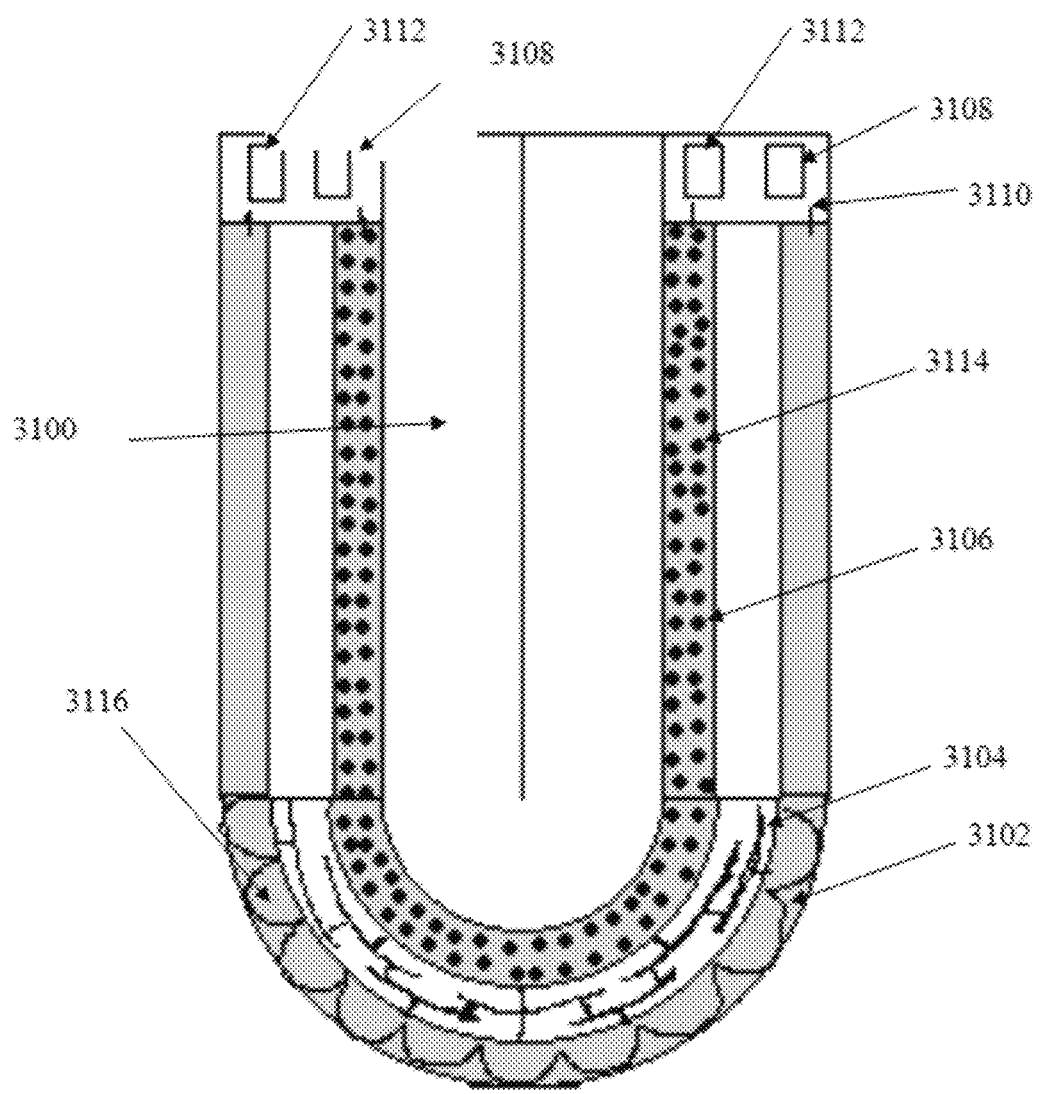
FIG. 31 shows a support structure for a flexible display according to an embodiment.

FIG. 31 shows a support structure for an inward folded flexible display according to an embodiment. The support structure includes a first layer 3106, a second layer 3104, and a third layer 3102 to support a flexible display 3100 to realize folding or unfolding. The display assembly may also be a bendable assembly or a rollable assembly, so as to drive the flexible display module to bend or roll. According to an embodiment, the support structure comprises one or more supporting layers and may include two supporting layers, or at least two supporting layers, or may include three or four layers, and may include more than two supporting layers. According to an embodiment, the thickness of each supporting layer may be about 0.01 mm-0.15 mm.

According to an embodiment, the thickness of each supporting layer and the number of supporting layers may be selected according to the thickness requirement of the actual support and the processing technology level of the supporting layers and other factors. In some embodiments, the pneumatic layers which are the third layer 3102 and the first layer 3106 include multiple pockets, or tubes arranged in an array. Further an amorphous layer, which is the second layer 3104 may have a structure as detailed in FIG. 19 and FIG. 20 and may be used at the hinge or bendable area where a plain amorphous sheet may be used at flat portions as shown in the FIG. 31. Each pneumatic layer may be of different size and may comprise different pocket shapes, for example, as shown in 3114 and 3116, and may be of different sizes. Further arrangement of the layers may be in any order depending on the support requirements for the touch screen. In an embodiment, a high-pressure pneumatic layer may be supported with an amorphous layer followed by a low-pressure pneumatic layer. In another embodiment, there could be only a high-pressure pneumatic layer. In another embodiment, there could be only a low-pressure pneumatic layer. In an embodiment, there could be any combination and repetition of the layers. In an embodiment, an amorphous layer may be absent.

Further, the air may be introduced into pneumatic layers using valves 3110. There may further be pneumatic system 3108 that may be controlled by a processing and controlling unit 3112 as per the requirement of the support required for the operation. Further, the pneumatic system and the processing and controlling unit may be operated via a battery. If the screen/display is in folded configuration the air may be deflated/released from the pneumatic layers and when the screen is in open configuration, air may be pumped in using the pneumatic system 3108 connected to valves 3110. In an embodiment, instead of air any other fluid may be used. In an embodiment, the processor would dynamically increase or decrease the pressure of the pneumatic layers depending on the touch screen usage and requirement.

Figure 32:
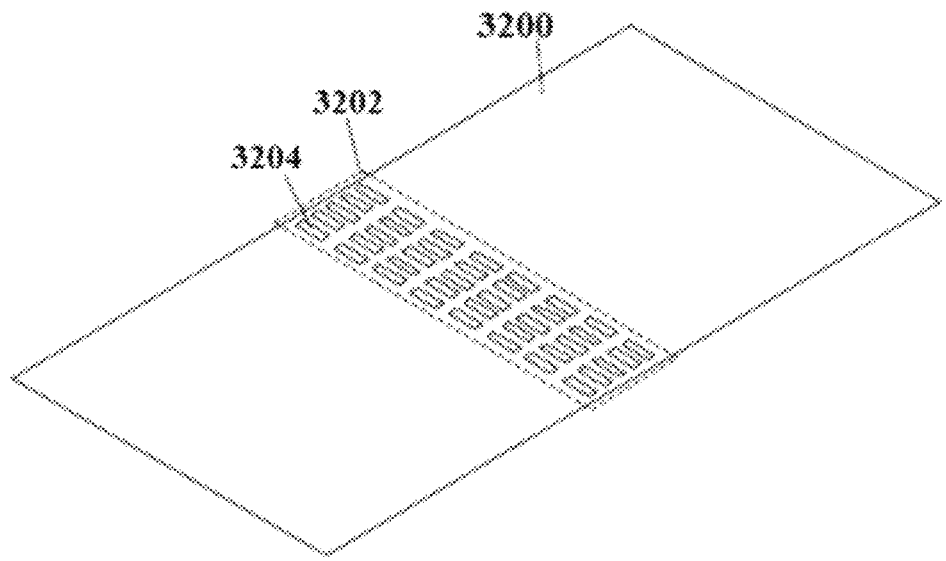
FIG. 32 shows a support structure for a roll up display according to an embodiment.
Figure 33:
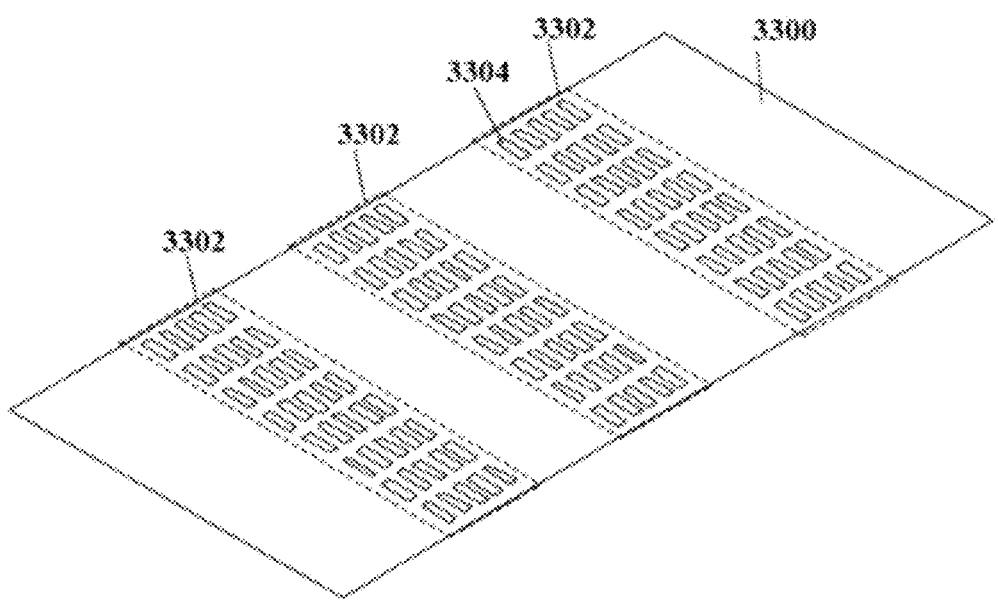
FIG. 33 shows a support structure for a roll up display according to an embodiment.

FIG. 32 and FIG. 33 show a support structure for a roll up display according to an embodiment. The supporting structure shown comprises two layers of different shapes and sizes. Layer 1 shown as 3200, and layer 2 shown as 3202 comprising pockets distributed in an array. In an embodiment, the pockets are sealed, and the air is filled in the areas surrounding the pockets. In another embodiment, the pockets are interconnected with each other and the air can be filled in or taken out from all the pockets via a connected air line and valve system. It is possible to have more than one valve to fill or empty the pockets or the surrounding areas based on the fill time requirements. For example, pockets or layer 3202 may be arranged at the position where the supporting layer needs to be bent or folded, acting as an articulating layer. The number and arrangement positions of pneumatic layers 3202 may correspond to the number and positions of bending regions of the flexible display module. For example, as shown in FIG. 32, the flexible display module is a foldable display support structure with one bending part where the supporting layer may be provided with pneumatic layer 3202 at the position of the bending part/at the position of articulation. The position of bending may be designed as per the configuration that the display may take, for example, a laptop or a foldable phone. Alternatively, as shown in FIG. 33, the flexible display module has more than one bending position, and the supporting layer may be respectively provided with pneumatic layer 3302 at the bending positions. In an embodiment, the pneumatic layer may also be provided on the entire region (bending region and non-bending region) of the supporting layer 3300. At this time, the bending regions may be connected/integrated with non-bending regions on the entire region of the supporting layer. Pockets 3204 of FIGS. 32 and/or 3304 of FIG. 33 are distributed in the array and can ensure the overall support performance of the supporting layer and also enable the supporting layer to have the better flexibility to improve the bending and folding performance. The placement as shown in FIG. 33 for the pneumatic structure at strategic positions may enable roll up of the foldable display. The shapes of the pockets 3204 and/or 3304 in respective supporting layers may be the same or different e.g., may be a strip shape, a circular shape, a hexagonal shape etc. The extending direction of the strip shape is consistent with the axis direction of bending or folding of the flexible display module. That is, the pockets in each supporting layer are strip-shaped, of which the extending direction is consistent with the axis direction of bending or folding of the flexible display module. In an embodiment, the pocket shapes may be squares, rectangles, grid shaped forms of squares or rectangles, triangles, hexagonal, octagonal, or any polygonal structure etc.

According to an embodiment, it is an apparatus, comprising: a display comprising a display layer and a base structure, wherein the base structure is configured to support the display layer; the base structure comprising one or more layers, wherein the one or more layers comprise a first amorphous layer and a second pneumatic layer; and wherein the display is configured to be rolled and unrolled as a scroll; and wherein the apparatus is an electronic display device.

According to an embodiment of the apparatus, the first amorphous layer comprises one or more amorphous layers. According to an embodiment of the apparatus, the first amorphous layer comprises a woven mesh mat structure made of amorphous strips. According to an embodiment of the apparatus, the first amorphous layer comprises Air Mate material comprising one of flexible plastic and elastomer material.

According to an embodiment of the apparatus, the second pneumatic layer comprises one or more pneumatic layers. According to an embodiment of the apparatus, the one or more pneumatic layers are configured for a selective pressurization. Selective pressurization is achieved through techniques that enable targeted application of pressure within specific regions of the pneumatic layers. Key methods include using partitioned chambers/pockets, precision-controlled valves, and pressure control algorithms to isolate and regulate pressure zones.

According to an embodiment of the apparatus, wherein the apparatus further comprises an exoskeleton structure that is configured to support the display, wherein the exoskeleton structure comprises a retractable arm with a hinge joint. According to an embodiment of the apparatus, a size of the display is in a range of 9 inches to 10.2 inches.

According to an embodiment, it is a method comprising, rolling a display of an apparatus to an open configuration, wherein the display comprises a base structure comprising one or more layers, wherein the one or more layers comprise a first amorphous layer and a second pneumatic layer; pressurizing, the second pneumatic layer; supporting the display with the first amorphous layer and the second pneumatic layer during a touch function of the display; and wherein the display is configured to be rolled and unrolled as a scroll and wherein the apparatus is an electronic display device.

According to an embodiment of the method, the display is a foldable display. According to an embodiment of the method, the foldable display is a scroll type. According to an embodiment of the method, the display is further supported using an exoskeleton structure, wherein the exoskeleton structure comprises a retractable arm with a hinge join.

According to an embodiment of the method, the first amorphous layer comprises one or more amorphous layers. According to an embodiment of the method, the first amorphous layer comprises a woven mesh mat structure made of amorphous strips. According to an embodiment of the method, the first amorphous layer is laminated onto the display. According to an embodiment of the method, the first amorphous layer is attached to the display.

According to an embodiment of the method, the second pneumatic layer comprises one or more pneumatic layers. According to an embodiment of the method, wherein the one or more pneumatic layers are configured for a selective pressurization. Selective pressurization refers to a process of applying controlled and targeted pressure within specific zones of the pneumatic layers, rather than uniformly across the entire layer. This is possible by appropriate interconnections and valve systems connecting or disconnecting the zones selectively and strategically.

Figure 34:
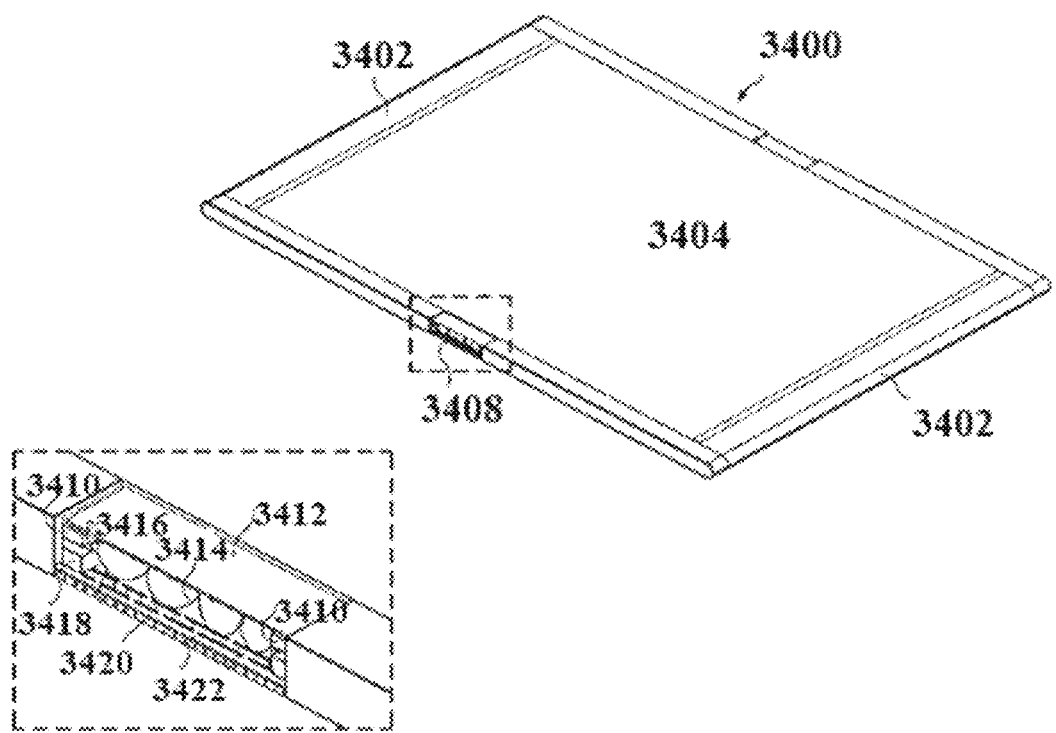
FIG. 34 shows a support structure for a hinge of a foldable display according to an embodiment.

FIG. 34. shows a support structure for a hinge of a foldable display in open configuration according to an embodiment. A foldable display 3400 is depicted respectively with a top perspective view, and a close-up perspective side view of the hinge assembly 3408 and 3412. Display edge covers 3402 couples with opposing ends of the display frame structure to manage sliding motion of the display frames 3410 relative to housing portions 3418 during rotation. Hinge joint couples hinge support structure comprising layer 3414, layer 3420, and layer 3422 at each end 3416 to each housing portion 3418. Hinge assembly 3408 in effect rotates housing portions 3418 in synchronous motion about the hinge support structure to provide a radius of hinge assembly 3408 as a whole that prevents overstress of display film 3404, which may be an OLED display film. In an embodiment, amorphous layer 3420 and pneumatic layers 3414 and 3422 provide support for display film 3404. In an embodiment, an amorphous layer may be absent. In an embodiment, the sequence of the layers may be different. In an embodiment, there may be more than one or only one amorphous layer and/or more than one or only one pneumatic layer for support structure. In an embodiment, there may be more than two pneumatic layers for support structure. In an embodiment, there may be only pneumatic layers for support structure. In an embodiment, there may be only amorphous layers for support structure. The display film 3404, housing portions 3418, along with hinge assembly 3408 rotate to form one of a closed configuration, an open configuration or an intermediate configuration. Similar hinge support structures further can be extended all through the display between the display edge covers 3402 to form a roll up or scroll type display. The display edge covers 3402 may be used for pneumatic system, and other electronics to control the pneumatic pressure and/or for selective pressurization in the pneumatic layers. In an embodiment, the two display edge covers may be locked up after scrolling up using a magnetic lock.

According to an embodiment, it is an apparatus, comprising: a display comprising a hinge joint comprising a base structure, wherein the display is configured to be folded and unfolded at the hinge joint; and the base structure comprising one or more layers, wherein the one or more layers comprise a first amorphous layer and a second pneumatic layer; and wherein the apparatus is an electronic display device.

According to an embodiment of the apparatus, the first amorphous layer comprises one or more amorphous layers. According to an embodiment of the apparatus, the first amorphous layer comprises a woven mesh mat structure made of amorphous strips. According to an embodiment of the apparatus, the first amorphous layer comprises Air Mate material comprising one of flexible plastic and elastomer material.

According to an embodiment of the apparatus, the second pneumatic layer comprises one or more pneumatic layers. According to an embodiment of the apparatus, the one or more pneumatic layers are configured for a selective pressurization.

Figure 35E:
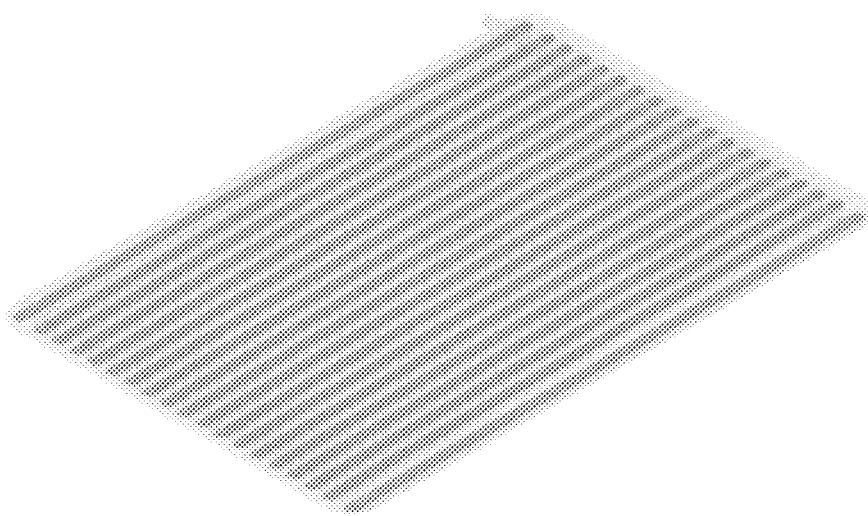
Figure 35F:
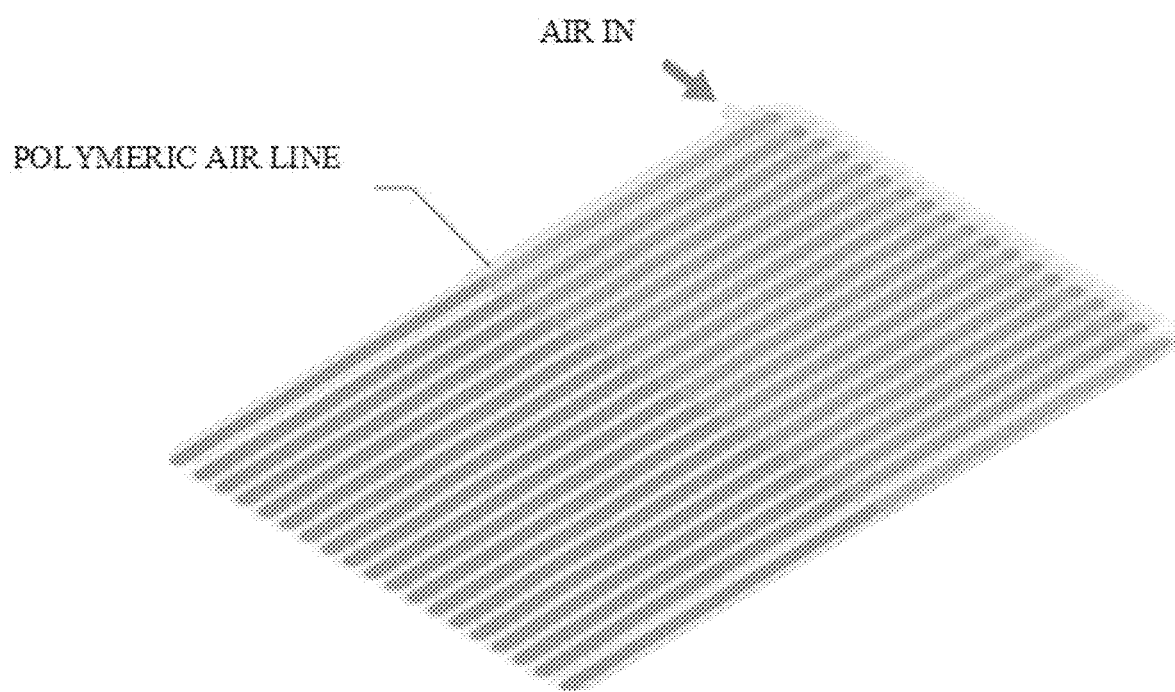

FIG. 35A-FIG. 35F shows a foldable screen according to a fifth embodiment showing horizontal polymeric air lines. FIG. 35A shows a top view of the foldable screen; FIG. 35B shows top view of air column arrangement in the foldable screen showing air inlet (which is also the air outlet); FIG. 35C shows front view of the foldable screen; FIG. 35D shows the side sectional view highlighting the layers of amorphous material and the air columns where the top layer comprises polymeric materials, the bottom layer comprises amorphous material layer, and air columns between the top layer and the bottom layer; FIG. 35E shows the perspective view of the foldable screen; and FIG. 35F shows the hatch section perspective view of the foldable screen.

Figure 36A:
FIG. 36A-FIG. 36F shows a foldable screen according to a sixth embodiment.
Figure 36B:
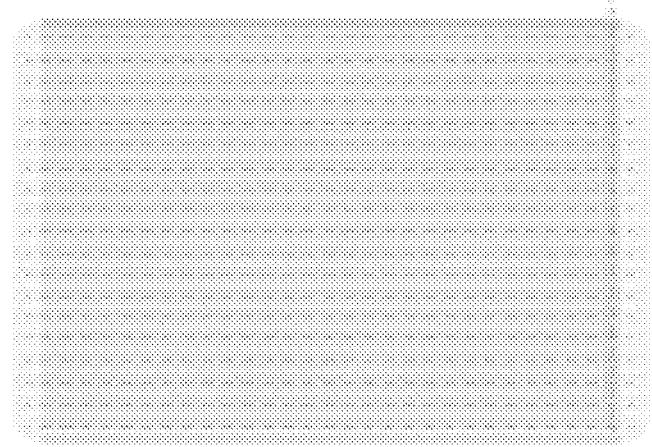
Figure 36C:
Figure 36D:
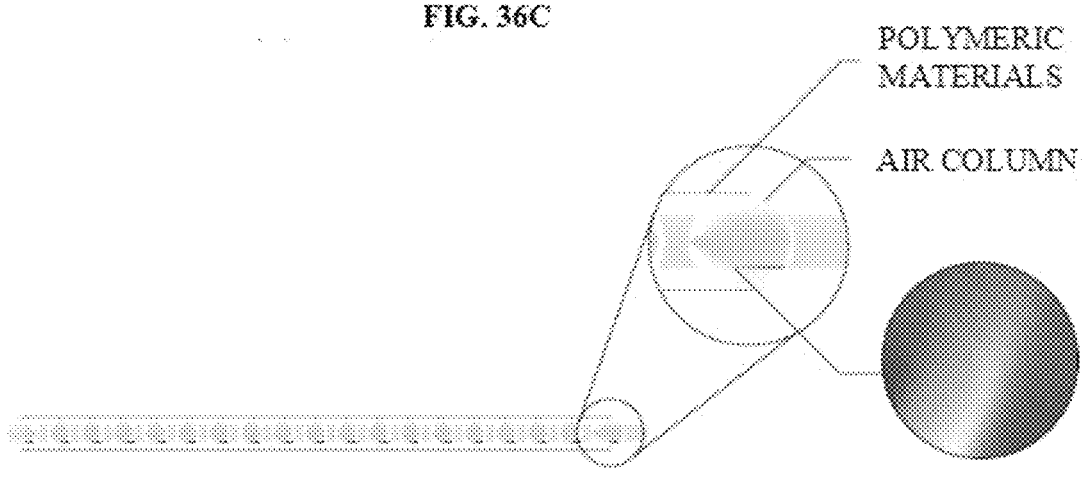
Figure 36E:
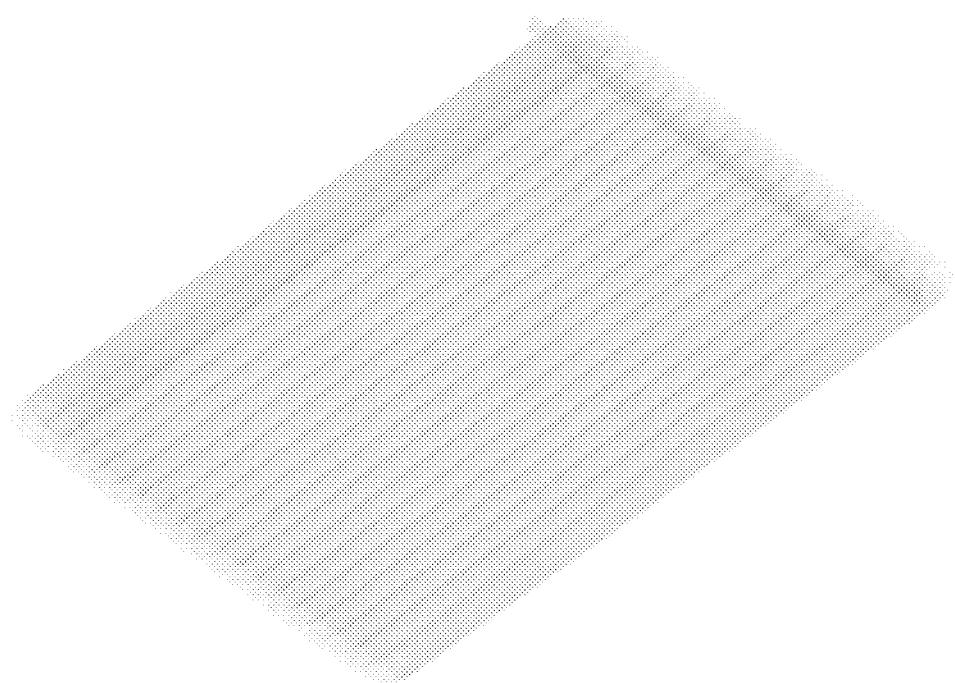
Figure 36F:
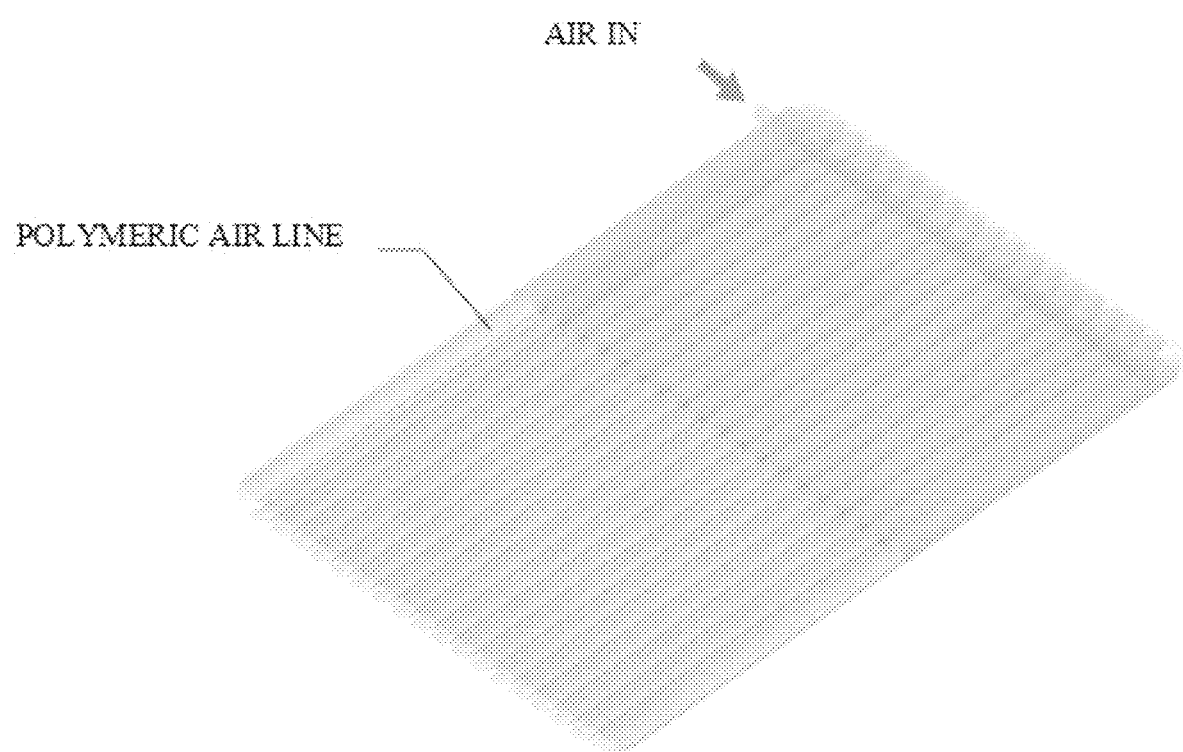

FIG. 36A-FIG. 36F shows a foldable screen according to a sixth embodiment showing horizontal polymeric air lines. FIG. 36A shows a top view of the foldable screen; FIG. 36B shows top view of air column arrangement in the foldable screen showing air inlet (which is also the air outlet); FIG. 36C shows front view of the foldable screen; FIG. 36D shows the side sectional view highlighting the layers of amorphous material and the air columns where the top layer comprises polymeric materials, the bottom layer comprises amorphous material layer, and air columns between the top layer and the bottom layer; FIG. 36E shows the perspective view of the foldable screen; and FIG. 36F shows the hatch section perspective view of the foldable screen.

Figure 37A:
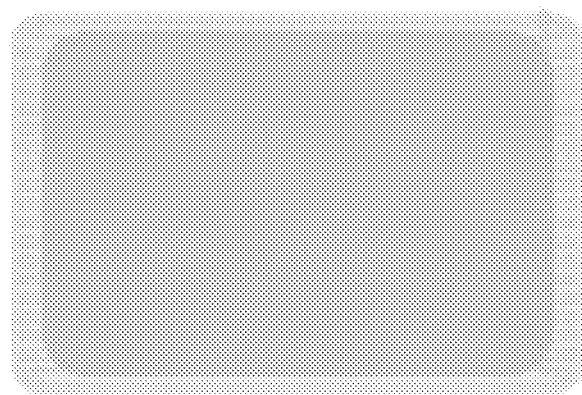
FIG. 37A-FIG. 37F shows a foldable screen according to a seventh embodiment.
Figure 37B:
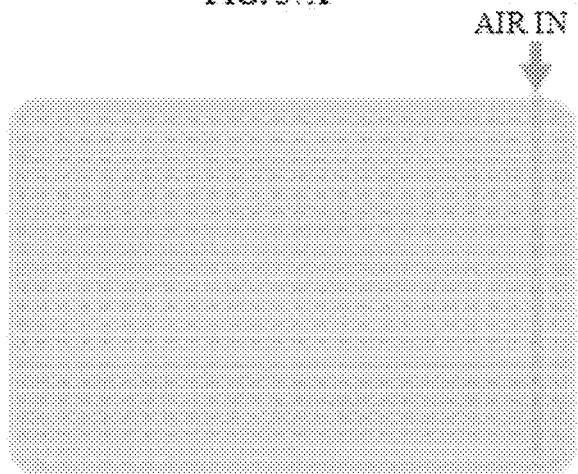
Figure 37C:
Figure 37D:
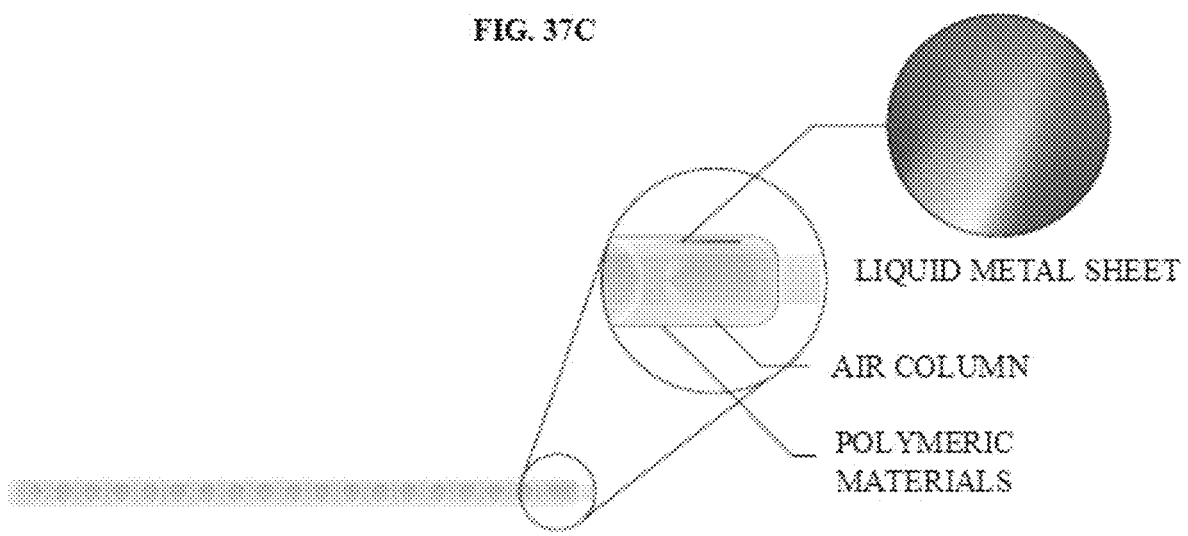
Figure 37E:
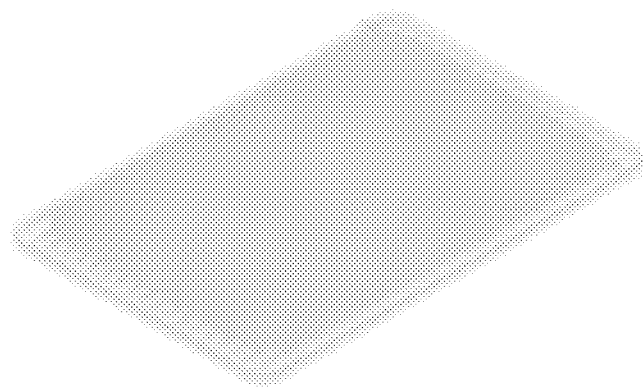
Figure 37F:
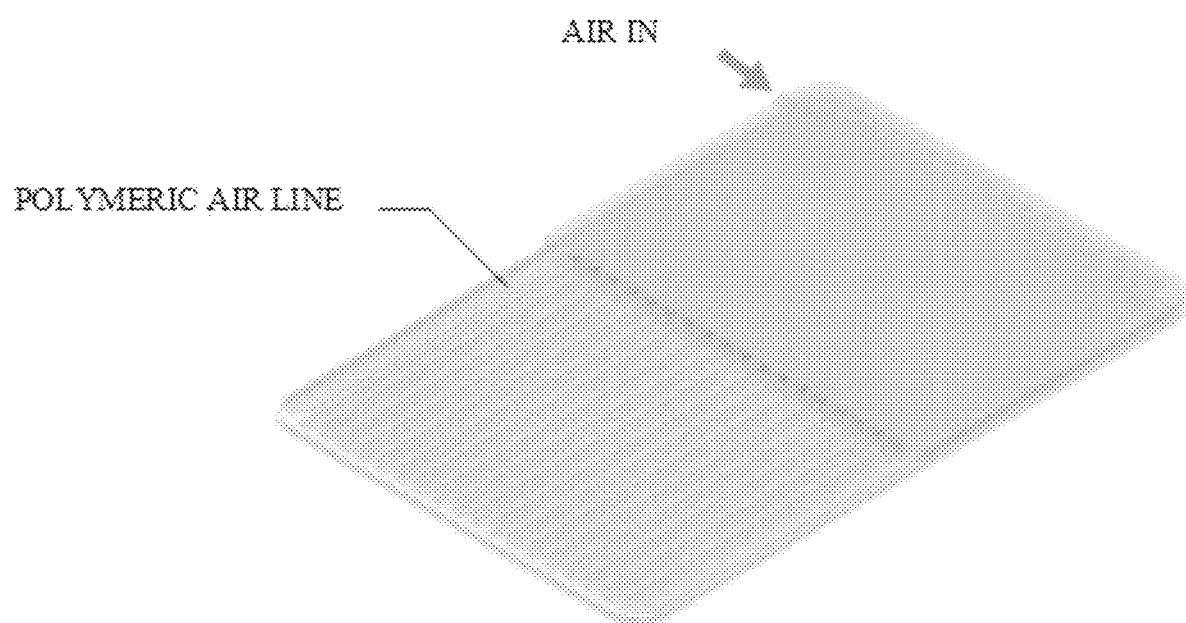

FIG. 37A-FIG. 37F shows a foldable screen according to a seventh embodiment showing horizontal polymeric air lines. FIG. 37A shows a top view of the foldable screen; FIG. 37B shows top view of air column arrangement in the foldable screen showing air inlet (which is also the air outlet); FIG. 37C shows front view of the foldable screen; FIG. 37D shows the side sectional view highlighting the layers of amorphous material and the air columns where the top layer comprises amorphous material layer, the bottom layer comprises polymeric materials, and air columns between the top layer and the bottom layer; FIG. 37E shows the perspective view of the foldable screen; and FIG. 37F shows the hatch section perspective view of the foldable screen.

Figure 38E:
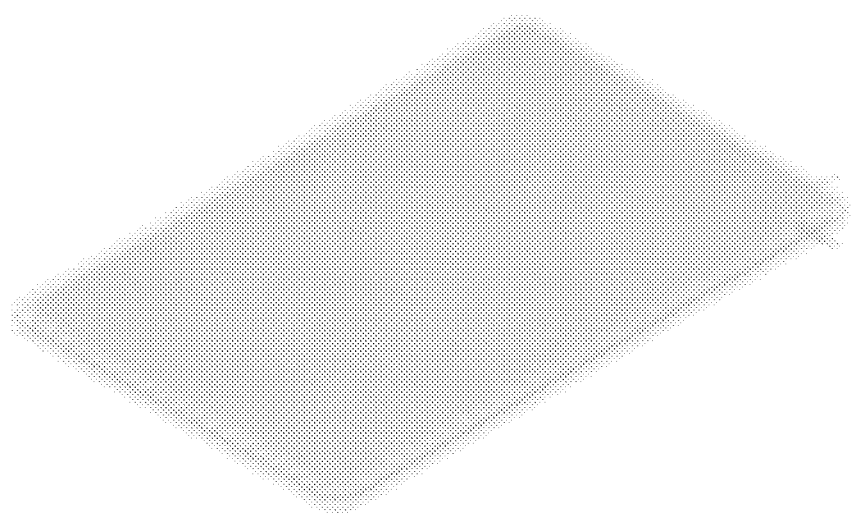
Figure 38F:
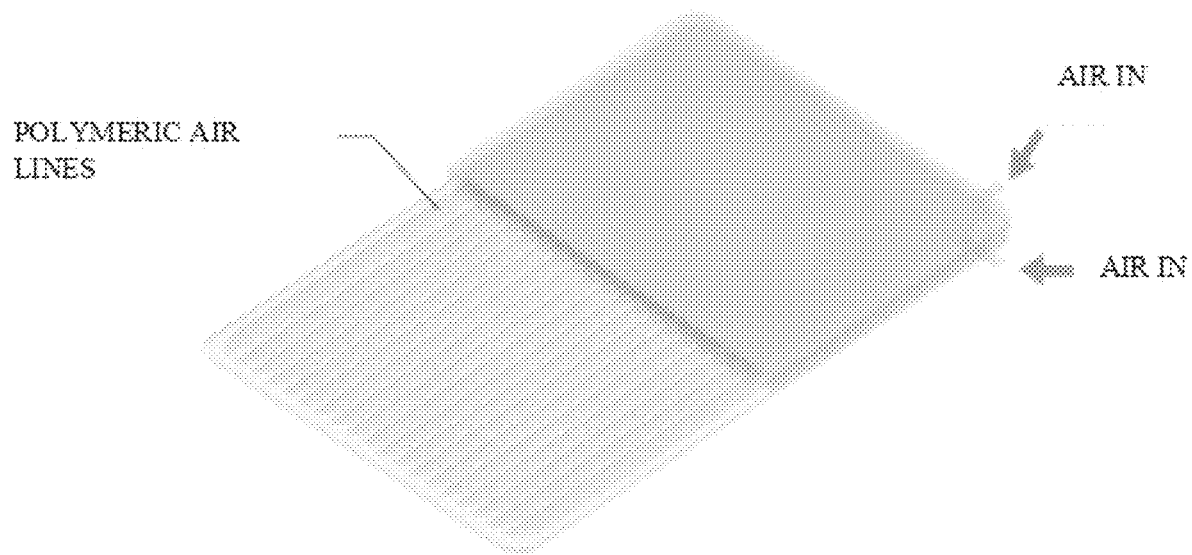

FIG. 38A-FIG. 38F shows a foldable screen according to an eighth embodiment showing horizontal and vertical (grid) polymeric air lines. FIG. 38A shows a top view of the foldable screen; FIG. 38B shows top view of air column arrangement in the foldable screen showing two air inlets (one or both of which may also be used as air outlets); FIG. 38C shows front view of the foldable screen; FIG. 38D shows the side sectional view highlighting the layers of amorphous material and the air columns where the top layer comprises amorphous material layer, the bottom layer comprises polymeric materials, and air columns between the top layer and the bottom layer. There may be more than one air column as shown in this figure. The first air column is along the foldable axis of the display screen and the second air column is perpendicular to the foldable axis. The pneumatic layers may be similar to the layers shown in FIG. 11. FIG. 38E shows the perspective view of the foldable screen; and FIG. 38F shows the hatch section perspective view of the foldable screen. This embodiment shows two air inlets, however there may be more than two inlets connecting the polymeric air lines such that the time to inflate the foldable screen is minimized compared to single air inlet.

Figure 39A:
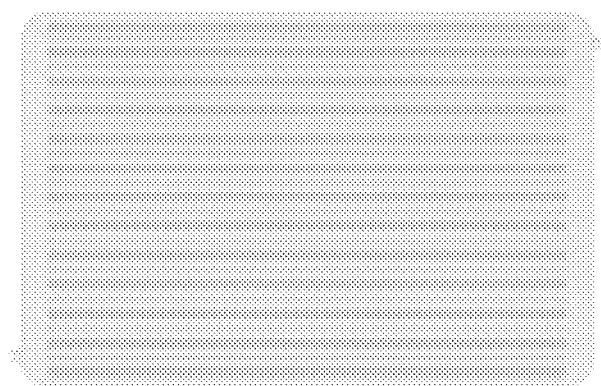
FIG. 39A-FIG. 39F shows a foldable screen according to a ninth embodiment.
Figure 39B:
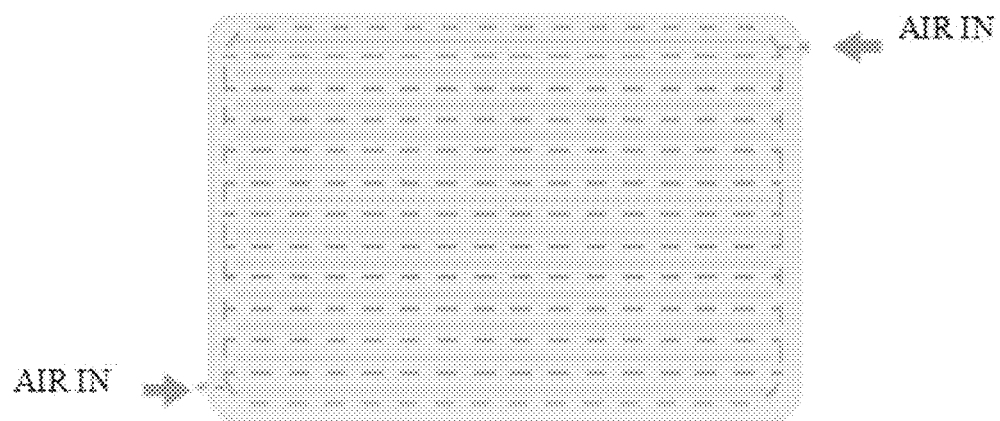
Figure 39C:
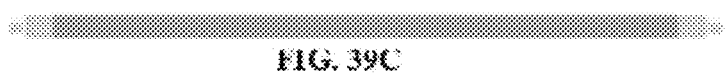
Figure 39D:
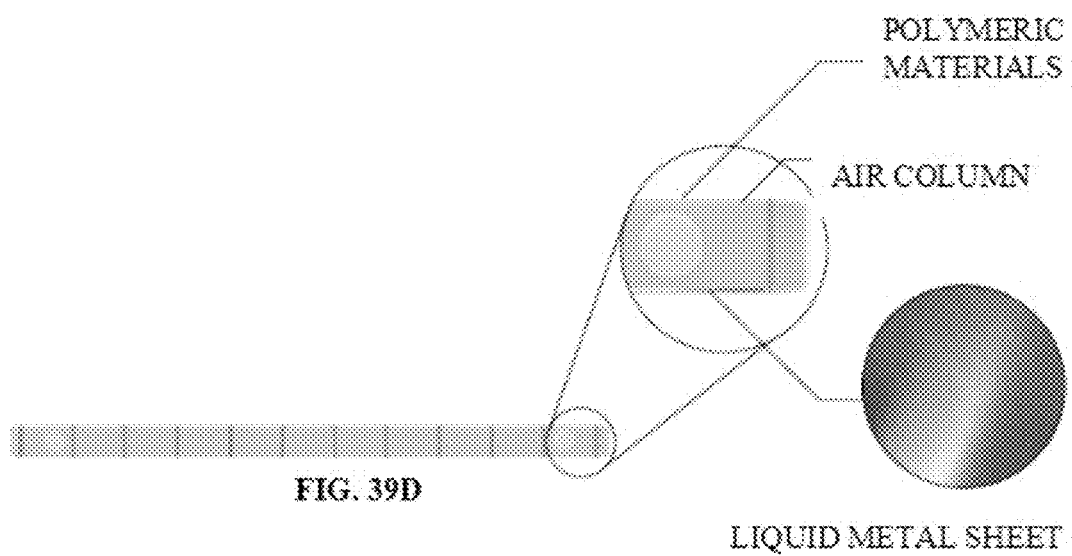
Figure 39E:
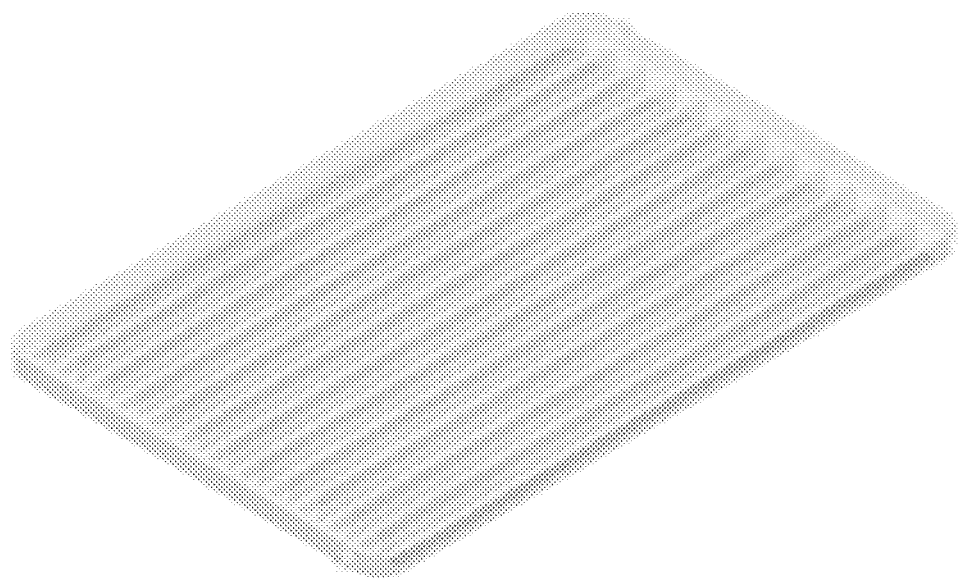
Figure 39F:
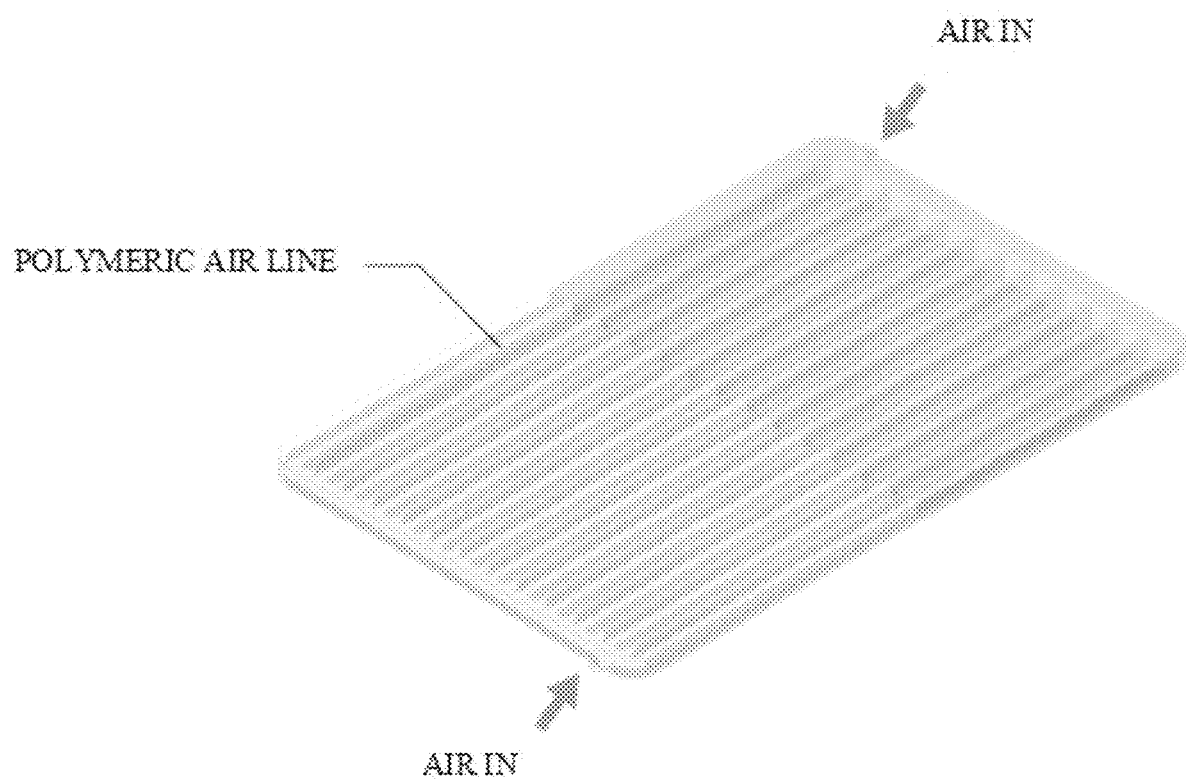

FIG. 39A-FIG. 39F shows a foldable screen according to a ninth embodiment showing horizontal polymeric air lines. FIG. 39A shows a top view of the foldable screen; FIG. 39B shows top view of air column arrangement in the foldable screen showing two air inlets (one or both of which may also be used as air outlets); FIG. 39C shows front view of the foldable screen; FIG. 39D shows the side sectional view highlighting the layers of amorphous material and the air columns where the top layer comprises polymeric materials, the bottom layer comprises amorphous material layer, and air columns between the top layer and the bottom layer; FIG. 39E shows the perspective view of the foldable screen; and FIG. 39F shows the hatch section perspective view of the foldable screen. This embodiment shows two air inlets, two horizontal polymeric air lines, however there may be more than two inlets connecting the polymeric air lines such that the time to inflate the foldable screen is minimized compared to single air inlet.

Figure 40E:
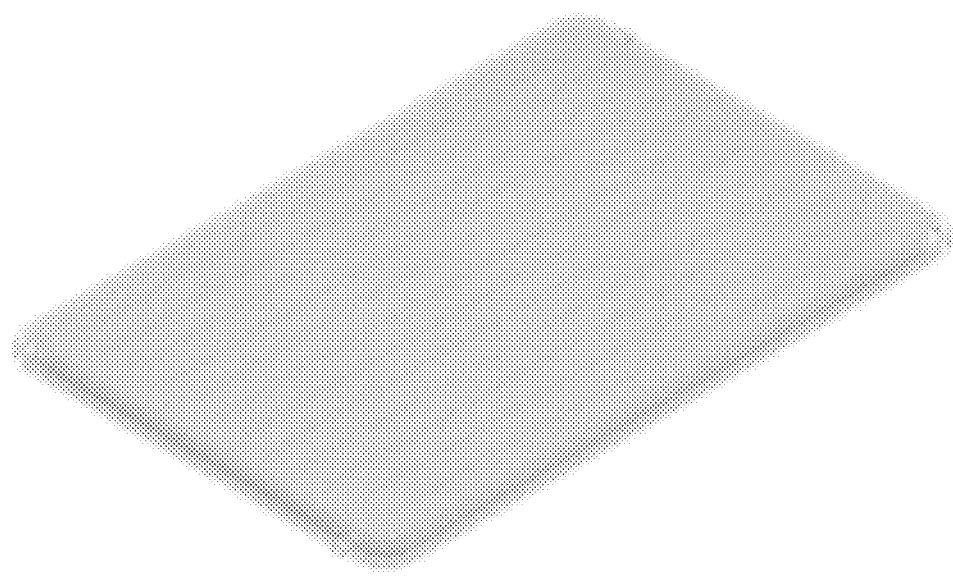
Figure 40F:
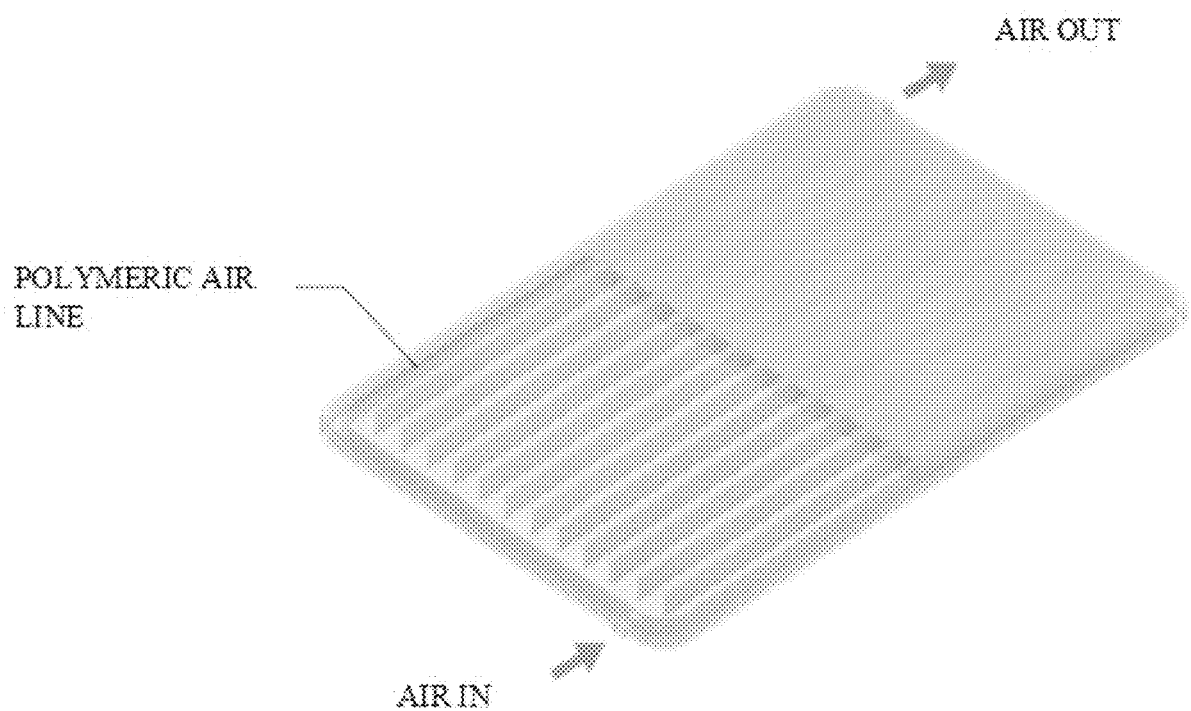

FIG. 40A-FIG. 40F shows a foldable screen according to a tenth embodiment showing horizontal polymeric air lines. FIG. 40A shows a top view of the foldable screen; FIG. 40B shows top view of air column arrangement in the foldable screen; FIG. 40C shows front view of the foldable screen; FIG. 40D shows the side sectional view highlighting the layers of amorphous material and the air columns where the top layer comprises amorphous material layer, the bottom layer comprises polymeric materials, and air columns between the top layer and the bottom layer; FIG. 40E shows the perspective view of the foldable screen; and FIG. 40F shows the hatch section perspective view of the foldable screen. This embodiment shows two air inlets placed connecting two horizontal polymeric air lines, however there may be more than two inlets connecting the polymeric air lines such that the time to inflate the foldable screen is minimized compared to single air inlet.

Figure 41A:
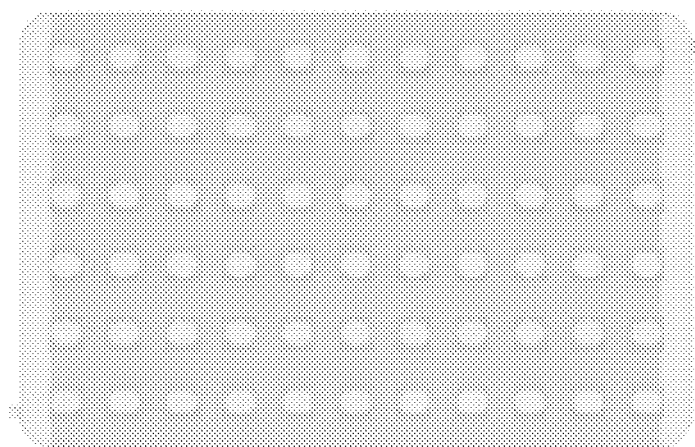
FIG. 41A-FIG. 41F shows a foldable screen according to an eleventh embodiment.
Figure 41B:
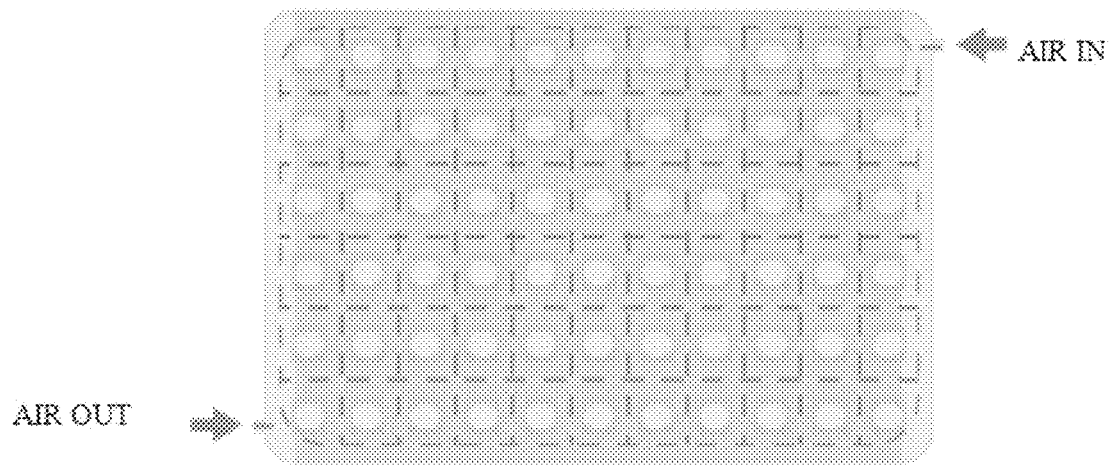
Figure 41C:
Figure 41D:
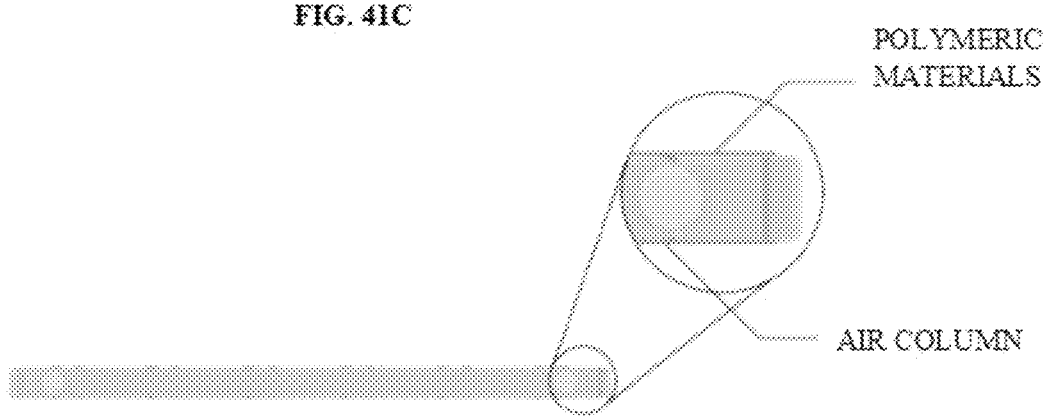
Figure 41E:
Figure 41F:
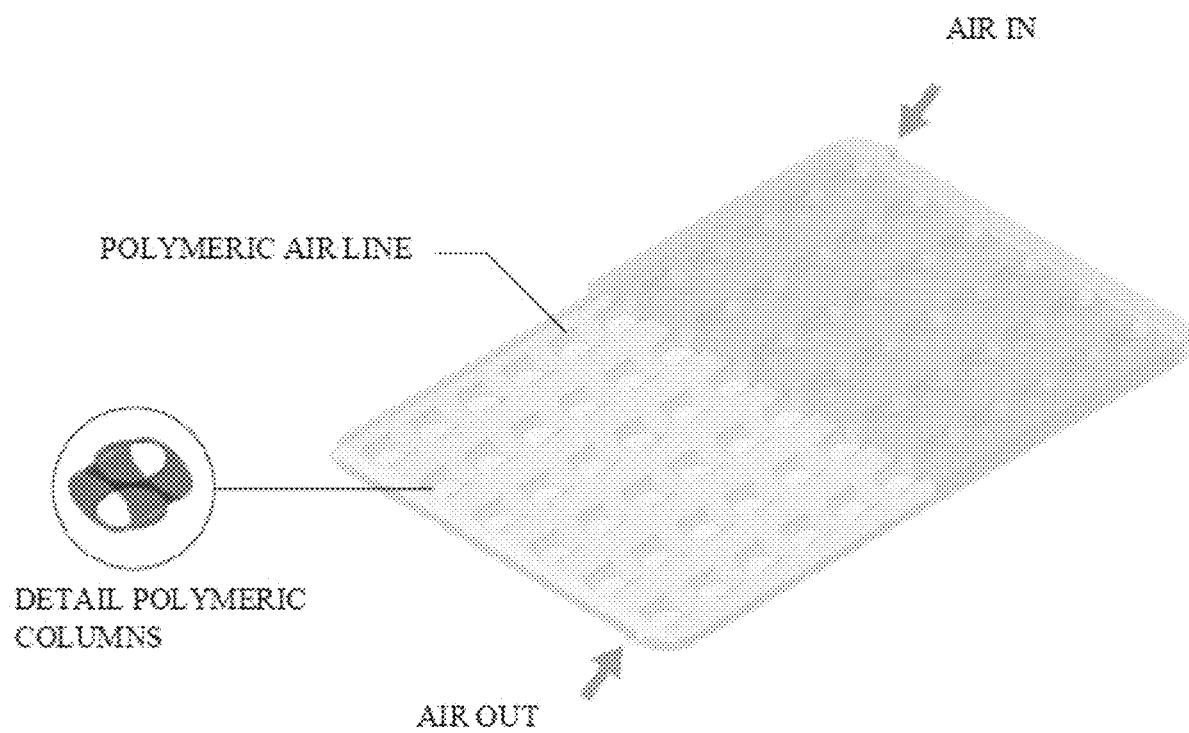

FIG. 41A-FIG. 41F shows a foldable screen according to an eleventh embodiment showing horizontal and vertical (grid) polymeric air lines. FIG. 41A shows a top view of the foldable screen; FIG. 41B shows top view of air column arrangement in the foldable screen; FIG. 41C shows front view of the foldable screen; FIG. 41D shows the side sectional view where top layer comprises polymeric materials and bottom layer may comprise finishing material and air columns between the top layer and the bottom layer; FIG. 41E shows the perspective view of the foldable screen; and FIG. 41F shows the hatch section perspective view of the foldable screen. This embodiment shows pocket structures incorporated within the foldable screen area which are sealed and closed between the top and bottom layers, and polymeric airlines are made such that the fluid fills the areas surrounding the pockets. Such prefilled pockets or pocket structures minimize the time to inflate the foldable screen compared to non-pocket structures. Pocket filled structures reduce the air volume facilitating or achieving quick fill times.

Figure 42E:
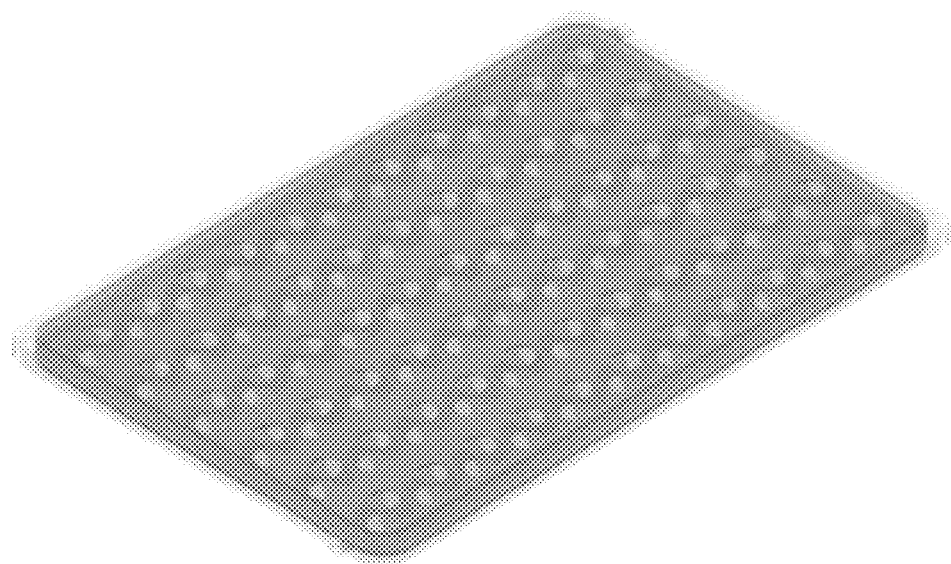
Figure 42F:
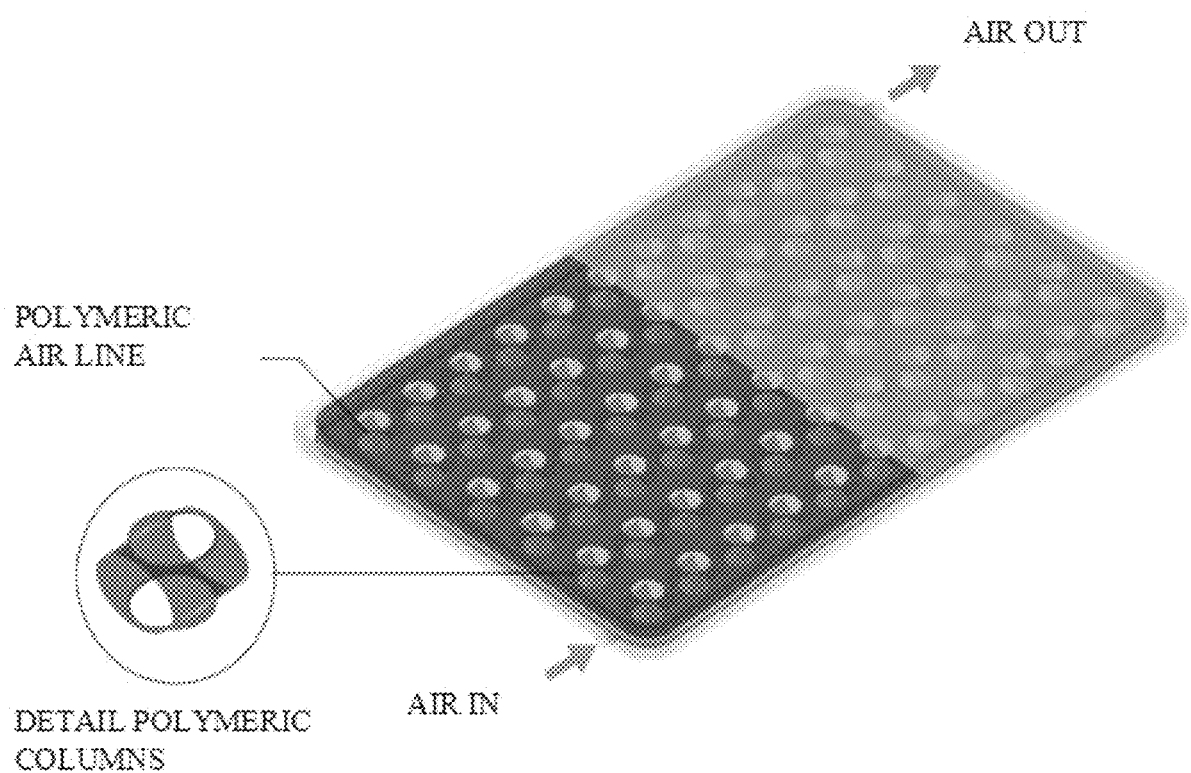

FIG. 42A-FIG. 42F shows a foldable screen according to a twelfth embodiment showing horizontal and vertical (grid) polymeric air lines. FIG. 42A shows a top view of the foldable screen; FIG. 41B shows top view of air column arrangement in the foldable screen; FIG. 42C shows front view of the foldable screen; FIG. 42D shows the side sectional where the top layer comprises polymeric materials and amorphous material layer, bottom layer comprising finishing material and air columns between the top layer to the bottom layer; FIG. 42E shows the perspective view of the foldable screen; and FIG. 42F shows the hatch section perspective view of the foldable screen. This embodiment shows pocket structures incorporated within the foldable screen area which are sealed and closed between the top and bottom layers, and polymeric airlines are made such that the fluid fills the areas surrounding the pockets. Such prefilled pockets or pocket structures minimize the time to inflate the foldable screen compared to non-pocket structures.

Figure 43A:
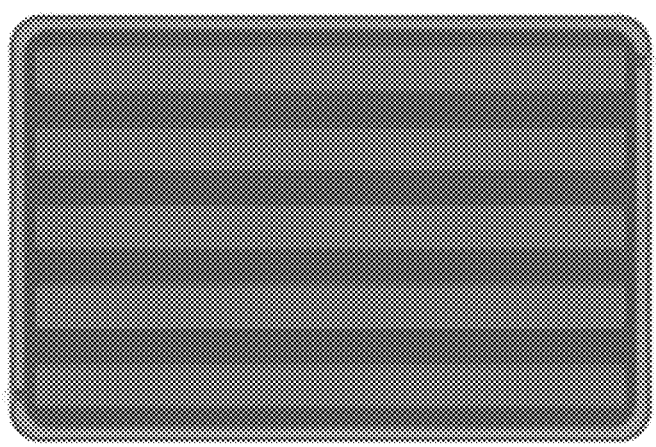
FIG. 43A-FIG. 43F shows a foldable screen according to a thirteenth embodiment.
Figure 43B:
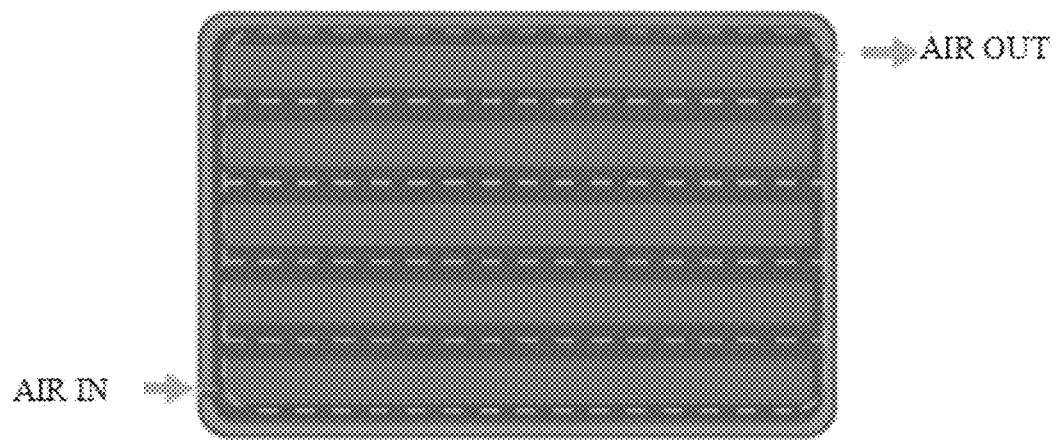
Figure 43C:
Figure 43D:
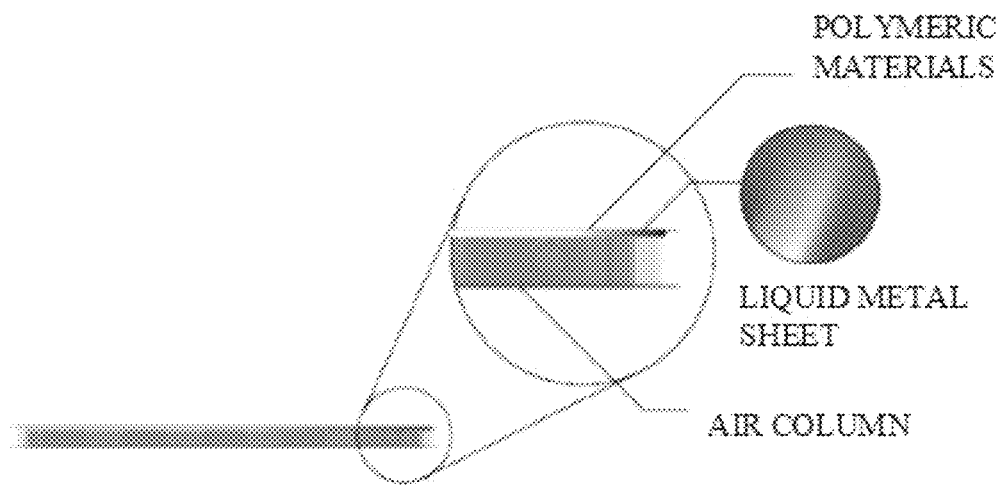
Figure 43E:
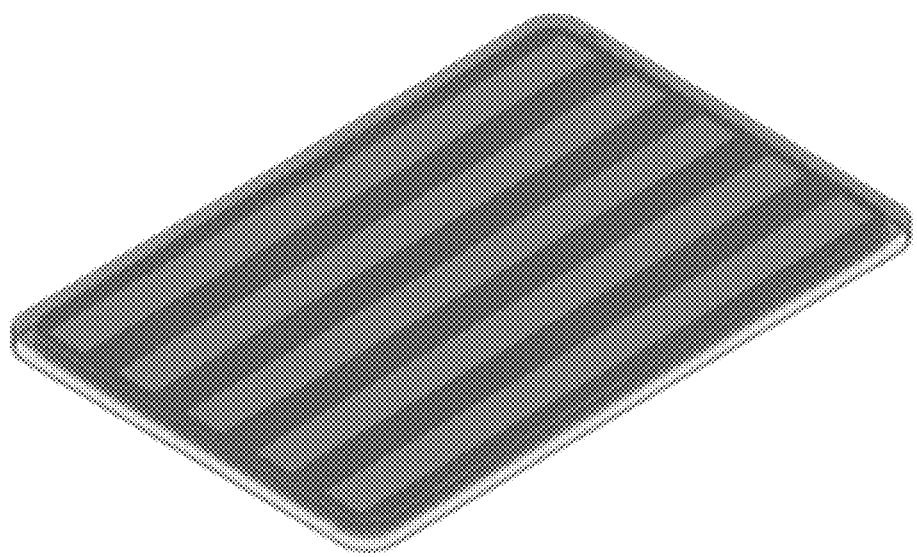
Figure 43F:
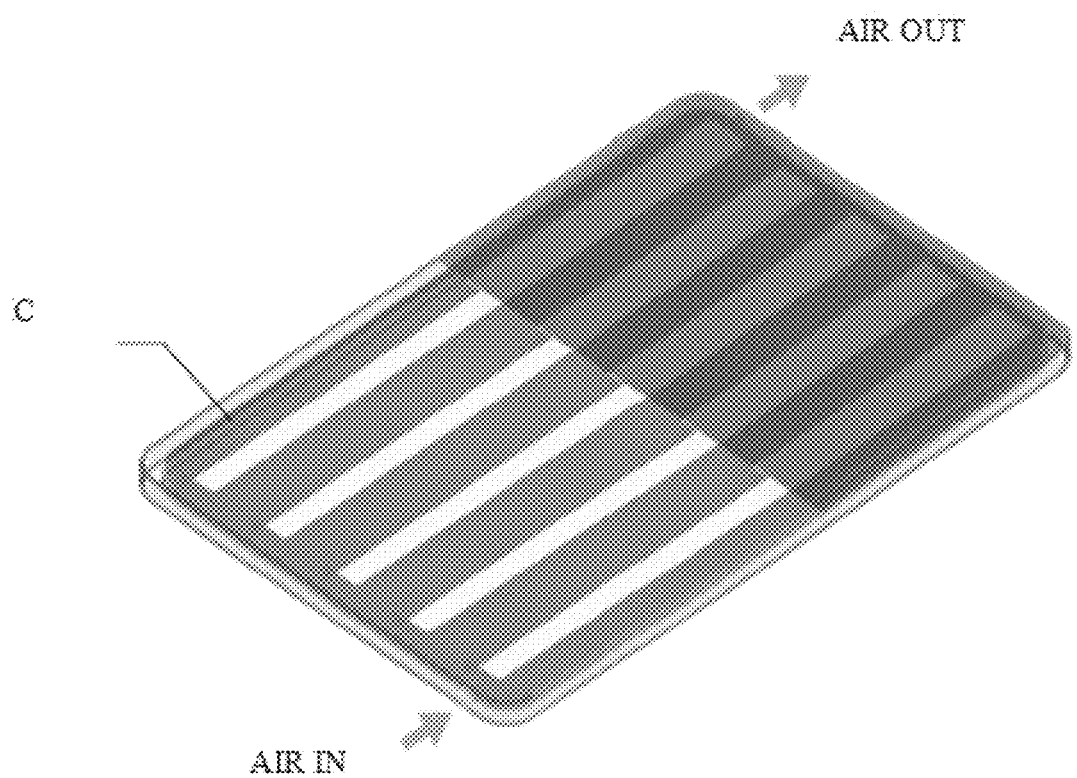

FIG. 43A-FIG. 43F shows a foldable screen according to a thirteenth embodiment showing horizontal polymeric air lines. FIG. 43A shows a top view of the foldable screen; FIG. 43B shows top view of air column arrangement in the foldable screen; FIG. 43C shows front view of the foldable screen; FIG. 43D shows the side sectional where the top layer comprises polymeric materials and amorphous material layer, bottom layer comprises finishing material, and air columns between the top layer to the bottom layer. In embodiments, bottom layer may comprise similar composition as that of the top layer; FIG. 43E shows the perspective view of the foldable screen; and FIG. 43F shows the hatch section perspective view of the foldable screen.

Figure 44A:
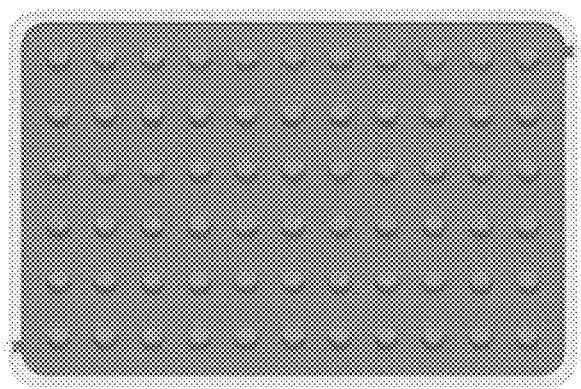
FIG. 44A-FIG. 44F shows a foldable screen according to a fourteenth embodiment.
Figure 44B:
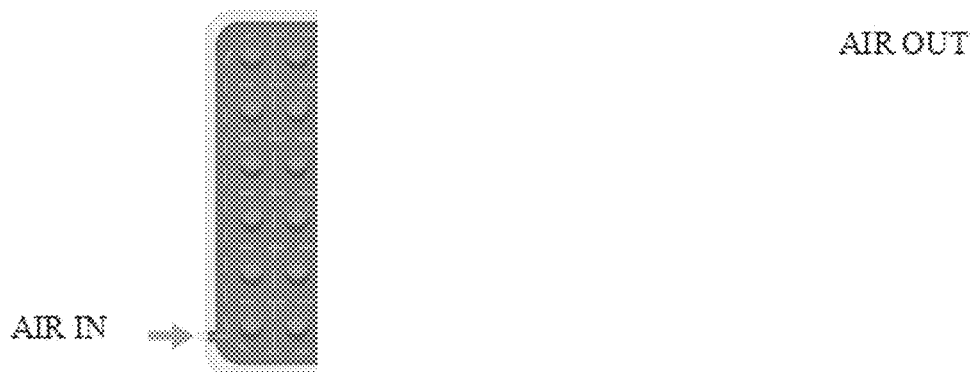
Figure 44C:
Figure 44D:
Figure 44E:
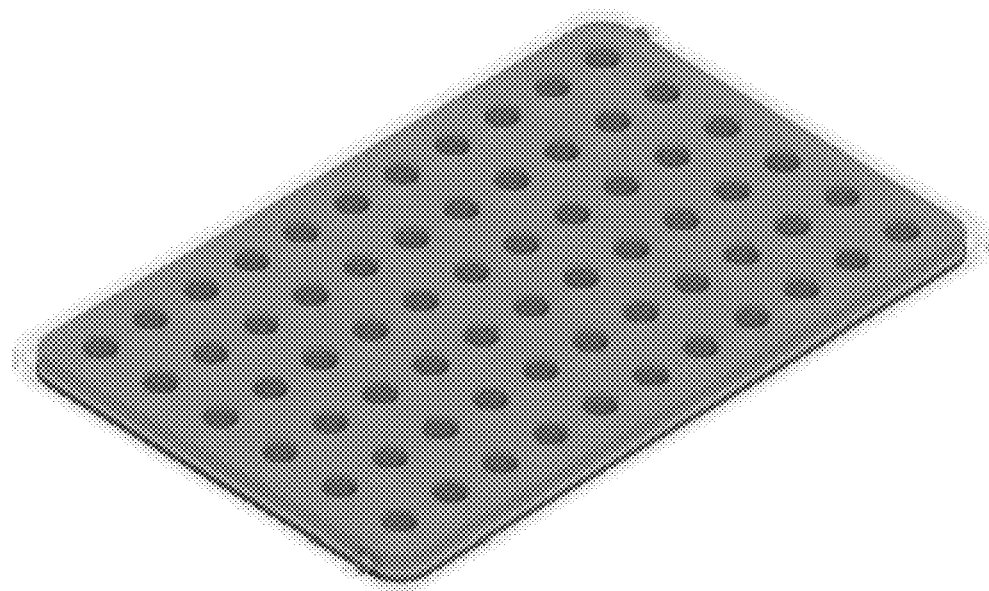
Figure 44F:
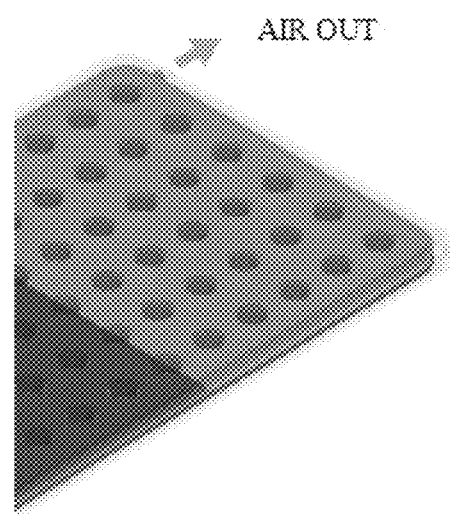

FIG. 44A-FIG. 44F shows a foldable screen according to a fourteenth embodiment showing horizontal and vertical (grid) polymeric air lines. FIG. 44A shows a top view of the foldable screen; FIG. 44B shows top view of air column arrangement in the foldable screen; FIG. 44C shows front view of the foldable screen; FIG. 44D shows the side section where the top layer comprises polymeric materials and amorphous material layer, bottom layer comprises finishing material, and air columns between the top layer to the bottom layer; bottom layer may comprise finishing material for aesthetics. In embodiments, bottom layer may comprise similar composition as that of the top layer; FIG. 44E shows the perspective view of the foldable screen; and FIG. 44F shows the hatch section perspective view of the foldable screen. This embodiment shows pocket structures incorporated within the foldable screen area which are sealed and closed between the top and bottom layers, and polymeric air lines fill the air in the areas surrounding the pockets. Such prefilled pockets or solid pocket structures minimize the time to inflate the foldable screen compared to non-pocket structures.

Different embodiments of pneumatic structures discussed are to reduce the volume of air within the pneumatic structure and thus reducing fill time. For example, pocket fill structures reduce the air volume, thereby facilitating quick fill times. A pneumatic structure for quicker filling may be chosen based on the requirements for the foldable screen, for example, size, number of folds, touch display or no touch display etc.

For embodiments where pocket structure is incorporated, the size, the shape, and the number of pockets may be chosen based on the structural requirements for supporting the foldable screen and time to inflate the screen. Shapes can be circular, rectangular, square, any other polygon structure either extending all the way from top layer to bottom layer or acting as a mid-layer between the top and bottom layers.

One or more of the top and bottom layers may comprise one or more of polymeric material and amorphous material. Top layer composition and constitution may be different from the bottom layer. For example, the top layer may comprise both amorphous material and polymeric material layers while the bottom layer may comprise either amorphous material, polymeric material, or any finishing material. A finishing material is any material applied to the surface, usually the surface which is visible to the user upon closing the foldable screen (the bottom layer), to enhance its appearance, durability, texture, or functional properties. These materials may be used in product design to provide protection, aesthetic appeal, and performance enhancements. There may be more than one layer of the same material, for example, two layers of amorphous material and one layer of polymeric materials.

In embodiments, there may be one or more fluid inlets and fluid outlets. In embodiments, the fluid inlet may also be the fluid outlet and may be connected to a bidirectional pump of the pneumatic system. In embodiments, the fluid that is filling the foldable layer may be any fluid including or excluding air. Further, the placement of inlets and outlets is configured to minimize fluid fill time by optimizing flow paths and reducing resistance within the structure. There may be more than one inlet and/or more than one outlet in the system. The structure may be partitioned at locations selected, either completely or partially to achieve multiple pressure zones in different areas, wherein each partition is positioned based on fluid dynamics and operational requirements. For example, in an application involving a layered fluid distribution system, a partition may be positioned between a high-pressure zone for rapid fluid ingress and a low-pressure zone designed for controlled release, thereby enabling differential pressure control across distinct sections of the structure.

The geometric configurations of the polymeric air lines, areas connecting polymeric air lines, and pockets illustrated herein are exemplary and may be varied in size and shape based on structural strength requirements of the support layer and the fluid fill times for the designated area. Such variations may include, but are not limited to, alterations in cross-sectional profile, aspect ratio, and overall geometry to optimize support layer function, material distribution, and fluid dynamics within the structure, while maintaining functional integrity and performance characteristics.

In embodiments, a plurality of pneumatic layers is arranged within the structure, wherein each pneumatic layer is selectively pressurized to achieve varying mechanical properties, such as stiffness, damping, or load distribution, based on operational requirements. The pneumatic layers may be positioned between flexible support layers configured to provide structural reinforcement while accommodating deformation in response to pressurization changes due to touch screen requirements. In embodiments, flexible support layers may be placed between one or more pneumatic layers. An example configuration may be a first flexible support layer, a first pneumatic layer, a second flexible support layer, a second pneumatic layer and a third flexible support layer. Another example could be a first flexible support layer, a first pneumatic layer, a second pneumatic layer, and a second flexible support layer. The placement of the flexible support layers is determined based on factors including load-bearing capacity (touch screen pressure without significant deformation), uniformity of pressure distribution, and dynamic adaptability of the structure. For example, in an application requiring variable rigidity, an intermediate pneumatic layer may be selectively pressurized to modulate overall stiffness, while adjacent flexible support layers maintain structural stability and distribute localized forces efficiently.

The descriptions of the one or more embodiments are for purposes of illustration but are not exhaustive or limiting to the embodiments described herein. Many modifications and variations will be apparent to those of ordinary skill in the art without departing from the scope and spirit of the embodiments described. The terminology used herein best explains the principles of the embodiments, the practical application and/or technical improvement over technologies found in the marketplace, and/or enable others of ordinary skill in the art to understand the embodiments described herein.

INCORPORATION BY REFERENCE

All references, including granted patents and patent application publications, referred herein are incorporated herein by reference in their entirety.

U.S. Patent Application Publication US20180228036A1, titled, "Flexible display device."

U.S. Patent Application Publication US20200212325A1, titled, "Foldable display device having a supporter."

U.S. Patent Application Publication US20220199923A1, titled, "Foldable display."

U.S. Patent Application Publication US20240077913A1, titled, "Display device including a support module having joints."

U.S. Patent Application Publication US20230176621A1, titled, "Display assembly and display device."

U.S. Patent Publication U.S. Ser. No. 10/082,839B1, titled, "Flexible information handling system display hinge and ramp support structure."

P.C.T Application Publication WO2020210987A, titled, "Hinge structure and mobile terminal."

U.S. Patent Publication U.S. Ser. No. 10/035,184B2, titled, "Material for eyewear and eyewear structure."

U.S. Patent Publication U.S. Ser. No. 10/280,493B2, titled, "Foldable display structures."

U.S. Patent Publication U.S. Ser. No. 10/301,708B2, titled, "Foldable display structures."

U.S. Patent Publication U.S. Ser. No. 10/697,049B2, titled, "Foldable display structures."

U.S. Patent Publication Number U.S. Pat. No. 9,710,020B2, titled "Rollable display apparatus."

U.S. Patent Publication Number U.S. Ser. No. 10/459,489B2 titled "Display panel and display apparatus including the same."

U.S. Patent Publication Number U.S. Ser. No. 10/133,381B2 titled "Display apparatus."

U.S. Patent Publication Number U.S. Ser. No. 11/183,651B2 titled "Electronic apparatus."

U.S. Patent Publication Number U.S. Pat. No. 9,029,846B2 titled "Display apparatus having improved bending properties and method of manufacturing same."

U.S. Patent Publication Number U.S. Ser. No. 11/407,058B2 titled "Cladded amorphous metal products."

The invention claimed is:

1. An apparatus, comprising:
a display comprising a display layer and a base structure, wherein the base structure is configured to support the display layer;
the base structure comprises a pneumatic structure, wherein the pneumatic structure comprises one or more pneumatic layers, wherein the pneumatic layers comprise a first layer of a first shape and a second layer of a second shape; wherein the first layer is of a first size and the second layer is of a second size; and wherein the first layer is at a first pressure and the second layer is at a second pressure;
wherein the base structure is inflatable and deflatable; and
wherein the display comprises an exoskeleton structure configured to support the display; and
wherein the apparatus is an electronic display device.

2. The apparatus of claim 1, wherein the display is a foldable display.

3. The apparatus of claim 1, wherein the base structure is inflatable for open configuration and deflatable for folded configuration.

4. The apparatus of claim 1, wherein the base structure further comprises an amorphous layer comprising amorphous material configured as a reinforcement layer.

5. The apparatus of claim 4, wherein the amorphous layer comprises a woven mesh mat structure from plurality of amorphous ribbons or amorphous strips.

6. The apparatus of claim 1, wherein the pneumatic structure comprises a plurality of inflatable tubes connected by a non-inflated flexible structure and wherein the plurality of the inflatable tubes is present in one or more of a first direction of a length of the display of the apparatus and a second direction perpendicular to the length of the display of the apparatus.

7. The apparatus of claim 6, wherein the plurality of the inflatable tubes is configured at a variable pressure depending on a position in relation to a main rigid base of the display.

8. The apparatus of claim 1, wherein at least one of the pneumatic layers is configured to have a thickness in a first range of about 0.5 millimeter (mm) to 2.0 mm and is maintained at a pressure when inflated in a second range of about 5 pounds per square inch (psi) to 10 psi.

9. The apparatus of claim 1, wherein at least one of the pneumatic layers is configured to have a thickness in a third range of about 1.0 millimeter (mm) to 20.0 mm and is maintained at a pressure when inflated in a fourth range of about 2 pounds per square inch (psi) to 5 psi.

10. The apparatus of claim 1, wherein the pneumatic layers are configured to have a pressure in a fifth range of about 2 pounds per square inch (psi) to 10 psi.

11. The apparatus of claim 1, wherein the apparatus further comprises an air pump configured to inflate the pneumatic layers and wherein the apparatus further comprises a battery to power the air pump.

12. The apparatus of claim 1, wherein the apparatus further comprises a pressure controller configured to control a pressure of the pneumatic structure.

13. The apparatus of claim 1, wherein the display is touch sensitive comprising a touch function; and wherein the pneumatic layer is configured to support forces produced by the touch function to counter a deformation.

14. The apparatus of claim 1, wherein the apparatus further comprises a body, wherein the exoskeleton structure is present in an inner space of the body, and wherein the exoskeleton structure comprises amorphous material.

15. The apparatus of claim 1, wherein the base structure of the display is configured for reducing a gap between a rotational arc of the display and the base structure.

16. The apparatus of claim 1, wherein the apparatus is configured for a selective pressurization of one or more of the pneumatic layers.

17. A method comprising, rolling a display of an apparatus to an open configuration, wherein the display comprises a display layer and a base structure, wherein the base structure comprises a pneumatic structure, wherein the pneumatic structure comprises one or more pneumatic layers and is configured to support the display layer; pressurizing, the one or more pneumatic layers, wherein the one or more pneumatic layers comprises a first pneumatic layer to a first pressure and a second pneumatic layer to a second pressure for pressurized layers; supporting the display with the pressurized layers during a touch function of the display; further supporting the display using an exoskeleton structure, wherein the exoskeleton structure comprises a retractable arm with a hinge joint; and wherein the first pneumatic layer is configured to have a first size and a first shape; and the second pneumatic layer is configured to have a second size and a second shape; and wherein the display is configured to articulate a size based on the pressurization of the one or more of the pneumatic layers; and wherein the apparatus is an electronic display device.

18. The method of claim 17, wherein the pneumatic structure further comprises one or more inflatable balloon structures and tubes in the one or more pneumatic layers.

19. The method of claim 17, wherein the base structure further comprises an amorphous layer comprising amorphous material configured as a reinforcement layer.

* * * * *